US012757589B2

(12) United States Patent
Ryu et al.

(10) Patent No.: US 12,757,589 B2
(45) Date of Patent: Oct. 6, 2026

(54) LIGHT EMITTING DISPLAY DEVICE

(71) Applicant: Samsung Display Co., LTD., Yongin-si (KR)

(72) Inventors: Min Yeul Ryu, Suwon-si (KR); Jun Hee Lee, Hwaseong-si (KR); Hyeon Bum Lee, Hwaseong-si (KR); Seong Min Wang, Seongnam-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 513 days.

(21) Appl. No.: 17/696,395

(22) Filed: Mar. 16, 2022

(65) Prior Publication Data

US 2022/0415993 A1 Dec. 29, 2022

(30) Foreign Application Priority Data

Jun. 25, 2021 (KR) ........................ 10-2021-0083325

(51) Int. Cl.
*H10K 59/131* (2023.01)
*H10K 59/80* (2023.01)
(Continued)

(52) U.S. Cl.
CPC ....... *H10K 59/131* (2023.02); *H10K 59/8792* (2023.02); *H10K 50/13* (2023.02); *H10K 59/122* (2023.02); *H10K 59/38* (2023.02)

(58) Field of Classification Search
CPC .... H10K 59/131; H10K 59/122; H10K 59/38; H10K 59/8792; H10K 59/126;
(Continued)

(56) References Cited

U.S. PATENT DOCUMENTS 8,581,889 B2 11/2013 Taneda et al.
10,304,918 B2 5/2019 Lee et al.
(Continued)

FOREIGN PATENT DOCUMENTS

JP 5590285 9/2014
KR 10-2018-0036847 4/2018
(Continued)

*Primary Examiner* — Davienne N Monbleau
*Assistant Examiner* — John Patrick Cornely
(74) *Attorney, Agent, or Firm* — Harness, Dickey & Pierce, P.L.C.

(57) ABSTRACT

A light emitting display device includes first and second pixel circuit portions, each having a transistor with a polycrystalline semiconductor and a transistor with an oxide semiconductor, and first and second light emitting diodes including first and second anodes connected with the first and second pixel circuit portions, respectively. An encapsulation layer covers the first and second pixel circuit portions and the first and second light emitting diodes. A light blocking layer includes first and second light blocking layer openings that are disposed on the encapsulation layer and overlap the first and second anodes, respectively. First and second color filters are disposed in the first and second light blocking layer openings, wherein first and second expansion portions corresponding to the first and second anodes are disposed in a first and second conductive layers disposed first down from the first anode and second down from the second anode, respectively.

20 Claims, 53 Drawing Sheets

(51) Int. Cl.
*H10K 50/13* (2023.01)
*H10K 59/122* (2023.01)
*H10K 59/38* (2023.01)

(58) Field of Classification Search
CPC ............... H10K 59/123; H10K 59/124; H10K 59/1213; H10K 50/865; H10K 50/13; H10K 50/844; H10K 2102/311; H01L 29/78633; H01L 27/1225; H01L 27/124
See application file for complete search history.

(56) References Cited

U.S. PATENT DOCUMENTS

| | | | | |
|---|---|---|---|---|
| 10,459,557 | B2 | 10/2019 | Hong et al. | |
| 2015/0054719 | A1* | 2/2015 | Lee | G09G 3/3208 345/76 |
| 2016/0079333 | A1* | 3/2016 | Shishido | G09G 3/3611 257/72 |
| 2017/0294502 | A1* | 10/2017 | Ka | H10K 59/123 |
| 2018/0095570 | A1* | 4/2018 | Hong | H10K 59/873 |
| 2018/0151824 | A1 | 5/2018 | Park et al. | |
| 2018/0197921 | A1 | 7/2018 | Kim et al. | |
| 2018/0247988 | A1* | 8/2018 | Lee | H10K 59/123 |
| 2019/0189722 | A1* | 6/2019 | Lim | H10K 59/123 |
| 2021/0202666 | A1* | 7/2021 | Jung | H10K 59/131 |
| 2021/0408061 | A1* | 12/2021 | Shin | G09G 3/3233 |

FOREIGN PATENT DOCUMENTS

| | | |
|---|---|---|
| KR | 10-20180061612 A | 6/2018 |
| KR | 10-20180082661 A | 7/2018 |
| KR | 10-2018-0098447 | 9/2018 |

* cited by examiner

LIGHT EMITTING DISPLAY DEVICE

CROSS-REFERENCE TO RELATED APPLICATION

This application claims priority from and the benefit of Korean Patent Application No. 10-2021-0083325, filed on Jun. 25, 2021, which is hereby incorporated by reference for all purposes as if fully set forth herein.

BACKGROUND

Field

Embodiments of the invention relate generally to a light emitting display device and, more specifically, relate to a light emitting display device that reduces reflectance of external light without using a polarizer.

Discussion of the Background

A display device is a device with a screen to display images, and typically includes a liquid crystal display (LCD), an organic light emitting diode (OLED) display, or the like. Such a display device is used in various electronic devices such as portable phones, navigation devices, digital cameras, electronic books, portable game machines, or various terminals.

A display device such as an organic light emitting diode display may have a structure in which the display device can be bent or folded using a flexible substrate.

In addition, in small electronic devices such as portable phones, optical elements such as cameras and optical sensors are formed in the bezel region, which is the periphery of the display area, but as the size of the peripheral area of the display area is gradually reduced while the size of the screen to be displayed is increased, a technology that allows a camera or an optical sensor to be disposed on the back of the display area has been developed.

The above information disclosed in this Background section is only for understanding of the background of the inventive concepts, and, therefore, it may contain information that does not constitute prior art.

SUMMARY

Devices constructed according to illustrative implementations of the invention are capable of providing a light emitting display device that reduces reflectance of external light without using a polarizer.

Embodiments of the inventive concepts can improve display quality by lowering reflectance of external light or reducing color spread (color separation) caused by reflected light.

Additional features of the inventive concepts will be set forth in the description which follows, and in part will be apparent from the description, or may be learned by practice of the inventive concepts.

A light emitting display device according to an embodiment includes: a first pixel circuit portion that includes a first polycrystalline transistor including a polycrystalline semiconductor and a first oxide transistor including an oxide semiconductor; a first light emitting diode including a first anode connected with the first pixel circuit portion; a second pixel circuit portion that includes a second polycrystalline transistor including a polycrystalline semiconductor and a second oxide transistor including an oxide semiconductor; a second light emitting diode that includes a second anode connected with the second pixel circuit portion; an encapsulation layer that covers the first pixel circuit portion, the second pixel circuit portion, the first light emitting diode, and the second light emitting diode; a light blocking layer that includes a first light blocking layer opening disposed on the encapsulation layer and overlapping the first anode on a plane, and a second light blocking layer opening overlapping the second anode; a first color filter disposed in the first light blocking layer opening; and a second color filter disposed in the second light blocking layer opening, wherein, in the first pixel circuit portion, a first expansion portion corresponding to the first anode is disposed in and comprises a widened portion of a first conductive layer that is disposed in a layer that is first down from the first anode, and in the second pixel circuit portion, a second expansion portion corresponding to the second anode is disposed in and comprises a widened portion of a second conductive layer disposed in a layer that is second down from the second anode.

The light emitting display device may further include a first opening and a second opening that respectively overlap at least a part of the first anode and at least a part of the second anode, and a black pixel defining layer including a light blocking material.

The first expansion portion may overlap the entire first opening on a plane, and the second expansion portion may overlap the entire second opening on a plane.

The light emitting display device may further include an organic layer disposed between the first anode, the second anode, and the first conductive layer.

The organic layer may include two organic layers.

The organic layer may comprise a first opening for the first anode and a second opening for the second anode, and a horizontal distance between an edge of the first opening for the first anode and an edge of the first opening may be larger than a horizontal distance between an edge of the second opening for the second anode and an edge of the second opening.

The light emitting display device may further include: a first wiring portion that is disposed in the second conductive layer, and corresponds to the first opening; and a second wiring portion that is disposed in the first conductive layer, and corresponds to the second opening.

The first wiring portion overlapping the first opening may be formed of a single wiring portion extended in one direction, and the second wiring portion overlapping the second opening may be formed of four wiring portions extended in one direction.

An initialization voltage may be applied to the wiring portion forming the first wiring portion, and two of the four wiring portions forming the second wiring portion may be data lines, and the remaining two may be applied with a driving voltage.

The first wiring portion overlapping the first opening may include a wiring portion extended in a first direction, and the second wiring portion overlapping the second opening may include two wiring portions extended in a direction that is perpendicular to the first direction.

The wiring portion forming the first wiring portion may be applied with an initialization voltage, and the two wiring portions forming the second wiring portion may be data lines.

The second wiring portions may further include two additional wiring portions that overlap at least a part of the second opening in addition to the two wiring portions.

The two additional wiring portions may be additional signal wires that transmit a data voltage applied to the data line and are parallel with the data line.

The light emitting display device may further include a first additional signal wire that is disposed in the first conductive layer, electrically connected with the additional signal wire, and extended in a direction that is perpendicular to the additional signal wire.

The first light blocking layer opening and the second light blocking layer opening may respectively overlap the first opening and the second opening formed in the black pixel defining layer on a plane, the first light blocking layer opening may be larger than the first opening, and the second light blocking layer opening may be larger than the second opening.

An second element area where a conductive layer or a semiconductor layer is not disposed may be formed in the first pixel circuit portion or the second pixel circuit portion.

Additional openings may be respectively formed at positions in the black pixel defining layer, the light blocking layer, and the color filter corresponding to the second element area.

A light emitting display device according to another embodiment includes: a first semiconductor layer disposed on a substrate; a first gate conductive layer disposed on the first semiconductor layer; a second gate conductive layer disposed on the first gate conductive layer; a second semiconductor layer disposed on the second gate conductive layer; a third gate conductive layer disposed on the second semiconductor layer; a first data conductive layer disposed on the third gate conductive layer; a first organic layer covering the first data conductive layer; a second data conductive layer disposed on the first organic layer; a second organic layer sequentially disposed on the second data conductive layer; an anode disposed on the second organic layer; a black pixel defining layer including an opening overlapping the anode, and including a light blocking material; a cathode disposed on the black pixel defining layer; an encapsulation layer disposed on the cathode; a light blocking layer disposed on the encapsulation layer; and a color filter that is disposed on the light blocking layer, wherein the first data conductive layer or the second data conductive layer includes an expansion portion comprising a widened portion of the first data conductive layer or the second data conductive layer, the expansion portion overlaps the opening of the black pixel defining layer on a plane, and a width of the expansion portion is wider than a width of the opening of the black pixel defining layer, and the expansion portion is applied with a driving voltage.

A wiring portion may be disposed in a conductive layer where the expansion portion is not formed among the first data conductive layer and the second data conductive layer, the wiring portion may overlap the opening of the black pixel defining layer, and the wiring portion may include a data line transmitting a data voltage.

The light emitting display device may further include a third organic layer disposed between the second organic layer and the anode.

The light emitting display device may further omit a polarizer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
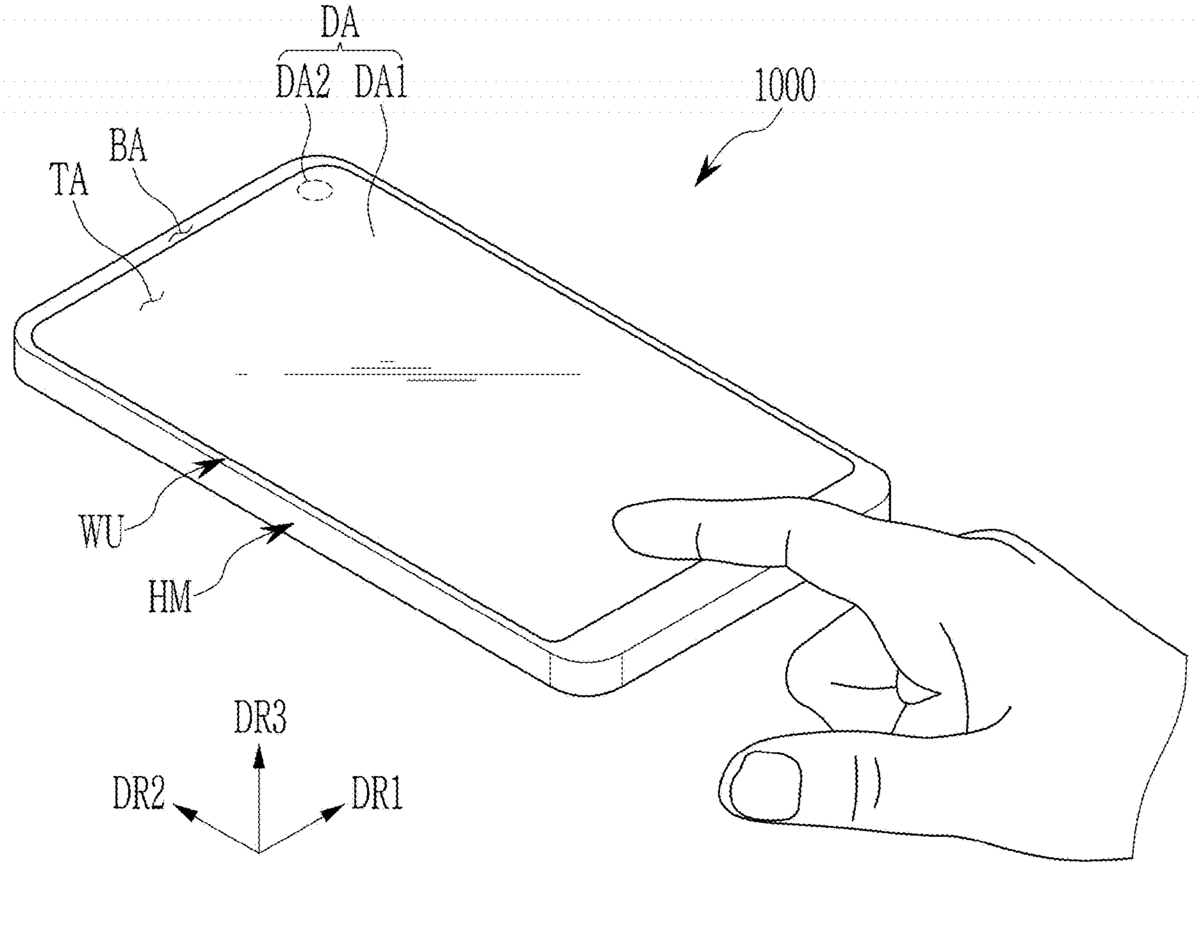
FIG. 1 is a schematic perspective view of a use stage of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Further, throughout the specification, the phrase "on a plane" or "in plan view" means viewing a target portion from the top, and the phrase "on a cross-section" means viewing a cross-section formed by vertically cutting a target portion from the side.

Hereinafter, referring to FIG. 1, FIG. 2, and FIG. 3, a structure of a light emitting display device will be schematically described.

Figure 2:
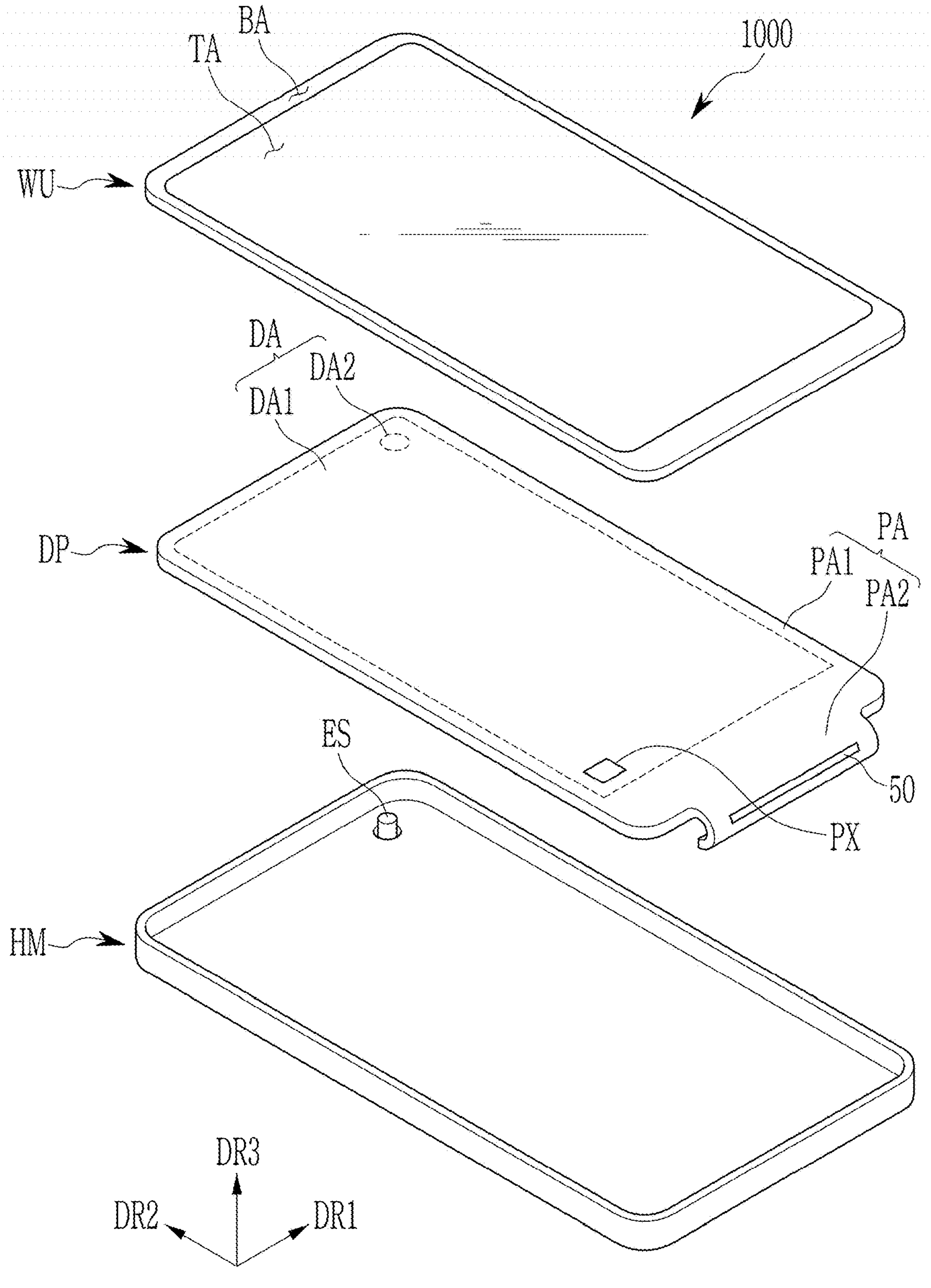
FIG. 2 is an exploded perspective view of the display device according to the embodiment.
Figure 3:
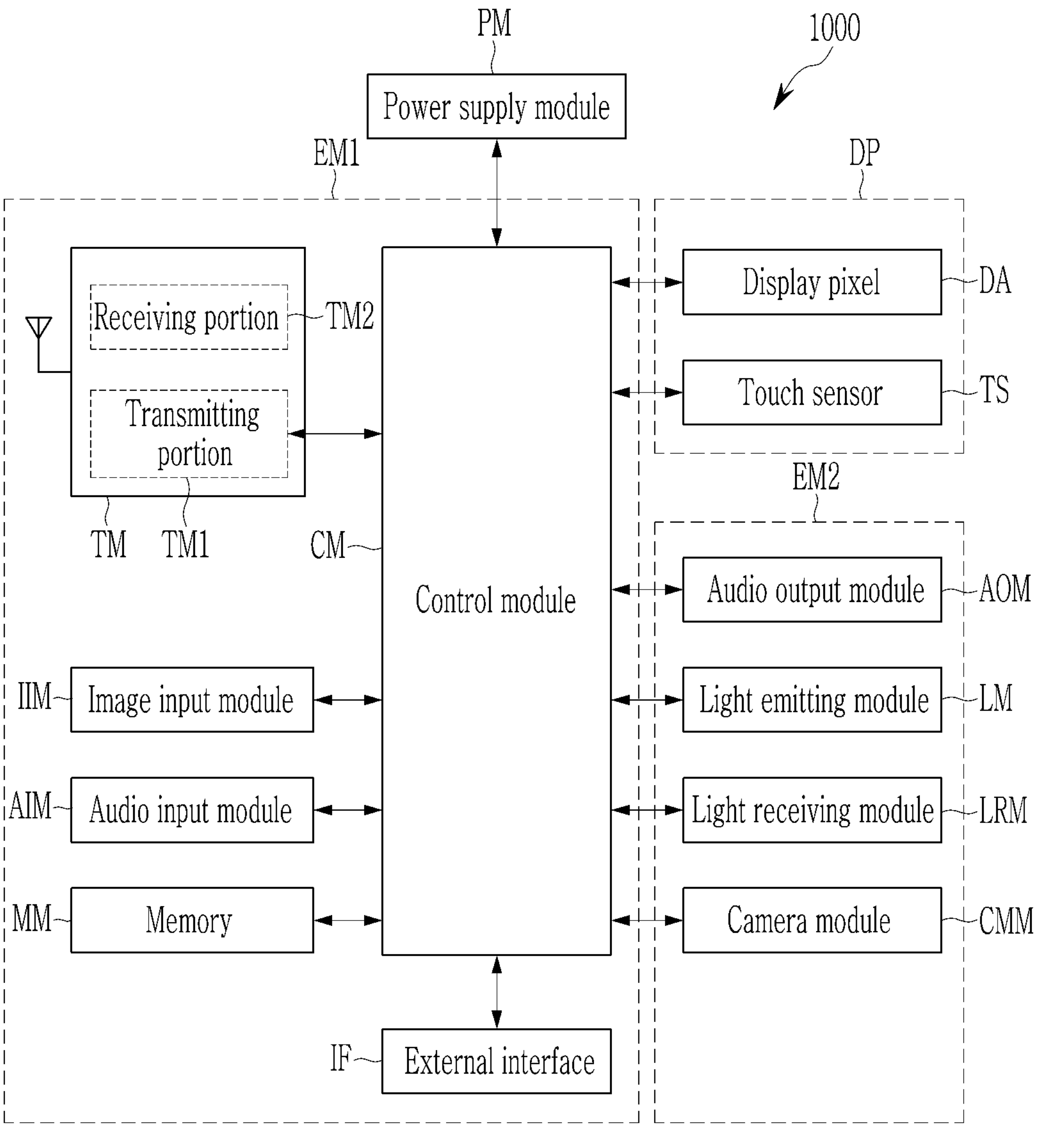
FIG. 3 is a block diagram of the display device according to the embodiment.

FIG. 1 is a schematic perspective view of a use stage of a display device according to an embodiment, FIG. 2 is an exploded perspective view of the display device according to the embodiment, and FIG. 3 is a block diagram of the display device according to the embodiment.

As a device for displaying a motion picture or a still image, a light emitting display device 1000 according to an embodiment may be used as a display screen of portable electronic devices such as a mobile phone, a smart phone, a tablet personal computer, a mobile communication terminal, an electronic notebook, an e-book, a portable multimedia player (PMP), a navigation aid, an ultra-mobile PC (UMPC), and the like, and various products such as a television, a laptop, a monitor, a billboard, an Internet of things (JOT), and the like. In addition, the light emitting display device 1000 according to the embodiment may be used in a wearable device such as a smart watch, a watch phone, a glasses-type display, a head mounted display (HMD), and the like. In addition, the light emitting display device 1000 according to the embodiment replaces an instrument panel (substrate) of a car, and a center fascia (center fascia) of the car or a CID (Center Information Display) disposed on a dashboard, as well as a side mirror of the car, and it can be used as a display dispose on the rear of the front seat as a room mirror display, or for entertainment for the rear seat of a car. FIG. 1 illustrates that the light emitting display device 1000 is used as a smart phone for better comprehension and ease of description.

Referring to FIG. 1, FIG. 2, and FIG. 3, the light emitting display device 1000 may display an image toward a third direction DR3 on a display plane that is parallel with a first direction DR1 and a second direction DR2. The display plane where the image is displayed may correspond to a front surface of the light emitting display device 1000, and may correspond to a front surface of a cover window WU. The image may include not only a still image but also a motion image.

In the present embodiment, a front (or top) and a rear (or bottom) of each member are defined based on a direction in which the image is displayed. The front and rear surfaces may be opposite to each other in the third direction DR3, and the normal directions of the front and rear surfaces may be parallel to the third direction DR3. A separation distance in the third direction DR3 between the front and rear surfaces may correspond to a thickness in the third direction DR3 of a light emitting display panel DP.

The light emitting display device 1000 according to the embodiment may sense an input (refer to the hand in FIG. 1) of a user applied from the outside. A user's input may include various types of external inputs such as a part of the user's body, light, heat, or pressure. In the embodiment, the user's input is shown with the user's hand applied in the front surface. However, the inventive concepts are not limited thereto. The user's input may be provided in various forms, and the light emitting display device 1000 may sense the user's input applied to the side or rear surface of the light emitting display device 1000 according to the structure of the light emitting display device 1000.

The light emitting display device 1000 may include a display area DA and non-display area PA disposed around the display area DA. The display area DA may be largely divided into a first display area DA1 and a first element area DA2 (hereinafter also referred to as a component area or a second display area), and in the embodiment, the first display area DA1 may include a plurality of pixels for displaying an image, and the first element area DA2 includes a light transmitting area, and may also additionally include pixels displaying an image. The first element area DA2 may be an area that at least partially overlaps with an optical element ES such as a camera or an optical sensor. In FIG. 1, although the first element area DA2 is provided in a circle shape on an upper right side of the light emitting display device 1000, the inventive concepts are not limited thereto. The first element area DA2 may be provided in various numbers and shapes according to the number and shape of the optical elements ES.

The light emitting display device 1000 may receive an external signal required for the optical element ES through the first element area DA2 or may externally provide a signal output from the optical element ES. In the embodiment, the first element area DA2 is provided to overlap the light transmitting area TA, and thus the area of a blocking region BA for forming the light transmitting area TA may be reduced. Here, the blocking area BA may include a bezel area having relatively low light transmittance compared to a transmissive area TA.

The light emitting display device 1000 may include a cover window WU, a housing HM, a light emitting display panel DP, and an optical element ES. In the embodiment, the cover window WU and housing HM may be combined to form the appearance of the light emitting display device 1000.

The cover window WU may include an insulating panel. For example, the cover window WU may be made of glass, plastic, or a combination thereof.

A front surface of the cover window WU may define the front surface of the light emitting display device 1000. The transmissive area TA may be an optically transparent area. For example, the transmissive area TA may be a region having visible ray transmittance of about 90% or more.

The blocking area BA may define the shape of the transmissive area TA. The blocking area BA may surround the transmissive area TA by being adjacent to the transmissive area TA. The blocking area BA may be an area having relatively low light transmittance compared to the transmissive area TA. The blocking area BA may include an opaque material that blocks light. The blocking area BA may have a predetermined color. The blocking area BA may be defined by a bezel layer provided separately from a transparent substrate defining the transmissive area TA, or may be defined by an ink layer formed by inserting or coloring the transparent substrate.

The emissive display panel DP may include a display panel DP displaying an image, a touch sensor TS sensing an external input, and a driver 50. The emissive display panel DP may include a front surface including a display area DA and a peripheral area PA. The display area DA may be a region in which a pixel operates and emits light according to an electrical signal.

In the embodiment, the display area DA is an area where pixels are included and thus an image is displayed, and at the same time, may be an area where the touch sensor TS is disposed at an upper side in the third direction DR3 of the pixel and with which an external input is sensed.

The transmissive area TA of the cover window WU may at least partially overlap the display area DA of the emissive display panel DP. For example, the transmissive area TA may overlap the front surface of the display area DA or may overlap at least a portion of the display area DA. Accordingly, the user may recognize the image through the transmissive area TA or provide an external input based on the image. However, the inventive concepts are not limited thereto. For example, in the display area DA, a region where an image is displayed and a region where an external input is sensed may be separated from each other.

The peripheral area PA of the emissive display panel DP may at least partially overlap with the blocking area BA of the cover window WU. The peripheral area PA may be a region covered by the blocking area BA. The peripheral area PA is adjacent to the display area DA and may surround the display area DA. An image is not displayed in the peripheral area PA, and a driving circuit or driving wiring for driving the display area DA may be disposed. The peripheral area PA may include a first peripheral area PA1 where the display area DA is disposed outside and a second peripheral area PA2 including the driver 50, a connection wire, and a bending area. In the embodiment of FIG. 2, the first peripheral area PA1 is disposed at three sides of the display area DA, and the second peripheral area PA2 is disposed the remaining side of the display area DA.

In the embodiment, the emissive display panel DP may be assembled in a flat state with the display area DA and the peripheral area PA facing the cover window WU. However, the inventive concepts are not limited thereto. A part of the peripheral area PA of the emissive display panel DP may be bent. In this case, a part of the peripheral area PA faces toward the rear surface of the light emitting display device 1000, and thus a blocking area BA that can be seen from the front of the light emitting display device 1000 can be reduced, and in FIG. 2, the second peripheral area PA2 is bent and thus may be assembled after being positioned on the rear surface of the display area DA.

The display area DA may include a first display area DA1 and a first element area DA2. The first element area DA2 includes a light transmissive area LTA (see FIG. 25) and thus may have a relatively high light transmittance compared to the first display area DA1. In addition, the first element area DA2 may have a relatively small area compared to the first display area DA1. The first element area DA2 may be defined as a region overlapping a region in which the optical element ES is disposed inside the housing HM among the emissive display panels DP. In the embodiment, the first element area DA2 is illustrated in a circle shape, but the inventive concepts are not limited thereto, and the first element area DA2 may have various shapes having at least one curved line such as polygons, ellipses, and figures.

The first display area DA1 may be adjacent to the first element area DA2. In the embodiment, the first display area DA1 may surround the entire first element area DA2. However, the inventive concepts are not limited thereto. The first display area DA1 may partially surround the first element area DA2. “”다 . Referring to FIG. 3, the emissive display panel DP may include a display area DA including a display pixel, and a touch sensor TS. The emissive display panel DP may be visually recognized by the user from the outside through the transmissive area TA, including the pixel that generates an image. In addition, the touch sensor TS may be disposed on an upper portion of the pixel, and may sense an external input applied from the outside. The touch sensor TS may sense an external input provided to the cover window WU.

Referring to FIG. 2, the second peripheral area PA2 may include a bending portion. The display area DA and the first peripheral area PA1 may have a flat state while being substantially parallel with a plane defined by the first direction DR1 and the second direction DR2, and one side of the second peripheral area PA2 may extend from the flat state, pass through the bending portion, and then be in a flat state again. Thus, at least a part of the second peripheral area PA2 may be assembled to be disposed at a rear side of the display area DA. At least a part of the second peripheral area PA2 overlaps the display area DA on a plane while being assembled, and thus the blocking area BA of the light emitting display device 1000 may be reduced. However, the inventive concepts are not limited thereto. For example, the second peripheral area PA2 may not be bent.

The driver 50 may be mounted on the second peripheral area PA2, mounted on the bending part, or disposed on one of both sides of the bending part. The driver 50 may be provided in the form of a chip.

The driver 50 may be electrically connected to the display area DA to transmit an electrical signal to the display area DA. For example, the driver 50 may provide data signals to pixels PX disposed in the display area DA. Alternatively, the driver 50 may include a touch driving circuit, and may be electrically connected with the touch sensor TS disposed in the display area DA. The driver 50 may include various circuits in addition to the circuits described above or may be designed to provide various electrical signals to the display area DA.

A pad portion may be disposed at an end of the second peripheral area PA2 of the light emitting display device 1000, and the light emitting display device 1000 may be electrically connected with a flexible printed circuit board (FPCB) that includes a driving chip by the pad portion. Here, the driving chip disposed in the FPCB may include various driving circuits for driving the light emitting display device 1000, or a connector for power supply. Depending on embodiments, a rigid printed circuit board (PCB) may be used instead of the flexible printed circuit substrate.

The optical element ES may be disposed under the emissive display panel DP. The optical element ES may receive an external input transmitted through the first element area DA2 or may output a signal through the first element area DA2. In the embodiment, the first element area DA2 having relatively high transmittance is provided inside the display area DA, and thus the optical element ES can be disposed to overlap the display area DA, and accordingly, the area of the blocking area BA (or size) can be reduced.

Referring to FIG. 3, the light emitting display device 1000 may include an emissive display panel DP, a power supply module PM, a first electronic module EM1, and a second electronic module EM2. The emissive display panel DP, the power supply module PM, the first electronic module EM1, and the second electronic module EM2 may be electrically connected to each other. In FIG. 3, the display pixel and touch sensor TS disposed in the display area DA among the configuration of the emissive display panel DP are illustrated as an example.

The power supply module PM may supply power required for the overall operation of the light emitting display device 1000. The power supply module PM may include a conventional battery module.

The first electronic module EM1 and the second electronic module EM2 may include various functional modules for operating the light emitting display device 1000. The first electronic module EM1 may be directly mounted on a motherboard electrically connected to the display panel DP or mounted on a separate substrate and electrically connected to the motherboard through a connector (not shown).

The first electronic module EM1 may include a control module CM, a wireless communication module TM, an image input module IIM, an audio input module AIM, a memory MM, and an external interface IF. Some of the modules are not mounted on the motherboard, but may be electrically connected to the motherboard through the flexible printed circuit substrate connected thereto.

The control module CM may control the overall operation of the light emitting display device 1000. The control module CM may be a microprocessor. For example, the control module CM activates or deactivates the display panel DP. The control module CM may control other modules such as the image input module IIM or the audio input module AIM based on a touch signal received from the display panel DP.

The wireless communication module TM may transmit/receive a wireless signal with another terminal using a Bluetooth or Wi-Fi line. The wireless communication module TM may transmit/receive voice signals using a general communication line. The wireless communication module TM includes a transmitting portion TM1 that modulates and transmits a signal to be transmitted, and a receiving portion TM2 that demodulates a received signal.

The image input module TIM may process image signals and convert the processed image signals into image data that can be displayed on the emissive display panel DP. The audio input module AIM may receive an external sound signal input by a microphone in a recording mode, a voice recognition mode, and the like, and convert it into electrical voice data.

The external interface IF may serve as an interface connected to an external charger, a wired/wireless data port, a card socket (e.g., a memory card, a SIM/UIM card), and the like.

The second electronic module EM2 may include an audio output module AOM, a light emitting module LM, a light receiving module LRM, and a camera module CMM, and at least some of these are optical elements ES and may be disposed on a rear side of the display area DA as shown in FIG. 1 and FIG. 2. As the optical element ES, a light emitting module LM, a light receiving module LRM, and a camera module CMM may be included. In addition, the second electronic module EM2 may be directly mounted on the motherboard, mounted on a separate substrate and electrically connected to the emissive display panel DP through a connector (not shown), or electrically connected to a first electronic module EM1.

The audio output module AOM may convert the audio data received from the wireless communication module TM or the audio data stored in the memory MM and output it to the outside.

The light emitting module LM may generate and output light. The light emitting module LM may output infrared rays. For example, the light emitting module LM may include an LED element. For example, the light receiving module LRM may sense infrared light. The light receiving module LRM may be activated when infrared light above a predetermined level is detected. The light receiving module LRM may include a CMOS sensor. After the infrared light generated by the light emitting module LM is output, the output infrared light is reflected by an external subject (e.g., a user's finger or face), and the reflected infrared light can be incident on the light receiving module LRM. The camera module CMM may take an external image.

In the embodiment, the optical element ES may additionally include a light sensing sensor or a thermal sensing sensor. The optical element ES may detect an external object received through the front surface or provide a sound signal such as a voice through the front surface to the outside. In addition, the optical element ES may include a plurality of configurations, and is not limited to any one embodiment.

Referring back to FIG. 2, the housing HM may be combined with the cover window WU. The cover window WU may be disposed in front of the housing HM. The housing HM may be combined with the cover window WU to provide a predetermined accommodation space.

The emissive display panel DP and the optical element ES may be accommodated in the predetermined accommodation space provided between the housing HM and the cover window WU.

The housing HM may contain a material with relatively high stiffness. For example, the housing HM may include a plurality of frames and/or plates made of glass, plastic, or metal, or a combination thereof. The housing HM may reliably protect the components of the light emitting display device 1000 housed in an interior space from external impact.

Hereinafter, referring to FIG. 4, a structure of the light emitting display device 1000 according to another embodiment will be described.

Figure 4:
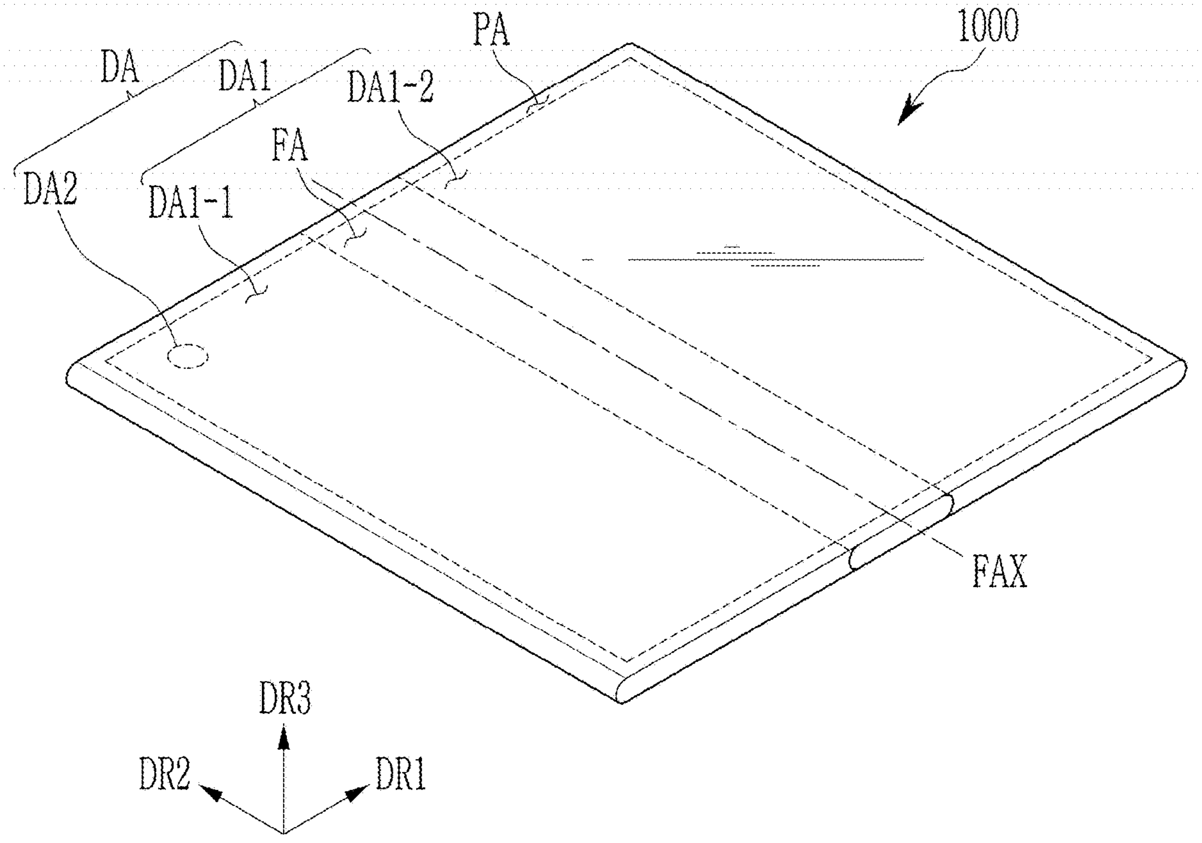
FIG. 4 is a schematic perspective view of a light emitting display device according to another embodiment.

FIG. 4 is a schematic perspective view of a light emitting display device according to another embodiment.

In the embodiment of FIG. 4, the light emitting display device 1000 is illustrated as a foldable light emitting display device having a structure that can be folded through a folding axis FAX.

As shown in FIG. 4, a first element area DA2 (hereinafter also referred to as a component area) may be disposed at one side of the foldable light emitting display device.

An optical element such as a camera or an optical sensor is disposed on a rear side of the first element area DA2 of FIG. 4, and a light transmissive area LTA is disposed in the first element area DA2. A structure of the light transmissive area LTA may be described later with respect to FIG. 25.

Referring to FIG. 4, in the embodiment, the light emitting display device 1000 may be a foldable light emitting display device. The light emitting display device 1000 may be folded outwardly or inwardly based on a folding axis FAX. When folded outward based on the folding axis FAX, a display surface of the light emitting display device 1000 is disposed on the outside in a third direction DR3, and thus images can be displayed in both directions. When folded inward based on the folding axis FAX, the display surface may not be visually recognized from the outside.

The light emitting display device 1000 may include a housing, a light emitting display panel, and a cover window.

In the embodiment, a light emitting display panel may include a display area DA and a peripheral area PA. The display area DA may be an area in which an image is displayed, and may be an area in which an external input is simultaneously sensed. The display area DA may be an area in which a plurality of pixels to be described later are disposed.

The display area DA may include a first display area DA1 and a first element area DA2. In addition, the first display area DA1 may be divided into a first display area DA1-1, a second display area DA1-2, and a folding area FA. The first display area DA1-1 and the second display area DA1-2 may be respectively disposed at the left side and the right side with reference to the folding axis FAX (or, a center), and the folding area FA may be disposed between the first display area DA1-1 and the second display area DA1-2. In this case, when folded outward based on the folding axis FAX, the first display area DA1-1 and the second display area DA1-2 are disposed on both sides in the third direction DR3, and images can be displayed in both directions. In addition, when folded inward based on the folding axis FAX, first display area DA1-1 and the second display area DA1-2 may not be visually recognized from the outside.

Hereinafter, a structure of a light emitting display panel DP according to an embodiment will be described with reference to FIG. 5.

Figure 5:
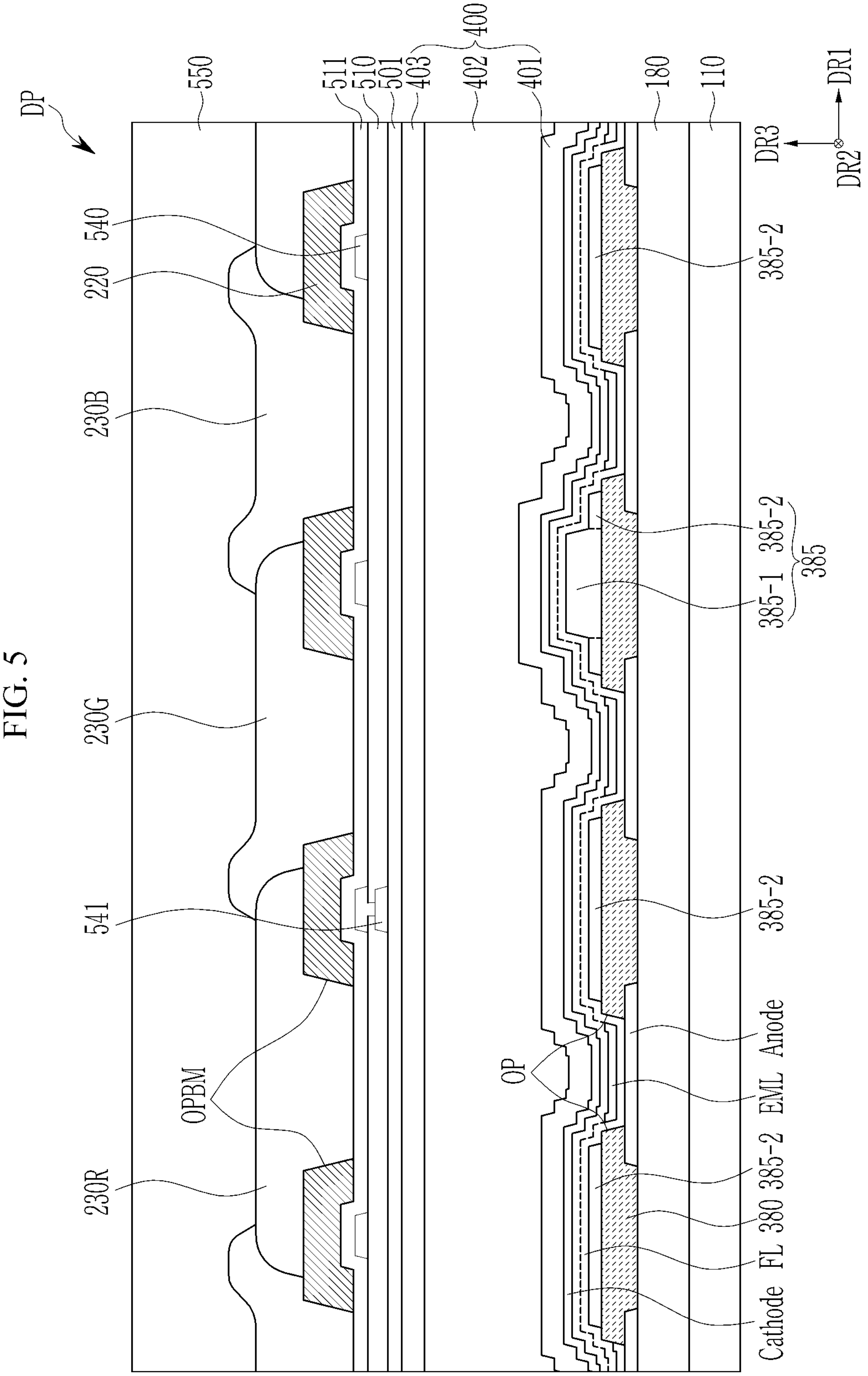
FIG. 5 is a schematic cross-sectional view of a light emitting display device according to an embodiment.

FIG. 5 is a schematic cross-sectional view of a light emitting display device according to an embodiment.

A light emitting display panel DP according to an embodiment may display an image by forming a light emitting diode on a substrate 110, and may detect a touch by including a plurality of detection electrodes 540 and 541. The light emitting display panel DP may have characteristics of color filters 230R, 230G, and 230B in light emitted from a light emitting diode by including a light blocking layer 220 and color filters 230R, 230G, and 230B.

In addition, a polarizer is not formed on a front surface of the light emitting display panel DP and a black pixel defining layer 380 is used instead according to the embodiment, and a light blocking layer 220 and a color filter 230 are formed on an upper portion and thus, even though external light is transmitted inside, it can be reflected from an anode and not transmitted to a user.

In addition, the anode is formed to be flat in the light emitting display panel DP according to the embodiment and thus light supplied from the outside can be prevented from spreading asymmetrically at the anode, thereby reducing color spread (color separation) caused by the reflected light and improving display quality.

In addition, in the light emitting display panel DP of FIG. 5, a black pixel defining layer 380 that separates an emission layer EML among light emitting diodes LED is formed of a black color organic material containing a light blocking material. The black pixel defining layer 380 that covers the periphery of the anode Anode blocks light by including a light blocking material, and thus light is reflected by a portion of the anode Anode, exposed through an opening OP of the black pixel defining layer 380, and the anode Anode is formed flat as a whole or the anode Anode exposed through the opening OP of the black pixel defining layer 380 is formed flat such that light is not reflected asymmetrically from the anode Anode.

In the light emitting display panel DP of FIG. 5, a spacer 385 (also referred to as a main spacer) having a step is formed on the black pixel defining layer 380. The spacer 385 includes a first portion 385-1 having a high height, and a second portion 385-2 having a lower height than the first portion 385-1 and formed at the periphery of the first portion 385-1. The spacer 385 may increase scratch strength of the light emitting display panel DP to reduce a defect occurrence rate due to a pressing pressure, and also increase adherence with a functional layer FL disposed on an upper portion of the spacer 385 to prevent moisture and air permeation from the outside. In addition, high adherence has a merit in that it can eliminate a problem of reducing adherence between layers when the light emitting display panel DP has a flexible characteristic when folded or unfolded.

With reference to FIG. 5, the light emitting display panel DP according to the embodiment will be described in detail.

The substrate 110 may include a material that does not bend due to a rigid characteristic such as glass, or a flexible material that can be bent, such as plastic or polyimide.

A plurality of thin film transistors are formed on the substrate 110, but they are not illustrated in FIG. 5, and only an organic layer 180 that covers the thin film transistors is illustrated. The organic layer 180 may include two or more organic layers to improve the flatness characteristic of the anode Anode disposed thereon.

Each pixel includes a pixel circuit portion where a light emitting diode, a plurality of transistors transmitting a light emission current to the light emitting diode, and a capacitor are formed. In FIG. 5, the pixel circuit portion is not illustrated, and a structure of the pixel circuit portion may vary depending on embodiments, and may have structures according to embodiments of FIG. 11, FIG. 12 to FIG. 24, or FIG. 31 to FIG. 43. In FIG. 5, an organic layer 180 covering the pixel circuit portion is illustrated.

A light emitting diode including an anode Anode, an emission layer EML, and a cathode Cathode is disposed on the organic layer 180.

The anode may be formed of a single layer containing a transparent conductive oxide film and a metal material or a multilayer containing them. transparent conductive oxide film may include an indium tin oxide (ITO), a poly-ITO, an indium zinc oxide (IZO), an indium gallium zinc oxide (IGZO), and an indium tin zinc oxide (ITZO), and the metal material may include silver (Ag), molybdenum (Mo), copper (Cu), gold (Au), aluminum (Al), and the like.

The emission layer EML may be formed of an organic light emitting material, and adjacent emission layers EML may display different colors. Depending on embodiments, the respective emission layers EML may display the same color due to the color filters 230R, 230G, and 230B disposed thereabove.

The black defining layer 380 is disposed on the organic layer 180 and the anode Anode, an opening is formed in the black pixel defining layer 380, the opening overlaps a part of the anode Anode, and the emission layer EML is disposed on the portion of the anode Anode, exposed by the opening. The emission layer EML may be disposed only inside the opening of the black pixel defining layer 380, and is distinguished from adjacent emission layers EML by the black pixel defining layer 380. The black pixel defining layer 380 may be formed of an organic material with a negative type of black color. An organic material with a black color may contain a light blocking material, and as the light blocking material, carbon black, carbon nanotubes, a resin or paste containing a black dye, metal particles, for example, nickel, aluminum, molybdenum, and alloys thereof, and metal oxide particles (e.g., chromium nitride). The black pixel defining layer 380 includes a light blocking material and has a black color, and may have a characteristic that light is not reflected and is absorbed/blocked. Since the negative type of organic material is used, a portion covered by a mask can be removed.

Herein, the black pixel defining layer 380 may be formed as a negative type, the spacer 385 may be formed as a positive type, and they may include materials of the same type.

The spacer 385 is formed on the black pixel defining layer 380. The spacer 385 includes a first portion 385-1 disposed in a high and narrow region and a second portion 385-2 disposed in a low and wide region. In FIG. 5, although the first portion 385-1 and the second portion 385-2 are shown to be separated through a dotted line in the spacer 385, they may be formed as one spacer. Here, the first portion 385-1 may serve to secure rigidity against a pressing pressure by reinforcing scratch strength. The second portion 385-2 may serve as a contact assistant between the black pixel defining layer 380 and an upper functional layer FL. The first portion 385-1 and the second portion 385-2 may be formed of the same material, and may be formed of a positive type of photosensitive organic material, for example, photosensitive polyimide (PSPI) may be used. Since it has a positive characteristic, a portion not covered by the mask can be removed. The spacer 385 is transparent and thus light can be transmitted and/or reflected.

Most of the upper surface of the black pixel defining layer 380 is covered by the spacer 385, and the spacer 385 has a structure in which an edge of the second portion 385-2 is spaced apart from an edge of the black pixel defining layer 380, and thus a part of the black pixel defining layer 380 is not covered by the spacer 385. The second portion 385-2 also covers the upper surface of the black pixel defining layer 380 where the first portion 385-1 is not positioned, to strengthen the adhesion characteristic between the black pixel defining layer 380 and the functional layer FL. Here, the spacer 385 is formed of photosensitive polyimide (PSPI), and may be formed of a positive type of organic material. Depending on embodiments, the spacer 385 may be formed of only one part having a trapezoid shape.

The functional layer FL is disposed on the emission layer EML, the spacer 385, and the exposed black pixel defining layer 380, and the functional layer FL may be formed on the entire surface of the light emitting display device (DP). The functional layer FL may include an electron injection layer, an electron transport layer, a hole transport layer, and a hole injection layer, and the functional layer FL may be disposed above and below the emission layer EML. That is, the hole injection layer, the hole transport layer, the emission layer EML, the electron transport layer, the electron injection layer, and the cathode are sequentially disposed on the anode Anode, and thus the hole injection layer and the hole transport layer of the functional layer FL are disposed below the emission layer EML, while the electron transport layer and the electron injection layer may be disposed above the emission layer EML.

The cathode may be formed as a light-transmitting electrode or a reflecting electrode. Depending on embodiments, the cathode may be a transparent or semi-transparent electrode, and may be formed of a metal thin film having a small work function, such as lithium (Li), calcium (Ca), lithium fluoride/calcium fluoride (LiF/Ca), lithium fluoride/aluminum (LiF/Al), aluminum (Al), silver (Ag), magnesium (Mg), and a compound thereof. In addition, a transparent conductive oxide (TCO) such as an indium tin oxide (ITO), an indium zinc oxide (IZO), a zinc oxide (ZnO), or an indium oxide ($In_2O_3$) can be further disposed on the metal thin film. The cathode may be integrally formed over the entire surface of the light emitting display device DP.

An encapsulation layer 400 is disposed on the cathode Cathode. The encapsulation layer 400 includes at least one inorganic layer and at least one organic layer, and in FIG. 5, the encapsulation layer 400 has a triple layer structure including a first inorganic encapsulation layer 401, an organic encapsulation layer 402, and a second inorganic encapsulation layer 403. The encapsulation layer 400 may be to protect the emission layer EML formed of an organic material from moisture or oxygen that may be inflowed from the outside. Depending on embodiments, the encapsulation layer 400 may include a structure in which an inorganic layer and an organic layer are sequentially further stacked. Here, a thickness of the organic encapsulation layer 402 may be formed to be 3.5 μm or more and 4.5 μm or less, for example, 4 μm. The thickness of the organic encapsulation layer 402 may be reduced from 8 μm or more to half the thickness to improve the effect of touch sensing disposed thereon, and a distance between the black pixel defining layer 380 and the light blocking layer 220 may be reduced to allow the user to view an image at a wide angle.

Sensing insulating layers 501, 510, and 511 and a plurality of sensing electrodes 540 and 541 are disposed on the encapsulation layer 400 for touch sensing. In the embodiment of FIG. 5, a touch is sensed in a capacitive type using two sensing electrodes 540 and 541, but depending on embodiments, a touch may also be sensed in a cell cap method using only one sensing electrode. The plurality of sensing electrodes 540 and 541 may be insulated from each other while disposing the sensing insulating layers 501, 510, and 511 therebetween, and a part may be electrically connected through openings disposed in the sensing insulating layers 501, 510, and 511. Here, the sensing electrodes 540 and 541 may include a metal such as aluminum (Al), copper (Cu), silver (Ag), gold (Au), molybdenum (Mo), titanium (Ti), tantalum (Ta), and the like, or a metal alloy thereof, and may be formed as a single layer or multiple layers. In the present embodiment, a lower sensing insulating layer 501 is disposed below a lower sensing electrode 541, middle sensing insulating layers 501, 510, and 511 are disposed between the lower sensing electrode 541 and an upper sensing electrode 540, and an upper sensing insulating layer 511 is disposed between the upper sensing electrode 540 and the light blocking layer 220. The upper sensing insulating layer 511 may also be disposed below the color filters 230R, 230G, and 230B.

Accordingly, additional insulation layers may further be formed between, above, and below the two sensing electrodes 540 and 541.

The light blocking layers 220 and the color filters 230R, 230G, and 230B are disposed on the upper sensing electrode 540.

The light blocking layer 220 may be disposed to overlap the sensing electrodes 540, and 541 on a plane. The light blocking layer 220 has an opening OPBM, and the opening OPBM of the light blocking layer 220 overlaps the opening OP of the black pixel defining layer 380 on a plane. In addition, the opening OPBM of the light blocking layer 220 may be formed wider than the opening OP of the black pixel defining layer 380. As a result, the anode Anode overlapping with the opening OP of the black pixel defining layer 380 (i.e., exposed by the opening OP of the black pixel defining layer 380) may have a structure that is not covered by the light blocking layer 220 on a plane. This is to prevent the anode Anode and the emission layer EML that can display an image from being covered by the light blocking layer 220 and sensing electrodes 540 and 541. The light blocking layer 220 may have a thickness of about 1 μm, and depending on embodiments, it may have a thickness of 1.1 μm.

The color filters 230R, 230G, and 230B are disposed on the sensing insulating layers 501, 510, and 511 and the light blocking layer 220. The color filters 230R, 230G, and 230B include a red color filter 230R that transmits red light, a green color filter 230G that transmits green light, and a blue color filter 230B that transmits blue light. Each of the color filters 230R, 230G, and 230B may be disposed so as to overlap the anode Anode of the light emitting diode (LED) on a plane. Since light emitted from the emission layer EML may be emitted while being changed to a corresponding color while passing through a color filter, all of the light emitted from the emission layer EML may have the same color. However, in the emission layer EML, different colors of light are displayed, and the displayed color may be enhanced by passing through a color filter of the same color.

A thickness of the color filters 230R, 230G, and 230B may be 2 μm or more and 3 μm or less, and depending on embodiments, it may have a thickness of 2.7 μm.

The light blocking layer 220 may be disposed between each of the color filters 230R, 230G, and 230B. Depending on embodiments, the color filters 230R, 230G, and 230B may be replaced with a color conversion layer, or may further include a color conversion layer. The color conversion layer may include quantum dots.

A planarization layer 550 covering the color filters 230R, 230G, and 230B is disposed on the color filters 230R, 230G, and 230B. The planarization layer 550 is for planarizing an upper surface of the light emitting display device, and may be a transparent organic insulator including at least one material selected from a group consisting of polyimide, polyamide, acryl resin, benzocyclobutene, and phenol resin.

Depending on embodiments, a low refractive layer and an additional planarization layer may be further disposed on the planarization layer 550 to improve front visibility and light emission efficiency of the display device. Light can be emitted while being refracted to the front by the low refractive layer and the additional planarization layer having a high refractive characteristic. In this case, the low refractive layer and the additional planarization layer may be disposed directly on the color filter 230, and thus the planarization layer 550 can be omitted depending on embodiments.

In the present embodiment, a polarizer is not included on the planarization layer 550. That is, the polarizer may serve to prevent display deterioration while the user recognizes external light incident thereon and reflected from the anode Anode. However, in the present embodiment, a structure in which the black pixel defining layer 380 covers the side of the anode Anode to reduce the degree of reflection from the anode Anode that is formed, and the light blocking layer 220 is formed and included to reduce the incidence of light to prevent deterioration of display quality due to reflection. Therefore, it is not necessary to separately form a polarizer on the front surface of the light emitting display device DP.

In addition, in the present embodiment, the anode Anode exposed by the opening OP of the black pixel defining layer 380, which is the part where external light can be reflected, is formed flat such that light is not reflected asymmetrically from the anode Anode.

The light emitting display panel DP according to the embodiment can be largely divided into a lower panel layer and an upper panel layer. The lower panel layer is a part where the light emitting diode and a pixel circuit portion that form a pixel are disposed, and may include up to an encapsulation layer 400 covering the lower panel layer. That is, the lower panel layer include from the substrate 110 to the encapsulation layer 400, that is, the anode Anode, the black pixel defining layer 380, the emission layer EML, the spacer 385, the functional layer FL, and the Cathode cathode, and includes an insulating layer between the substrate 110 and the anode Anode, a semiconductor layer, and a conductive layer.

The upper panel layer is a portion disposed on the encapsulation layer 400, and includes the sensing insulating layers 501, 510, and 511 and the plurality of sensing electrodes 540 and 541 that can sense a touch, and the light blocking layer 220, the color filters 230R, 230G, and 230B, the planarization layer 550, and the like.

Hereinafter, referring to FIG. 6, a lower structure of the anode Anode for planarizing the anode Anode according to the present embodiment will be described in detail.

Figure 6:
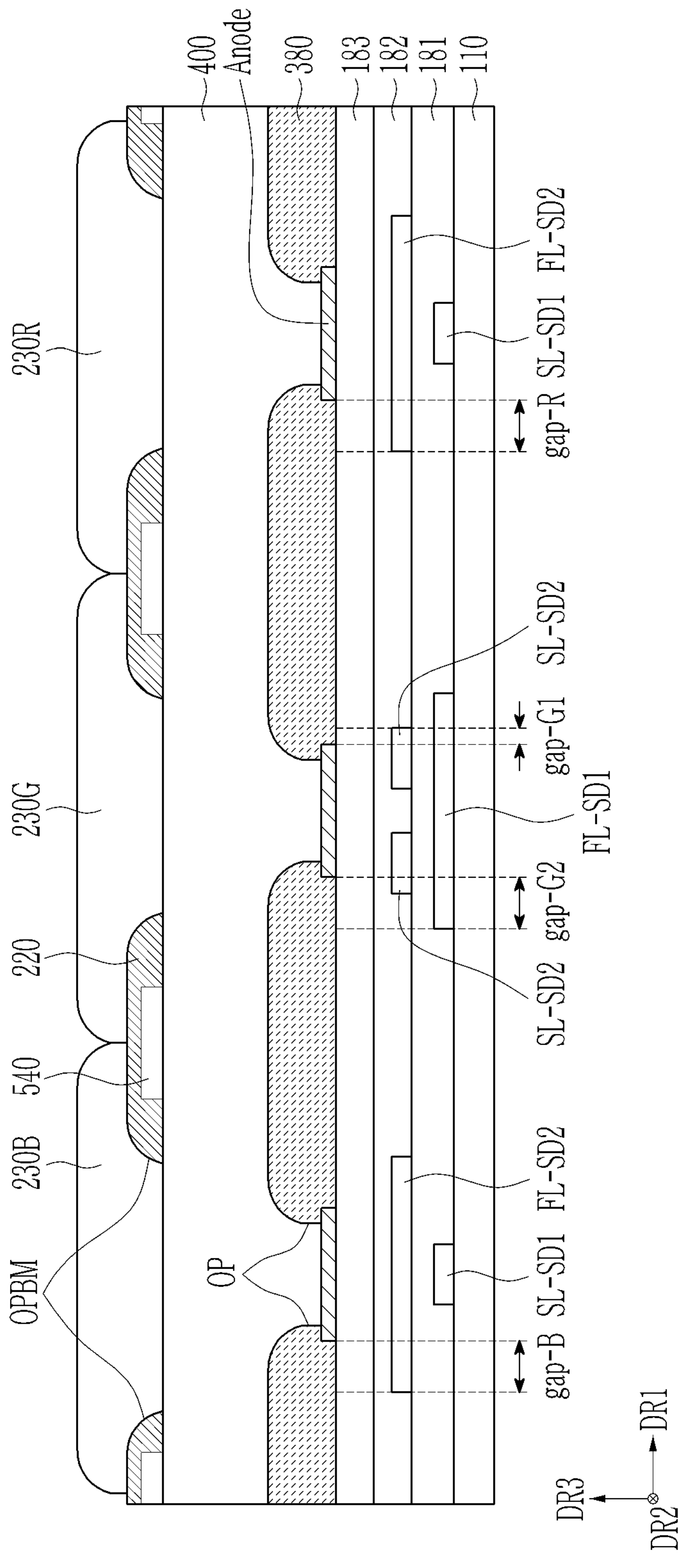
FIG. 6 is an enlarged cross-sectional view of a part of the light emitting display device according to the embodiment.

FIG. 6 is an enlarged cross-sectional view of a part of the light emitting display device according to the embodiment.

In FIG. 6, the emission layer EML, the functional layer FL, and the cathode Cathode are omitted, but in FIG. 6, the light blocking layer 220 and color filters 230R, 230G, and 230B are additionally shown to clearly show the relationship with the light blocking layer 220.

In FIG. 6, the opening OP of the black pixel defining layer 380 is disposed on the anode Anode, and the opening OP is partially overlapped with the anode Anode such that a part of the top surface of the anode Anode is exposed. Although it is not illustrated in FIG. 6, the emission layer EML is disposed on the exposed anode Anode and in the opening OP of the black pixel defining layer 380. The black pixel defining layer 380 has a black color such that light is not reflected from a part of the anode Anode covered by the black pixel defining layer 380. The emission layer EML may include different materials depending on colors to be displayed, and accordingly, a size of the opening OP of the black pixel defining layer 380 may be determined. Here, the size of the opening OP of the black pixel defining layer 380 is related to the lifetime of the emission layer EML, and when the material of the emission layer EML is determined, the opening OP can be formed with a size set in consideration of the lifetime of the material.

In FIG. 6, a lower structure of the anode Anode is illustrated in detail.

A first organic layer 181, a second organic layer 182, and a third organic layer 183 are formed below the anode Anode. A first data conductive layer SD1 is disposed between the first organic layer 181 and the substrate 110, a second data conductive layer SD2 is disposed between the first organic layer 181 and the second organic layer 182, and the anode Anode is formed on the third organic layer 183. A separate conductive layer may not be formed between the second organic layer 182 and the third organic layer 183, and depending on embodiments, an additional conductive layer may be disposed in a region (peripheral area) where no pixel is formed, and the third organic layer may be omitted.

Conductive layers (e.g., a first gate conductive layer, a second gate conductive layer, and the like), semiconductor layers (e.g., a polycrystalline semiconductor layer, an oxide semiconductor layer, and the like), and insulating layers (an inorganic insulating layer and/or an organic insulator) may be formed between the substrate 110 and the first data conductive layer SD1. A lower structure of the first data conductive layer SD1 may be described in detail with reference to FIG. 12 to FIG. 25 or FIG. 31 to FIG. 44.

Expansion portions FL-SD1 and FL-SD2 are formed in the first data conductive layer SD1 or the second data conductive layer SD2 which is the lower part of the anode Anode and overlaps the anode Anode on a plane. The organic layers 181, 182, and 183 and the expansion portions FL-SD1 and FL-SD2 are disposed to planarize the anode Anode that is disposed thereon by removing a step difference therebelow. Wiring portions SL-SD1 and SL-SD2 may be disposed in the first data conductive layer SD1 or the second data conductive layer SD2 in areas in which the expansion portions FL-SD1 and FL-SD2 are not formed.

A structure of each pixel for each color will now be described in detail with reference to FIG. 6.

A blue pixel is a pixel disposed below the blue color filter 230B. The opening OPBM of the light blocking layer 220 disposed on the blue pixel is larger than the opening OP of the black pixel defining layer 380. The expansion portion FL-SD2 is disposed in the second data conductive layer SD2 disposed below the anode Anode, and the wiring portion SL-SD1 is disposed in the first data conductive layer SD1 disposed therebelow. An edge of the expansion portion FL-SD2 disposed on the second data conductive layer SD2 is formed wider than an edge of the anode Anode by a gap-B interval on a plane. The organic layers 181, 182, and 183 and the expansion portion FL-SD2 flatten the anode Anode disposed on the upper portion while overlapping on a plane by removing the step difference disposed under the organic layers 181, 182, and 183 and the expansion portion FL-SD2. Although only one wiring portion SL-SD1 overlapping the expansion portion FL-SD2 is illustrated, two or more wiring portions SL-SD1 may be formed.

A green pixel is a pixel disposed below the green color filter 230G. The opening OPBM of the light blocking layer 220 disposed in the green pixel is larger than the opening OP of the black pixel defining layer 380. The expansion portion FL-SD1 is disposed in the first data conductive layer SD1 disposed below the anode Anode, and the wiring portion SL-SD2 is disposed in the second data conductive layer SD2 disposed above the anode Anode. An edge of the expansion portion FL-SD1 disposed in the first data conductive layer SD1 is formed wider from an edge of the anode Anode by an interval of gap-G2 on a plane. The wiring portion SL-SD2 disposed in the second data conductive layer SD2 is formed as a pair, and an outer edge of a pair of wiring portions SL-SD2 is formed wider from an edge of the anode Anode by the interval of gap-G1 on a plane. The organic layers 181, 182, and 183, the expansion portion FL-SD1, and the wiring portion SL-SD2 having an edge disposed outside the edge of the anode Anode to remove a step disposed therebelow. As a result, the anode Anode disposed thereabove, while overlapping on a plane, is flattened. Although the wiring portion SL-SD2 overlapping the expansion portion FL-SD1 is shown as a pair, depending on embodiments, only one wiring portion SL-SD2 may be formed or three or more may overlap the anode Anode.

A red pixel may have a structure similar to that of the blue pixel. That is, the red pixel is a pixel disposed below the red color filter 230R. The opening OPBM of the light blocking layer 220 disposed on the red pixel is larger than the opening OP of the black pixel defining layer 380. The expansion portion FL-SD2 is disposed in the second data conductive layer SD2 disposed below the anode Anode, and the wiring portion SL-SD1 is disposed in the first data conductive layer SD1 disposed therebelow. The edge of the expansion portion FL-SD2 disposed in the second data conductive layer SD2 is formed wider from the edge of the anode by a gap-R interval on a plane. The organic layers 181, 182, and 183 and the expansion portion FL-SD2 flatten the anode Anode disposed in the upper portion while overlapping on a plane by removing the step disposed therebelow. Although only one wiring portion SL-SD1 overlapping the expansion portion FL-SD2 is illustrated, two or more wiring portions SL-SD1 may be formed.

Hereinafter, a more detailed planar structure of the light emitting display panel DP according to the embodiment will be described with reference to FIG. 7 and FIG. 8.

The light emitting display panel DP may be largely divided into a lower panel layer and an upper panel layer, and the lower panel layer is a part where a light emitting diode and a pixel circuit forming a pixel are disposed, and may include the encapsulation layer 400 covering the lower panel layer. That is, the anode Anode, the black pixel defining layer 380, the emission layer EML, the spacer 385, the functional layer FL, and the cathode cathode are included from the substrate 110 to the encapsulation layer 400, and the semiconductor layer, the conductive layer, and the insulating layer are included between the substrate 110 and the anode Anode.

The upper panel layer is a portion disposed in an upper portion of the encapsulation layer 400, and may include sensing insulating layers 501, 510, and 511 and a plurality of sensing electrodes 540 and 541 that can sense a touch, and may include a light blocking layer 220, color filters 230R, 230G, and 230B, and a planarization layer 550.

First, referring to FIG. 7, a planar structure of the first data conductive layer SD1 and the second data conductive layer SD2 of the lower panel layer will be described in detail.

Figure 7:
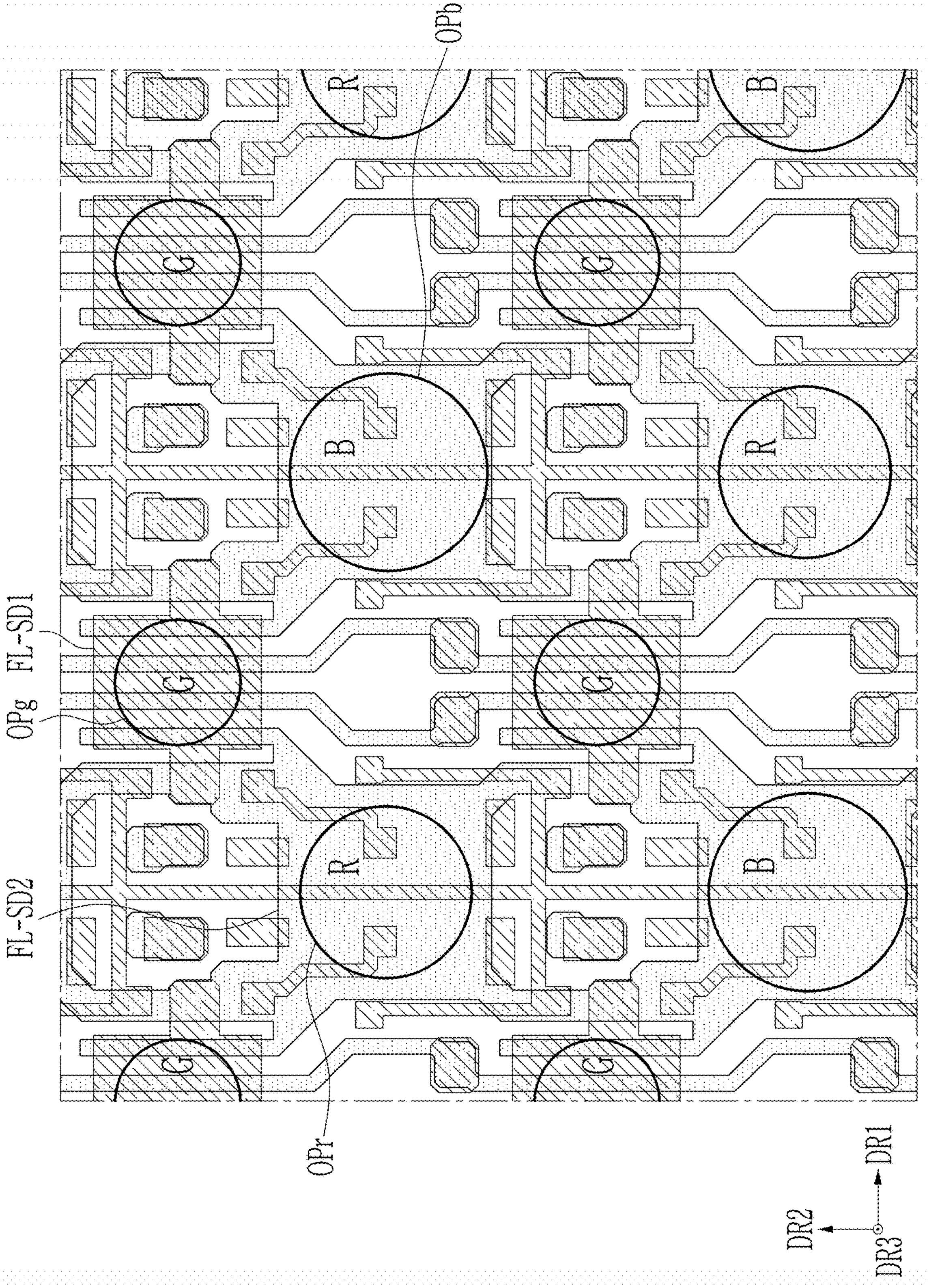
FIG. 7 is a top plan view of a part of the lower panel layer of the light emitting display device according to the embodiment.

FIG. 7 is a top plan view of a part of the lower panel layer of the light emitting display device according to the embodiment.

In FIG. 7, only openings OPr, OPg, and OPb for red, green, and blue formed in the black pixel defining layer 380 according to the embodiment, a first data conductive layer, and a second data conductive layer are illustrated. In FIG. 7, the first data conductive layer and the second data conductive layer are shown with different hatches.

An expansion portion FL-SD2 that is formed by expanding the second data conductive layer SD2 in a width direction is formed below the openings OPr and OPb of the red and blue. That is, the expansion portion FL-SD2 of the second data conductive layer SD2 and the openings OPr and OPb of the red and blue overlap each other on a plane. The first data conductive layer has a structure in which one wiring portion crosses the expansion portion FL-SD2 of the second data conductive layer and the openings OPr and OPb of the red and blue, and referring to FIG. 19, the wiring portion of the first data conductive layer may be a part of the second initialization voltage line 128 and may be applied with a second initialization voltage AVinit (see FIG. 11). The anode overlapping the red and blue openings OPr and OPb may be flattened by the expansion portion FL-SD2 of the second data conductive layer, the wiring portion of the first data conductive layer, and at least one of organic layers 181, 182, and 183.

An expansion portion FL-SD1 formed by widely expanding the first data conductive layer exists below the green opening OPg. That is, the expansion portion FL-SD1 of the first data conductive layer and the green opening OPg overlap each other on a plane. In FIG. 7, a total of four wiring portions disposed on the second data conductive layer have a structure overlapping with the expansion portion FL-SD1 and the green opening OPg of the first data conductive layer, and referring to FIG. 21, the wiring portion of second data conductive layer may be a part of a data line 171 transmitting a data voltage and a part of a driving voltage line 172 transmitting a driving voltage ELVDD. Since a second data conductive layer disposed below an anode corresponding to the green opening OPg does not have a flat expansion structure, there may also be a possibility that the flatness of the anode will decrease. However, the organic layers 182 and 183 are disposed and thus the flatness characteristic is improved by the organic layers 182 and 183, and four wiring portions are disposed in the second data conductive layer such that no step is generated in the anode. Considering the actual line width of one wiring, the size of the green opening OPg formed in the black pixel defining layer 380, and the degree of flattening by the organic layers 182 and 183, as shown in FIG. 7, the four wiring portions are formed in the second data conductive layer to overlap the green opening OPg such that the anode may have a characteristic that it is substantially flat. Therefore, the anode overlapping the opening OPg of the green may be formed to be flat by the expansion portions FL-SD1 of the first data conductive layer, the wiring portions of the second data conductive layer, and at least one of the organic layers 181, 182, and 183.

Hereinabove, referring to FIG. 7, the planar relationship between the first data conductive layer, the second data conductive layer, and the red, green, and blue openings OPr, OPg, and OPb formed in the black pixel defining layer 380 among the lower panel layers was described in detail. Hereinafter, a planar structure of the upper pattern will be described in detail with reference to FIG. 8.

Figure 8:
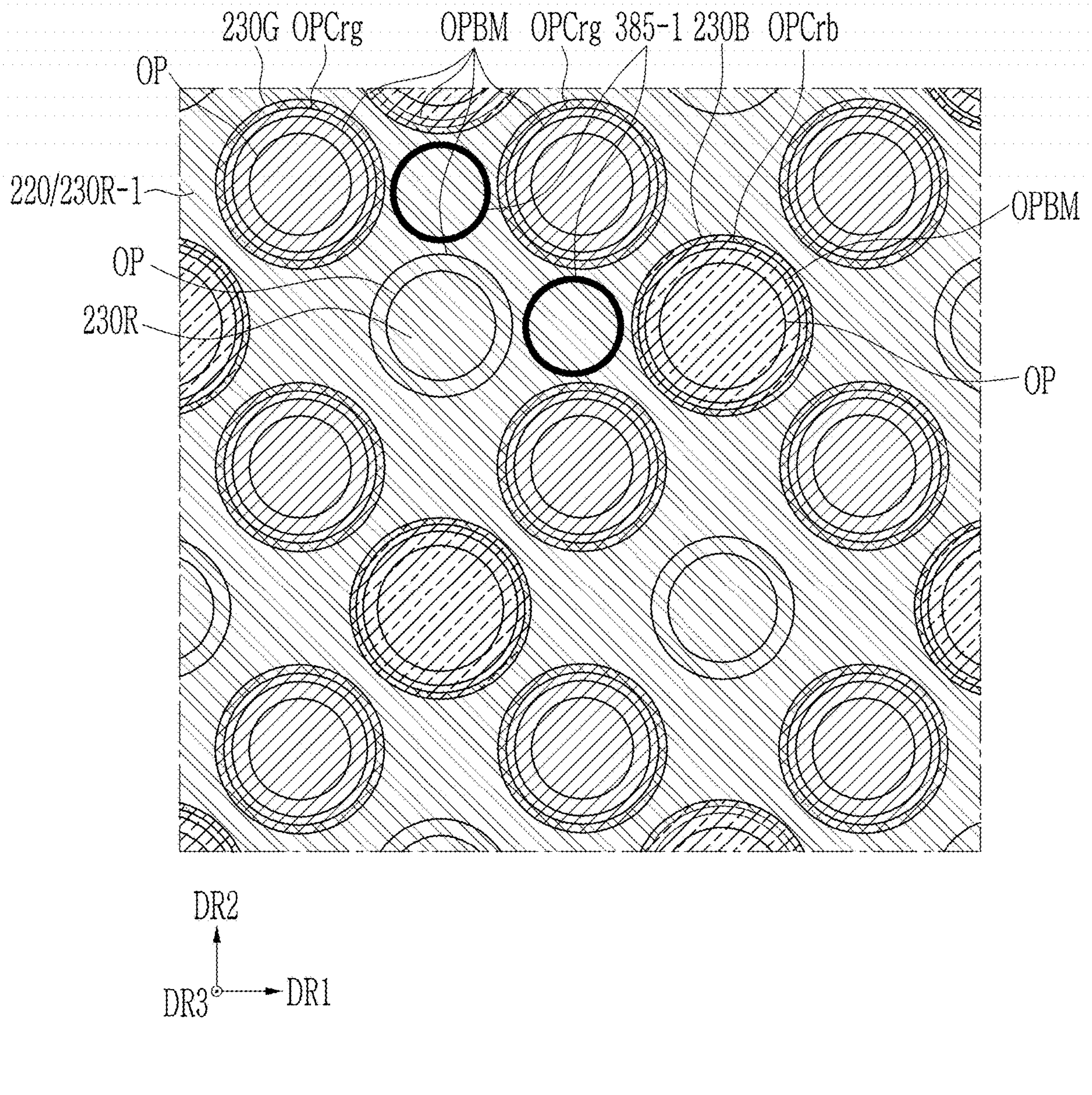
FIG. 8 is a top plan view of a part of the upper panel layer of the light emitting display device according to the embodiment.

FIG. 8 is a top plan view of a part of the upper panel layer of the light emitting display device according to the embodiment.

Referring to FIG. 8, the light blocking layer 220 includes the opening OPBM, and as shown in FIG. 5 and FIG. 6, the opening OPBM may be formed wider than the opening OP of the black pixel defining layer 380 while overlapping the same on a plane. In addition, in FIG. 8, in order to clearly illustrate a relationship between the upper panel layer and the lower panel layer, the opening OP of the black pixel defining layer 380 disposed in the lower panel layer and the first portion 385-1 of the spacer 385 are additionally illustrated.

The color filters 230R, 230G, and 230B are disposed on the light blocking layer 220. One color of the color filters 230R, 230G, and 230B may be wholly disposed while having an opening, and two other colors may fill the opening. Referring to the embodiment of FIG. 8, the red color filter 230R is wholly disposed while having openings OPCrg and OPCrb, and the green and blue color filters 230G and 230B fill the openings OPCrg and OPCrb. In FIG. 8, each color is easily distinguished by illustrating each color filter to be shown with different hatching.

The red color filter 230R overlaps the light blocking layer 220, the red color filter 230R is filled in the opening OPBM for the red pixel among the OPBM of the light blocking layer 220 such that the red pixel opening OPBM and the red color filter 230R overlap on a plane. That is, in the embodiment of FIG. 8, the red color filter 230R further includes an overlapping portion 230R-1 that overlaps the light blocking layer 220 in addition to a main portion disposed in the opening OPBM of the light blocking layer 220. The red color filter 230R has openings OPCrg and OPCrb in positions corresponding to the opening OPBM for the green pixel and the opening OPBM for the blue pixel, respectively. The openings OPCrg and OPCrb of the red color filter 230R are wider than the opening OPBM of the light blocking layer 220.

The green color filter 230G is disposed only in positions overlapping the opening OPBM for the green pixel of the light blocking layer 220 and the opening OPCgr for the green pixel of the red color filter 230R. The green color filter 230G may be formed wider, while overlapping the opening OPBM for the green pixel and the opening OPCrg for the green pixel on a plane.

The blue color filter 230B is disposed only in positions overlapping the opening OPBM for the blue pixel of the light blocking layer 220 and the opening OPCrb for the blue pixel of the red color filter 230R. The blue color filter 230B overlaps the opening OPBM for the blue pixel and the opening OPCrb for the blue pixel on a plane, and may be formed wider than the opening OPBM for the blue pixel and the opening OPCrb for the blue pixel.

Referring to FIG. 8, the position of the first portion 385-1 of the spacer 385 is also illustrated, and may be formed at a location overlapping the light blocking layer 220 and an overlapping portion 230R-1 of the red color filter 230R on a plane. However, the black pixel defining layer 380 is disposed on the first portion 385-1 of the spacer 385 with reference to the third direction DR3, but may be disposed lower than the light blocking layer 220 or the overlapping portion 230*r*_1 of the red color filter 230R with reference to the third direction DR3.

The structure of the upper panel layer shown in FIG. 8 may be a structure disposed above a normal pixel.

Figure 9:
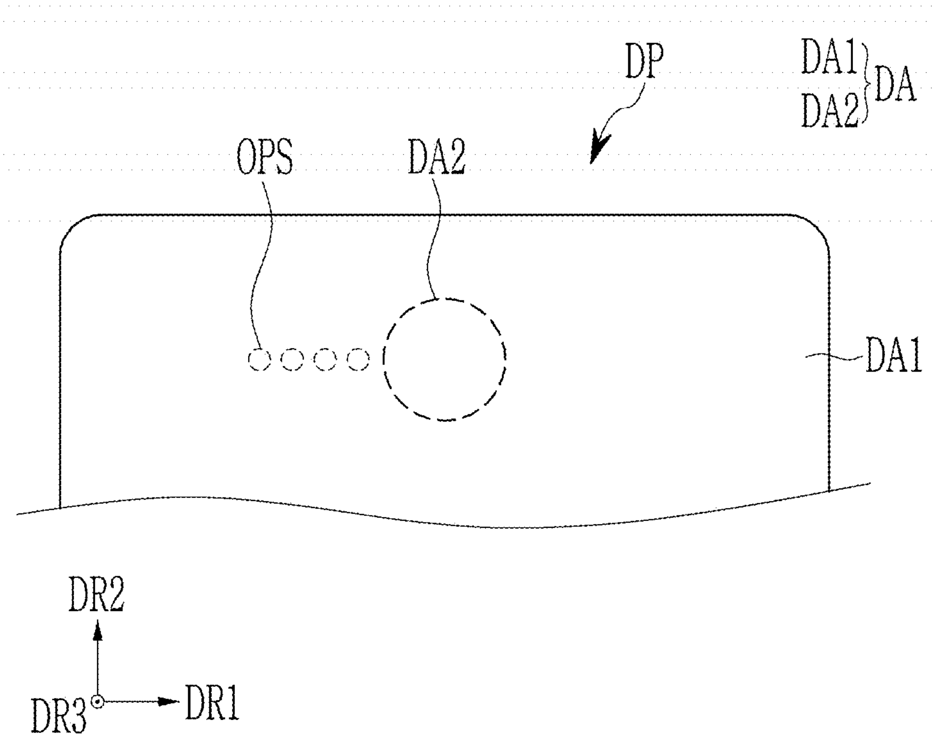
FIG. 9 is a top plan view that shows an enlarged part of the light emitting display device according to the embodiment.
Figure 10:
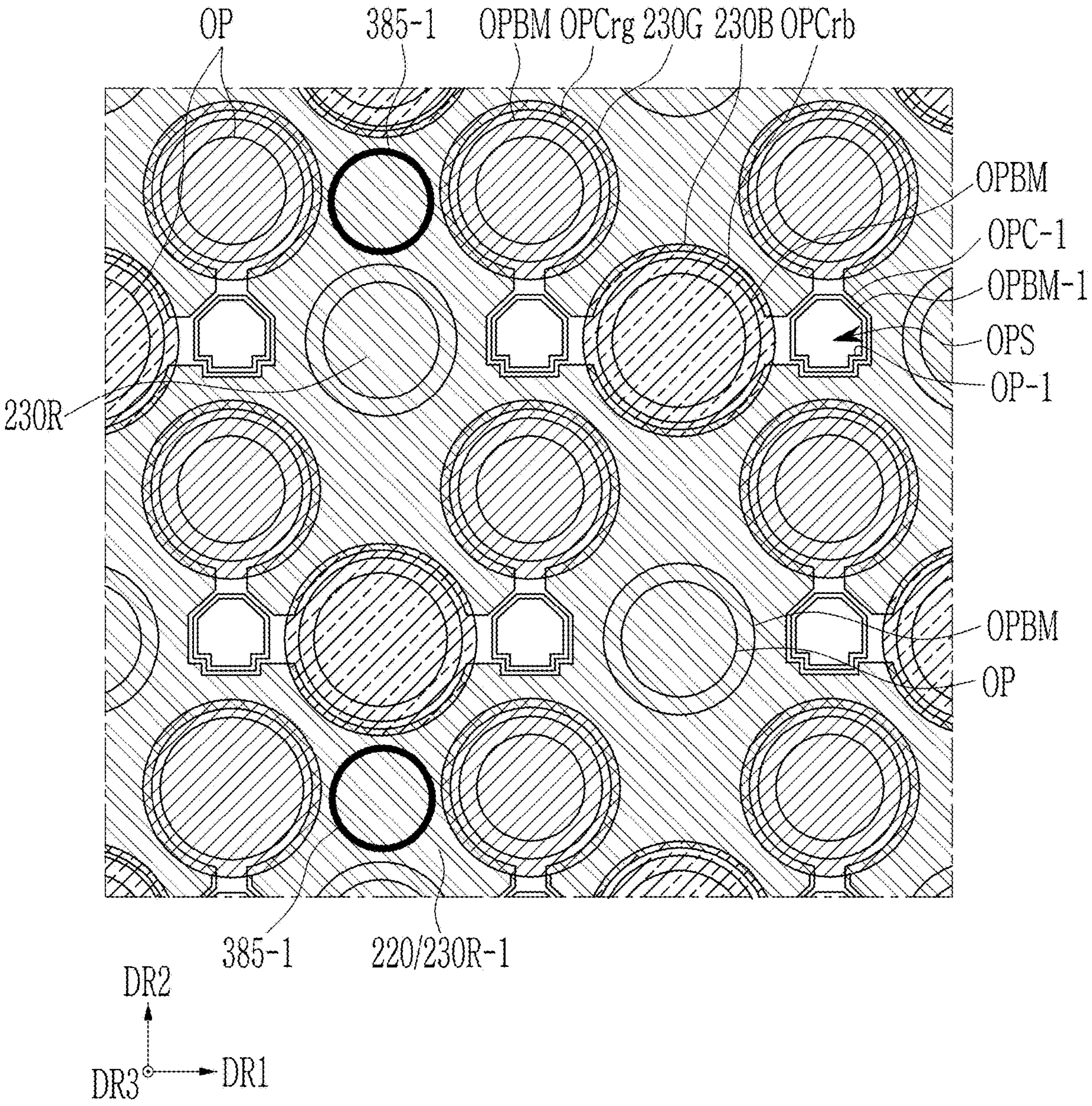
FIG. 10 is a top plan view of a part of an upper panel layer of a light emitting display device according to another embodiment.

Depending on embodiments, the light emitting display panel DP may have the structure of the upper panel layer such as the structure shown in FIG. 10 in a portion where the second element area OPS having the light transmissive area is formed as shown in FIG. 9.

Hereinafter, a structure of the light emitting display panel DP including the second element area OPS, hereinafter also referred to as an optical sensor area, and the upper panel layer will be described with reference to FIG. 9 and FIG. 10.

FIG. 9 is a top plan view that shows an enlarged part of the light emitting display device according to the embodiment.

In FIG. 9, a part of the light emitting display panel DP according to the embodiment is illustrated, and a display panel for a mobile phone is exemplarily illustrated.

The light emitting display panel DP has a display area DA disposed on the front side, and the display area DA is largely divided into a first display area DA1 (hereinafter also referred to as a main display area) and a first element area DA2. In the embodiment of FIG. 9, the second element area OPS is disposed in the first display area DA1 at a position that is adjacent to the first element area DA2. In the embodiment of FIG. 9, the second element area OPS is disposed at the left side of the first element area DA2. Referring to FIG. 9, the display area DA further include a second element area OPS disposed near the first element area DA2. In FIG. 9, the corresponding optical element for the first element area DA2 may be a camera, and the corresponding optical element for the second element area OPS may be an optical sensor. The second element area OPS may be made only by light transmitting parts, and may not display an image. In an embodiment, the second element area OPS and a pixel disposed adjacent to the second element area OPS may be called together as a third display area. The position and number of the second element areas OPS may vary for each embodiment.

In the first display area DA1, a plurality of light emitting diodes and a plurality of pixel circuit portions that generate and transmit a light emission current to each of the plurality of light emitting diodes are formed. Here, one light emitting diode and one pixel circuit portion are referred to as a pixel PX. In the first display area DA1, one pixel circuit portion and one light emitting diode are formed on a one-to-one basis. The first display area DA1 is hereinafter also referred to as a normal display area. In FIG. 9, a structure of the light emitting display panel DP below the cut line is not illustrated, and the first display area DA1 may be disposed below the cut line. Except for a region where the second element area OPS is located in the first display area DA1, the structure of the upper panel layer may be the same as the structure shown in FIG. 8.

The second element area OPS is formed only of a transparent layer to allow light to pass through and no conductive layer or semiconductor layer is disposed therein, and an opening (hereinafter referred to as an additional opening) is disposed at a position corresponding to the second element area OPS in the black pixel defining layer 380, the light blocking layer 220, and the color filter 230 to not block light.

The structure of the upper panel layer in the second element area OPS of the first display area DA1 will be described with reference to FIG. 10.

The first element area DA2 is a display area disposed on a front surface of an optical element, and has a structure in which a plurality of pixels are formed and a light transmissive area LTA is additionally formed between adjacent pixels. The first element area DA2 may be formed to have one unit structure by adding a plurality of pixels, and a light transmissive area LTA may be disposed between adjacent unit structures. A cross-section structure of the light transmissive area LTA will be described with reference to FIG. 25.

Although it is not illustrated in FIG. 9, a peripheral area PA may further be disposed at an outer side of the display area DA. In addition, in FIG. 9, a display panel for a mobile phone is illustrated, but the present embodiment may be applicable to any display panel where an optical element is disposed at a rear side of the display panel, and a flexible display device may be used. In the case of a foldable display device among flexible display devices, positions of the first element area DA2 and the second element area OPS may be different from the positions shown in FIG. 9.

Hereinafter, referring to FIG. 10, a structure of an upper panel layer in the second element area OPS in the first display area DA1 will be described.

FIG. 10 is a top plan view of a part of an upper panel layer of a light emitting display device according to another embodiment.

In FIG. 10, for clear illustration of a relationship between an upper panel layer and a lower panel layer, an opening OP of a black pixel defining layer 380 and a first portion 385-1 of a spacer 385 disposed in the lower panel layer are additionally illustrated.

Compared to FIG. 8, in FIG. 10, an additional opening OP-1 is formed in the black pixel defining layer 380 corresponding to the second element area OPS, an additional opening OPBM-1 is formed in the light blocking layer 220, and an additional opening OPC-1 is also formed in the red color filter 230R. The additional opening OPC-1 formed in the red color filter 230R extends from an opening OPCrg for the green pixel and an opening OPCrb for the blue pixel. That is, in the red color filter 230R, the opening OPCrg for the green pixel, the opening OPCrb for the blue pixel, and the additional opening OPC-1 are formed as a single opening. However, depending on embodiments, each opening of the red color filter 230R may be formed separately.

Figure 24:
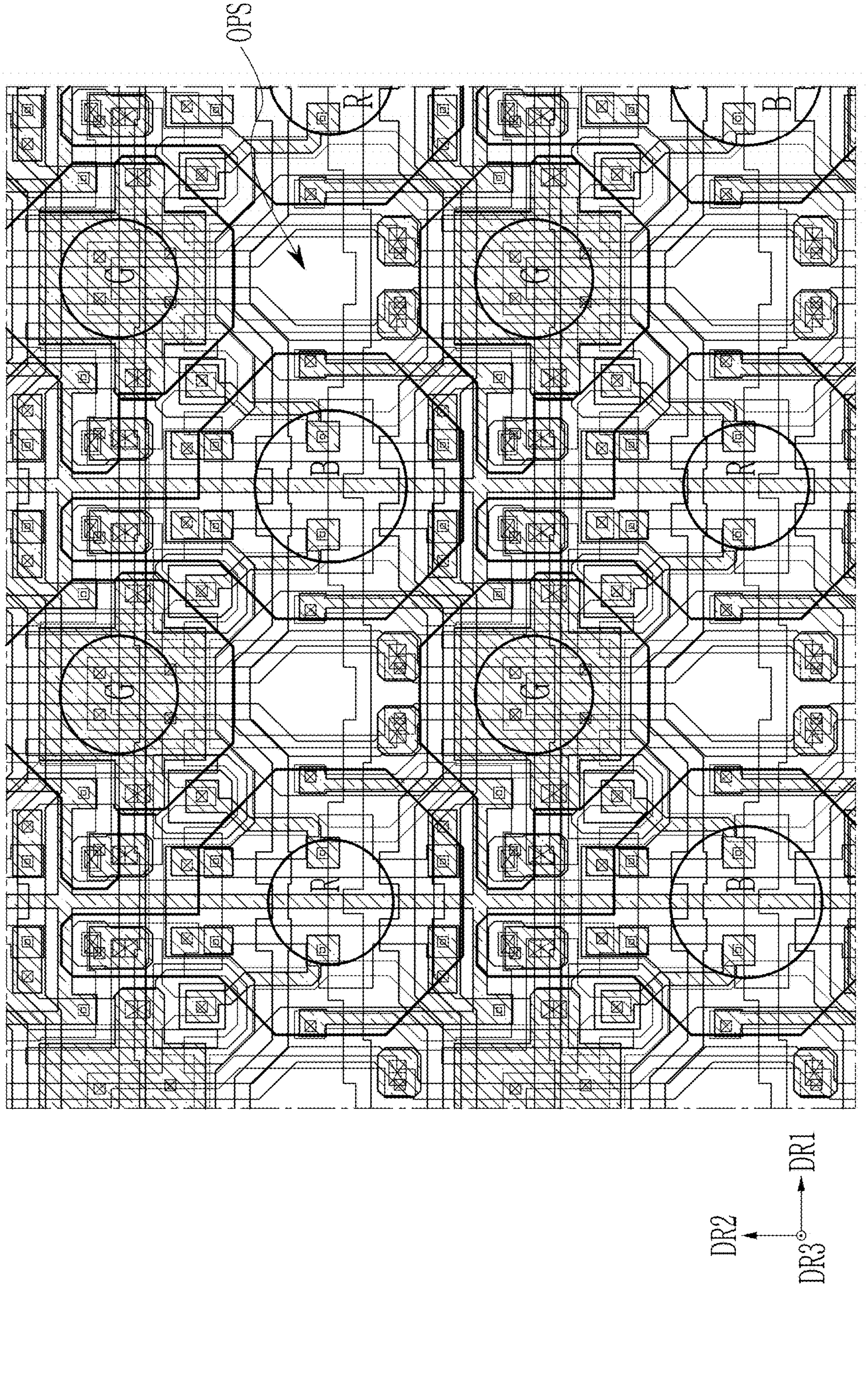

A structure that blocks light is not formed in the second element area OPS of the upper panel layer due to the additional opening OPBM-1 of the light blocking layer 220 and the additional opening OPC-1 of the red color filter 230R. In addition, as shown in FIG. 24, a conductive layer or a semiconductor layer are not formed in the second element area OPS in the lower panel layer. As a result, although a photosensor (including an infrared sensor and the like) is disposed on the rear surface of the light emitting display device DP, the front surface of the light emitting display panel DP can be sensed with light.

Referring to FIG. 10, the position of the first portion 385-1 of the spacer 385 is illustrated, and it is formed at a position overlapping the light blocking layer 220 and the overlapping portion 230R-1 of the red color filter 230R on a plane, and may not overlap the second element area OPS. However, the black pixel defining layer 380 is disposed above the first portion 381-5 of the spacer 385 with reference to the third direction DR3, but is disposed lower than the light blocking layer 220 or the overlapping portion 230R-1 of the red color filter 230R with reference to the third direction DR3.

Hereinafter, a structure of the pixel disposed in the lower panel layer of the light emitting display panel DP will be described in detail with reference to FIG. 11 to FIG. 25. The following pixel structure may be a pixel structure of the first display area DA1 and/or the first element area DA2 including the second element area OPS.

First, a circuit structure of the pixel will be described with reference to FIG. 11.

Figure 11:
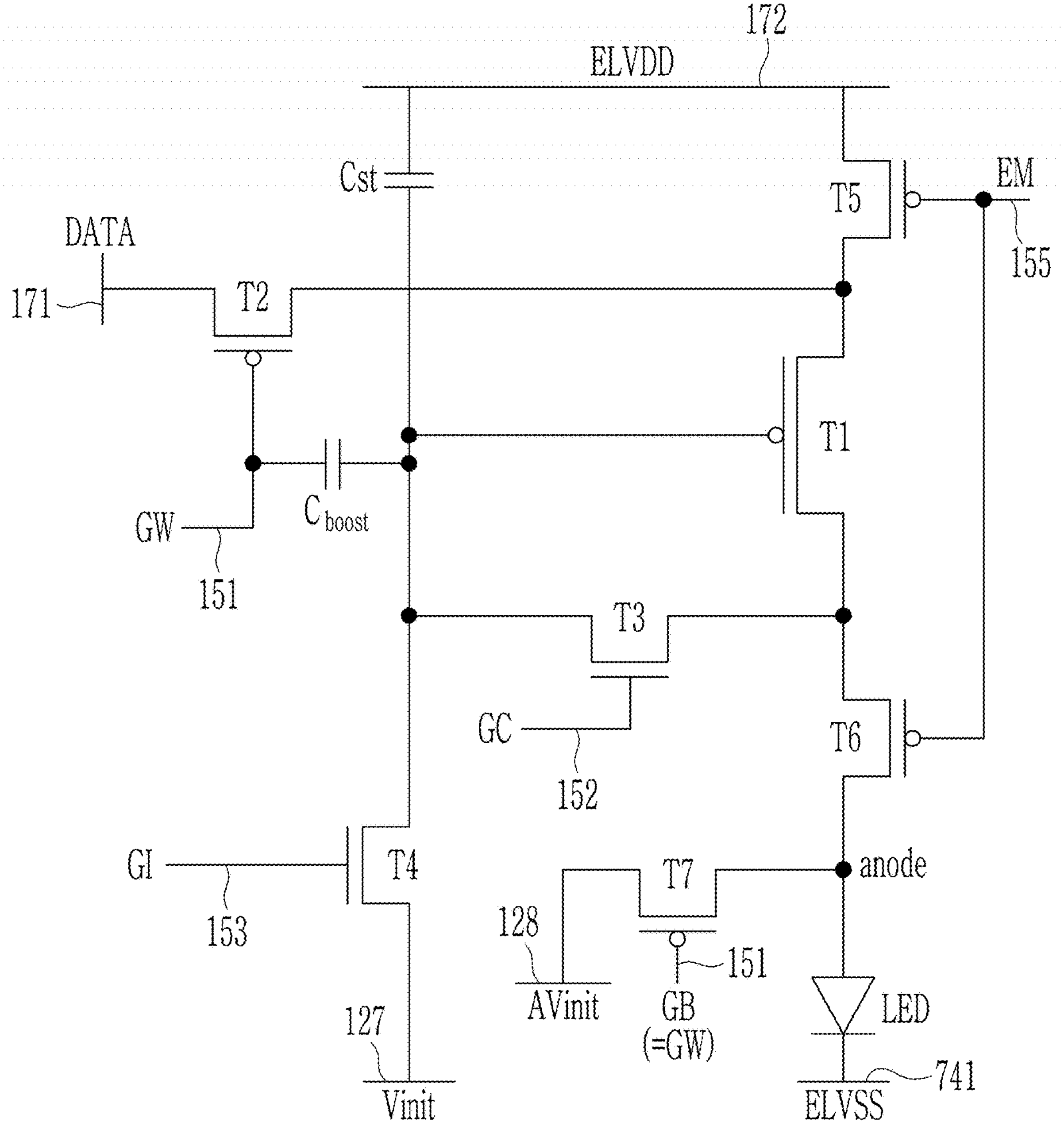
FIG. 11 is a circuit diagram of a pixel included in the light emitting display device according to the embodiment.

FIG. 11 is a circuit diagram of a pixel included in the light emitting display device according to the embodiment.

The circuit structure illustrated in FIG. 11 is a circuit structure of a pixel circuit portion and the light emitting diode formed in the first display area DA1 and the first element area DA2.

The pixel according to the embodiment includes a plurality of transistors T1, T2, T3, T4, T5, T6, and T7 connected to a plurality of wires 127, 128, 151, 152, 153, 155, 171, 172, and 741, a storage capacitor Cst, a boost capacitor $C_{boost}$, and a light emitting diode LED. Here, the transistors and the capacitors, excluding the light emitting diode LED, form a pixel circuit portion. Depending on embodiments, the boost capacitor $C_{boost}$ may be omitted.

Each pixel PX is connected with the plurality of wires 127, 128, 151, 152, 153, 155, 171, 172, and 741. The plurality of wires include a first initialization voltage line 127, a second initialization voltage line 128, a first scan line 151, a second scan line 152, an initialization control line 153, a light emission control line 155, a data line 171, a driving voltage line 172, and a common voltage line 741. The first scan line 151 connected with a seventh transistor T7 is also connected with a second transistor T2, but depending on embodiments, the seventh transistor T7 may be connected through a separate bypass control line.

The first scan line 151 is connected to a scan driver (not shown) and transmits a first scan signal GW to the second transistor T2 and the seventh transistor T7. The second scan line 152 may be applied with a voltage of the opposite polarity of a voltage applied to the first scan line 151 at the same timing of the signal of the first scan line 151. For example, when a negative voltage is applied to the first scan line 151, a positive voltage may be applied to the second scan line 152. The second scan line 152 transmits a second scan signal GC to a third transistor T3. The initialization control line 153 transmits an initialization control signal GI to a fourth transistor T4. The light emission control line 155 transmits a light emission control signal EM to a fifth transistor T5 and a sixth transistor T6.

The data line 171 is a wire that transmits a data voltage DATA generated in a data driver, and intensity of a light emitting current transmitted to the light emitting diode LED is changed according to the data voltage DATA such that luminance of the light emitting diode LED is changed. The driving voltage line 172 applies a driving voltage ELVDD. The first initialization voltage line 127 transmits a first initialization voltage Vint, and the second initialization voltage line 128 transmits a second initialization voltage AVint. The common voltage line 741 applies a common voltage ELVSS to a cathode of the light emitting diode LED. In the present embodiment, the voltages applied to the driving voltage line 172, the first and second initialization voltage lines 127 and 128, and the common voltage line 741 may each be a constant voltage.

A driving transistor T1 (also called a first transistor) is a p-type transistor, and includes a silicon semiconductor as a semiconductor layer. The driving transistor T1 is a transistor that controls intensity of a light emitting current output to the anode of the light emitting diode LED according to a magnitude of a voltage (i.e., a voltage stored in the storage capacitor Cst) of a gate electrode of the driving transistor T1. Since the brightness of the light emitting diode LED is adjusted according to the intensity of the light emitting current output to the anode of the light emitting diode LED, the light emitting luminance of the light emitting diode LED can be adjusted according to the data voltage DATA applied to the pixel. To this end, a first electrode of the driving transistor T1 is disposed to be able to receive the driving voltage ELVDD, and thus is connected with the driving voltage line 172 via the fifth transistor T5. In addition, the first electrode of the driving transistor T1 is also connected with a second electrode of the second transistor T2 and thus receives the data voltage DATA. A second electrode of the driving transistor T1 outputs a light emitting current to the light emitting diode LED and is connected with the anode of the light emitting diode LED via the sixth transistor T6 (also called an output control transistor). In addition, the second electrode of the driving transistor T1 is also connected with the third transistor T3 and thus transmits the data voltage DATA applied to the first electrode to the third transistor T3. The gate electrode of the driving transistor T1 is connected with one electrode (hereinafter referred to as a second storage electrode) of the storage capacitor Cst. Thus, the voltage of the gate electrode of the driving transistor T1 is changed according to the voltage stored in the storage capacitor Cst, and accordingly, the light emitting current output from the driving transistor T1 is changed. The storage capacitor Cst serves to maintain the voltage of the gate electrode of the driving transistor T1 to be constant for one frame. The gate electrode of the driving transistor T1 is also connected with the third transistor T3 such that the data voltage DATA applied to the first electrode of the driving transistor T3 can be transmitted to the gate electrode of the driving transistor T1 via the third transistor T3. The gate electrode of the driving transistor T1 may also be connected with the fourth transistor T4 and may be initialized by receiving the first initialization voltage Vint.

The second transistor T2 is a p-type transistor, and includes a silicon semiconductor as a semiconductor layer. The second transistor T2 is a transistor that receives the data voltage DATA into the pixel. A gate electrode of the second transistor T2 is connected with the first scan line 151 and one electrode (hereinafter referred to as a lower boost electrode of the boost capacitor $C_{boost}$. A first electrode of the second transistor T2 is connected with the data line 171. A second electrode of the second transistor T2 is connected with the first electrode of the driving transistor T1. When the second transistor T2 is turned on by a negative voltage of the first scan signal GW transmitted through the first scan line 151, the data voltage DATA transmitted through the data line 171 is transmitted to the first electrode of the driving transistor T1 and then transmitted to the gate electrode of the driving transistor T1 and stored in the storage capacitor Cst.

The third transistor T3 is an n-type transistor, and includes an oxide semiconductor as a semiconductor layer. The third transistor T3 electrically connects the second electrode of the driving transistor T1 and the gate electrode of the driving transistor T1. As a result, a data voltage DATA, after being compensated by a threshold voltage of the driving transistor T1, is stored in a second storage electrode of the storage capacitor Cst by the third transistor T3. A gate electrode of the third transistor T3 is connected with the second scan line 152, and a first electrode of the third transistor T3 is connected with the second electrode of the driving transistor T1. A second electrode of the third transistor T3 is connected with the second storage electrode of the storage capacitor Cst, the gate electrode of the driving transistor T1, and the other electrode (hereinafter referred to as an upper boost electrode) of the boost capacitor $C_{boost}$. The third transistor T3 is turned on by a positive voltage of the second scan signal GC transmitted through the second scan line 152, and thus connects the gate electrode and the second electrode of the driving transistor T1, and transmits the voltage applied to the gate electrode of the driving transistor T1 to the second storage electrode of the storage capacitor Cst and stores the voltage in the storage capacitor Cst. In this case, the voltage storage in the storage capacitor Cst is a voltage of the gate electrode of the driving transistor T1 when the driving transistor T1 is turned off, and is stored in a state that a value of a threshold voltage Vth of the driving transistor T1 is compensated.

The fourth transistor T4 is an n-type transistor, and includes an oxide semiconductor as a semiconductor layer. The fourth transistor T4 serves to initialize the gate electrode of the driving transistor T1 and the second storage electrode of the storage capacitor Cst. A gate electrode of the fourth transistor T4 is connected with the initialization control line 153, and a first electrode of the fourth transistor T4 is connected with the first initialization voltage line 127. A second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by a positive voltage of the initialization control line GI transmitted through the initialization control line 153, and transmits the first initialization voltage Vint to the gate electrode of the driving transistor T1, the second electrode of the storage capacitor Cst, and the upper boost electrode of the boost capacitor $C_{boost}$ for initialization.

The fifth transistor T5 and the sixth transistor T6 are p-type transistors, and each includes a silicon semiconductor as a semiconductor layer.

The fifth transistor T5 serves to transmit the driving voltage ELVDD to the driving transistor T1. A gate electrode of the fifth transistor T5 is connected with the light emission control line 155, a first electrode of the fifth transistor T5 is connected with the driving voltage line 172, and a second electrode of the fifth transistor T5 is connected with the first electrode of the driving transistor T1.

The sixth transistor T6 serves to transmit the light emitting current output from the driving transistor T1 to the light emitting diode LED. A gate electrode of the sixth transistor T6 is connected with the light emission control line 155, a first electrode of the sixth transistor T6 is connected with the second electrode of the driving transistor T1, and a second electrode of the sixth transistor T6 is connected with the anode of the light emitting diode LED.

The seventh transistor T7 is a p-type transistor, and includes a silicon semiconductor or an oxide semiconductor as a semiconductor layer. The seventh transistor T7 serves to initialize the anode of the light emitting diode LED. A gate electrode of the seventh transistor T7 is connected with the first scan line 151, a first electrode of the seventh transistor T7 is connected with the anode of the light emitting diode LED, and a second electrode of the seventh transistor T7 is connected with the second initialization voltage line 128. When the seventh transistor T7 is turned on by a negative voltage of the first scan line 151, the second initialization voltage AVint is applied to the anode of the light emitting diode LED and thus the anode of the light emitting diode LED is initialized. The gate electrode of the seventh transistor T7 is connected with a separate bypass control line and thus may be controlled by a separate wire than the first scan line 151. In addition, the second initialization voltage line 128 applied with the second initialization voltage AVint and the first initialization voltage line 127 applied with the first initialization voltage Vint may be equivalent to each other depending on embodiments.

It has been described that one pixel PX includes seven transistors (T1 to T7) and two capacitors (storage capacitor Cst and boost capacitor $C_{boost}$), but this is not restrictive, and the boost capacitor $C_{boost}$ may be omitted depending on embodiments. In addition, the third transistor and the fourth transistor are formed as n-type transistors, but only one of the two transistors may be formed as an n-type transistor, or the other transistor may be formed as an n-type transistor.

Hereinabove, the circuit structure of the pixel formed in the display area DA was described with reference to FIG. 11.

Hereinafter, referring to FIG. 12 to FIG. 25, a detailed planar structure of the pixel formed in the display area DA and a layered structure of the light transmissive area LTA will be described.

First, referring to FIG. 12 to FIG. 24, a planar structure of each layer according to a manufacturing process will be described. The pixel structure illustrated herein may be a pixel structure of the first display area DA1 and/or first element area DA2 including the second element area OPS.

FIG. 12 to FIG. 24 illustrate a structure of each layer according to a manufacturing process of the lower panel layer of the light emitting display device according to the embodiment.

Figure 12:
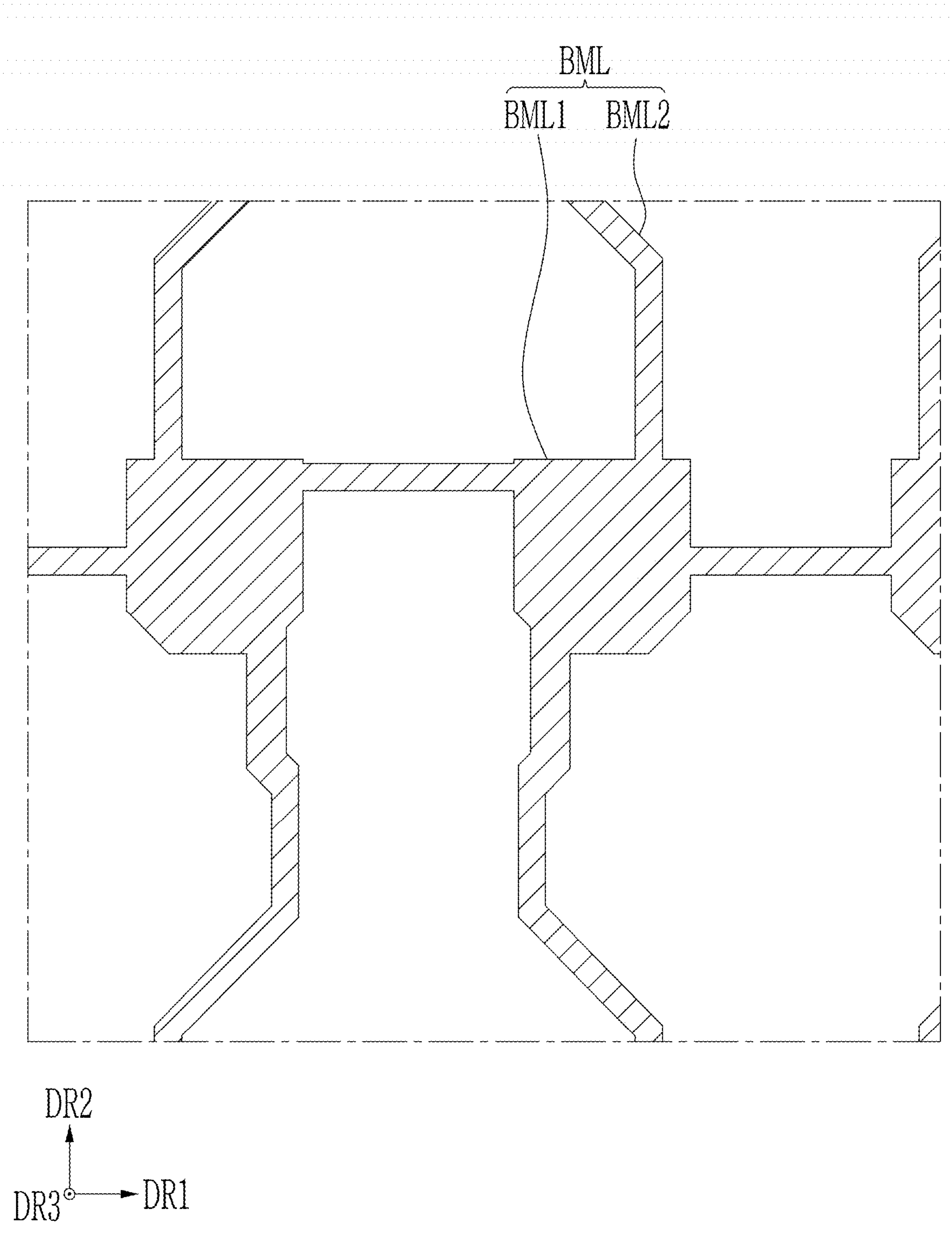
FIGS. 12, 13, 14, 15, 16, 17, 18, 19, 20, 21, 22, 23, and 24 illustrate a structure of each layer according to a manufacturing process of the lower panel layer of the light emitting display device according to the embodiment.

Referring to FIG. 12, a metal layer BML is disposed on the substrate 110.

The substrate 110 may include a material having a rigid characteristic such as glass and the like and thus not being bendable, or a flexible material that can be bent such as plastic or polyimide. In case of the flexible substrate, as shown in FIG. 25, the substrate 110 may have a two-layer structure of polyimide and a barrier layer formed of an inorganic insulating material thereon.

The metal layer BML includes a plurality of expansion portions BML1 and a connection portion BML2 that connects the plurality of expansion portions BML1 to each other. The expansion portion BML1 of the metal layer BML may be formed at a position that overlaps a channel 1132 of the driving transistor T1 among a first semiconductor layer, which will be described later, on a plane. The metal layer BML is also called a lower shielding layer, and may include a metal such as copper (Cu), molybdenum (Mo), aluminum (Al), titanium (Ti), and the like and may additionally include amorphous silicon, and may be formed of a single layer or multiple layers.

Figure 25:
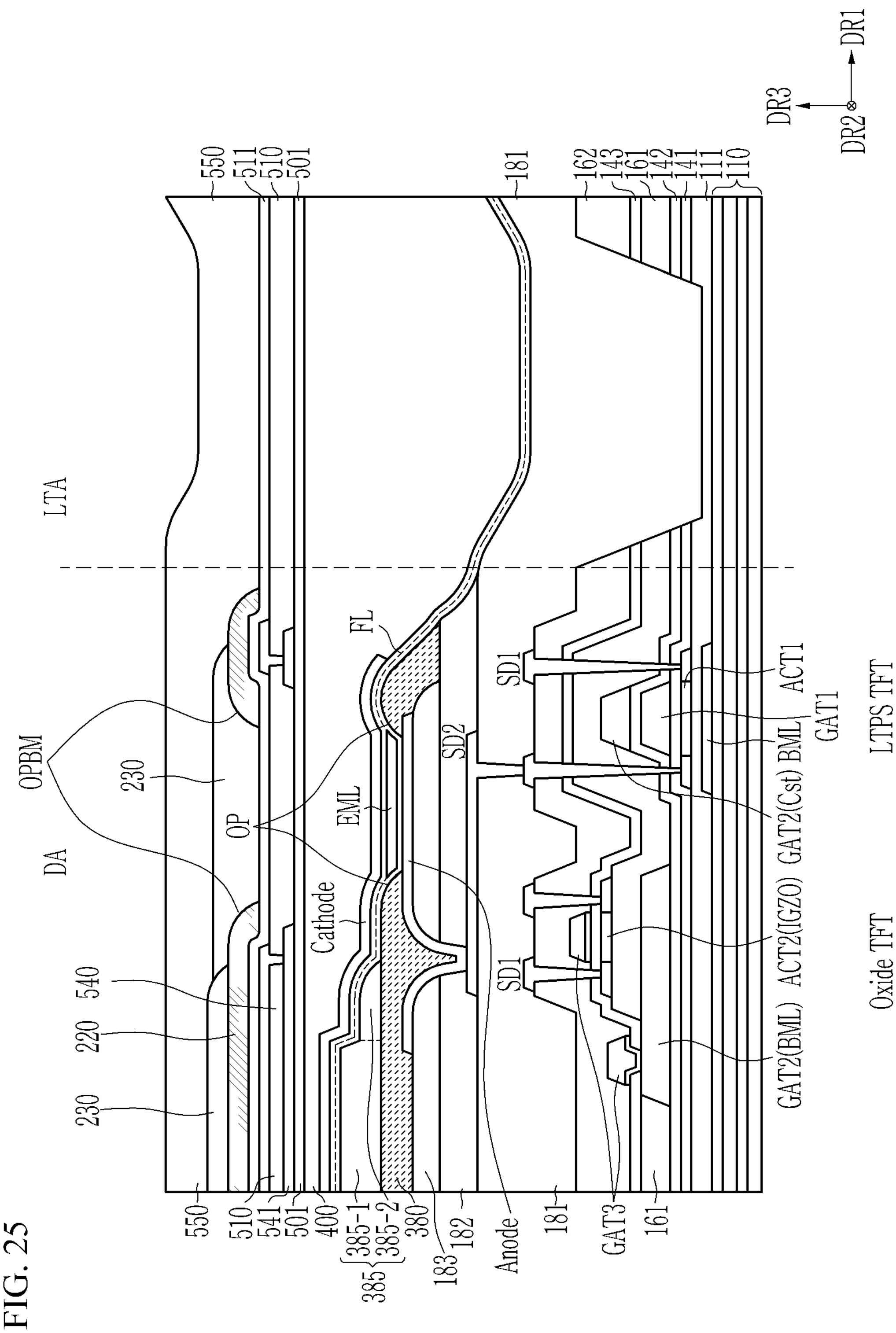
FIG. 25 is a cross-sectional view of the light emitting display device according to the embodiment.

Referring to FIG. 25, a buffer layer 111 is disposed on the substrate 110 and the metal layer BML, while covering the substrate 110 and the metal layer BML. The buffer layer 111 serves to prevent permeation of an impurity element to the first semiconductor layer 130, and may be an inorganic insulating layer including a silicon oxide ($SiO_X$), a silicon nitride ($SiN_X$), a silicon oxynitride ($SiO_XN_Y$), and the like.

Figure 13:
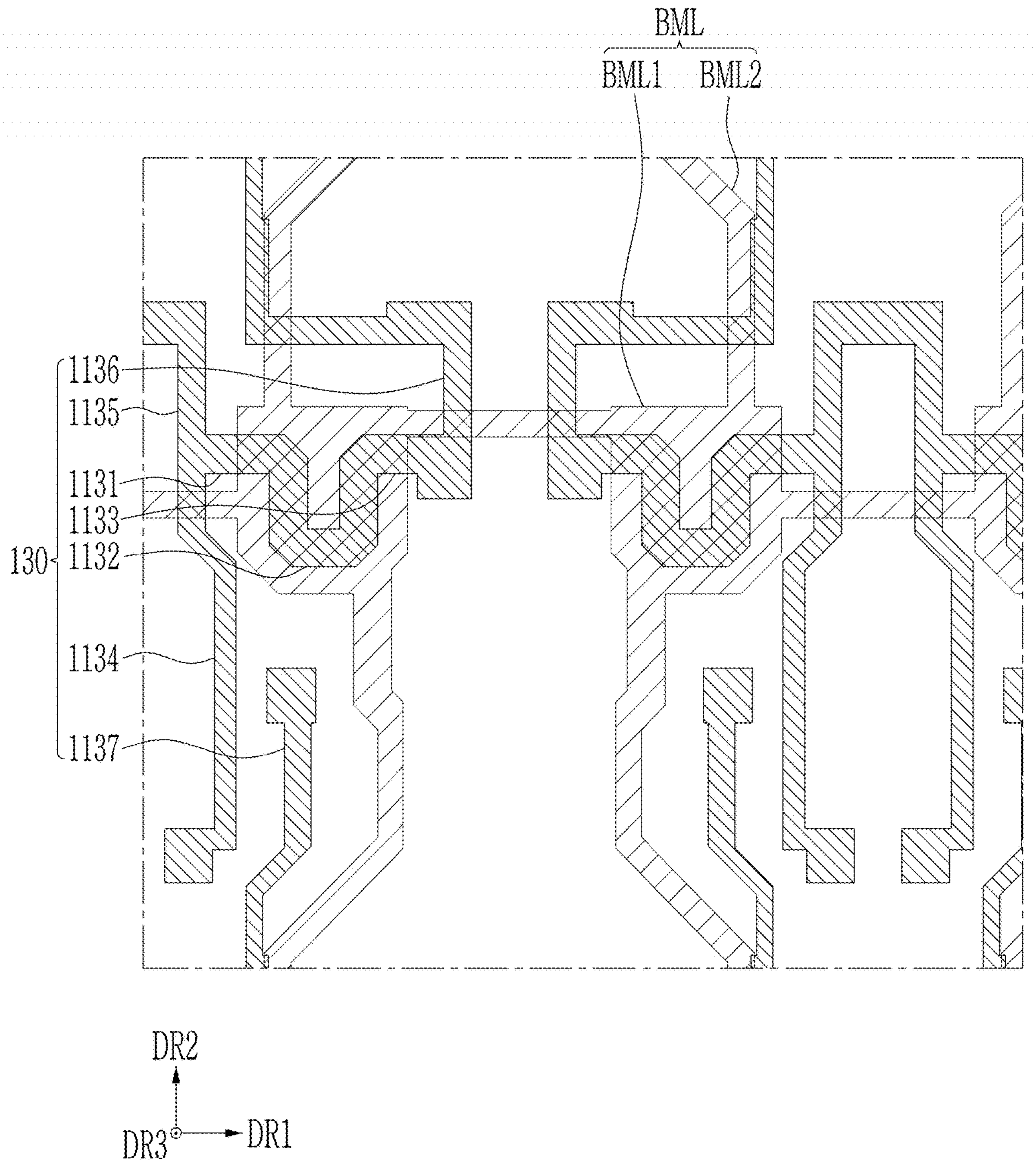

As shown in FIG. 13, the first semiconductor layer 130 formed of a silicon semiconductor (e.g., a polycrystalline semiconductor) is disposed on the buffer layer 111. The first semiconductor layer 130 includes the channel 1132, a first area 1131, and a second area 1133 of the driving transistor T1. In addition, the first semiconductor layer 130 includes not only the channel of the driving transistor T1 but also channels of the second transistor T2, the fifth transistor T5, the sixth transistor T6, and the seventh transistor T7, and includes a region having a conductive layer characteristic provided on both sides of each channel by plasma treatment or doping to serve as the first electrode and the second electrode.

The channel 1132 of the driving transistor T1 may have a curved shape on a plane. However, the shape of channel 1132 of the driving transistor T1 is not limited thereto, and may be variously changed. For example, the channel 1132 of the driving transistor T1 may be bent into a different shape or may have a bar shape. The first area 1131 and the second area 1133 of the driving transistor T1 may be disposed on both sides of the channel 1132 of the driving transistor T1. The first area 1131 and the second area 1133 disposed in the first semiconductor layer serve as the first electrode and the second electrode of the driving transistor T1.

In the first semiconductor layer 130, a channel, a first area, and a second area of the second transistor T2 are disposed in a portion 1134 extending downward from the first area 1131 of the driving transistor T1. A channel, a first area, and a second area of the fifth transistor T5 are disposed in a portion 1135 extending upward from the first area 1131 of the driving transistor T1. A channel, a first area, and a second area of the sixth transistor T6 are disposed in a portion 1136 extending upward from the second area 1133 of the driving transistor T1. A channel, a first area, and a second area of the seventh transistor T7 are disposed in a portion 1137 that is further extended while being bent at the portion 1136 of the first semiconductor layer 130.

Referring to FIG. 25, a first gate insulating layer 141 may be disposed on the first semiconductor layer 130 that includes the channel 1132, the first area 1131, and the second area 1133 of the driving transistor T1. The first gate insulating layer 141 may be an inorganic insulating layer including a silicon oxide ($SiO_X$), a silicon nitride ($SiN_X$), a silicon oxynitride ($SiO_XN_Y$), and the like.

Figure 14:
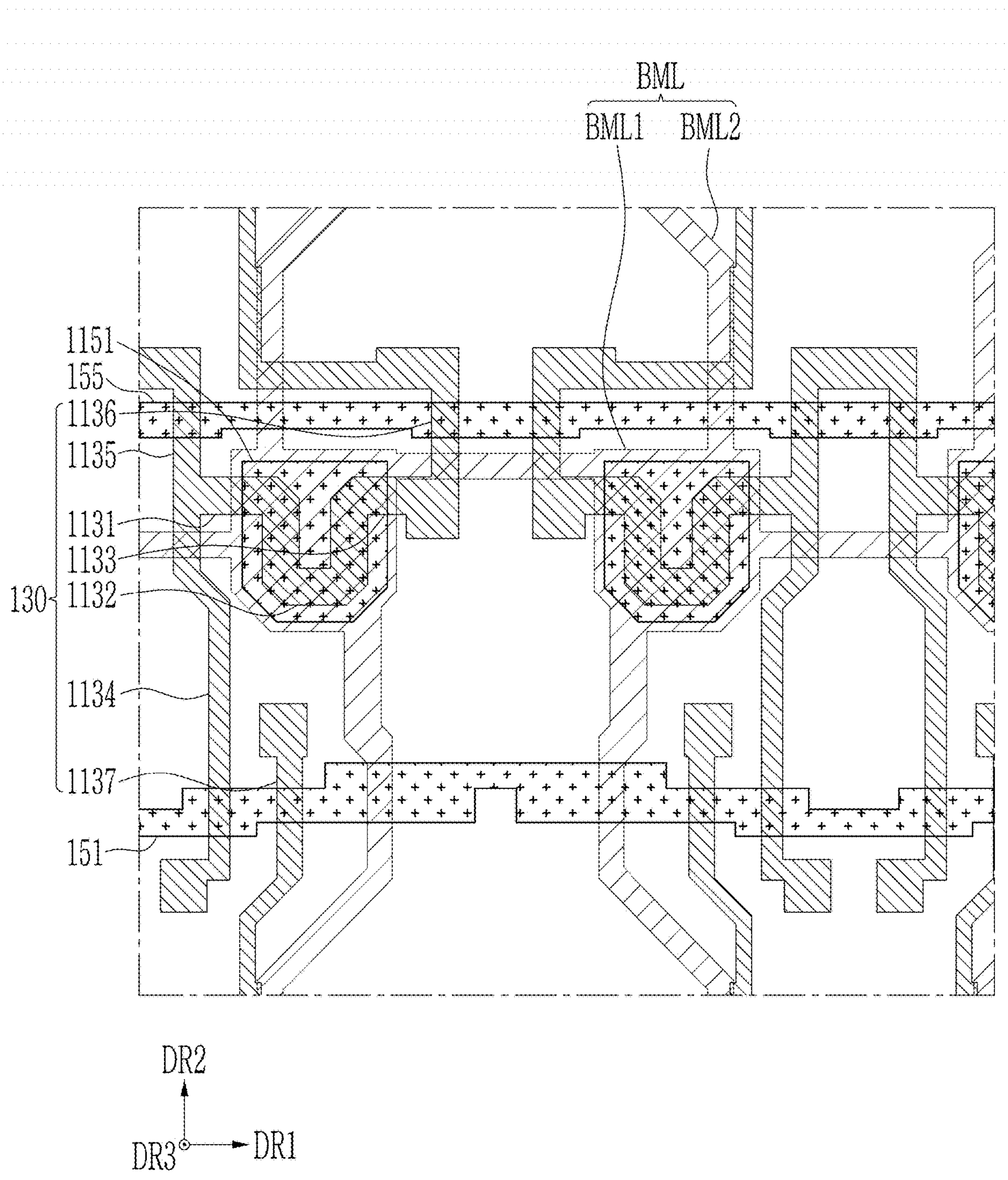

Referring to FIG. 14, a first gate conductive layer including a gate electrode 1151 of the driving transistor T1 may be disposed on the first gate insulating layer 141. The first gate conductive layer includes not only the gate electrode of the driving transistor T1 but also a gate electrode of each of the second transistor T2, the fifth transistor T5, the sixth transistor T6, and the seventh transistor T7. The gate electrode 1151 of the driving transistor T1 may overlap the channel 1132 of the driving transistor T1. The channel 1132 of the driving transistor T1 is covered by the gate electrode 1151 of the driving transistor T1.

The first gate conductive layer may further include the first scan line 151 and the light emission control line 155. The first scan line 151 and the light emission control line 155 may extend substantially in a horizontal direction (hereinafter also referred to as a first direction). The first scan line 151 may be connected with the gate electrode of the second transistor T2. The first scan line 151 may be integrally formed with the gate electrode of the second transistor T2. The first scan line 151 is also connected to a gate electrode of a seventh transistor T7 in the next pixel.

The light emission control line 155 may be connected with the gate electrode of the fifth transistor T5 and the gate electrode of the sixth transistor T6, and the light emission control line 155 and the gate electrodes of the fifth transistor T5 and sixth transistor T6 may be integrally formed.

The first gate conductive layer may include a metal such as copper (Cu), molybdenum (Mo), aluminum (Al), titanium (Ti), and the like, and may be formed of a single layer or multiple layers.

After forming the first gate conductive layer including the gate electrode 1151 of the driving transistor T1, a plasma treatment or doping process is carried out to make an exposed portion of the first semiconductor layer be conductive. That is, the first semiconductor layer covered by the first gate conductive layer does not become conductive, and a portion of the first semiconductor layer, not covered by the first gate conductive layer, may have the same characteristic as a conductive layer. Thus, the transistor including the conductive portion has a p-type transistor characteristic, and the driving transistor T1, the second transistor T2, the fifth transistor T5, the sixth transistor T6, and the seventh transistor T7 may be p-type or n-type transistors.

Referring to FIG. 25, a second gate insulating layer 142 may be disposed on the first gate conductive layer including the gate electrode 1151 of the driving transistor T1 and the first gate insulating layer 141. The second gate insulating layer 142 may be an inorganic insulating layer including a silicon oxide ($SiO_X$), a silicon nitride ($SiN_X$), a silicon oxynitride ($SiO_XN_Y$), and the like.

Figure 15:
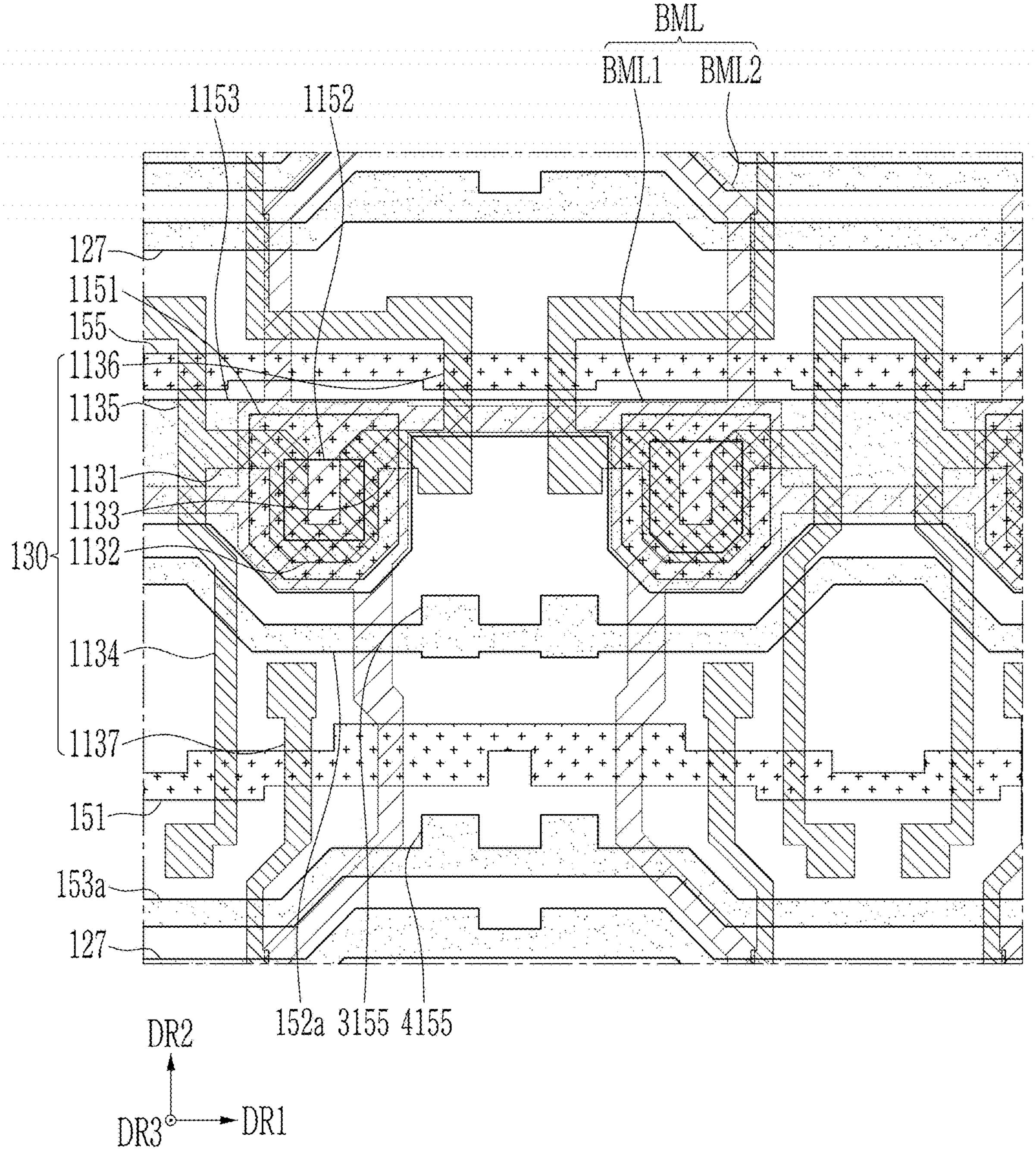

Referring to FIG. 15, a second gate conductive layer including a first storage electrode 1153 of the storage capacitor Cst, a lower shielding layer 3155 of the third transistor T3, and a lower shielding layer 4155 of the fourth transistor T4 is formed on the second gate insulating layer 142. The lower shielding layers 3155 and 4155 are disposed in a lower portion of the channels of the third transistor T3 and the fourth transistor T4 to serve to shield from light or electromagnetic interference provided to the channel from the lower side.

The first storage electrode 1153 overlaps the gate electrode 1151 of the driving transistor T1 to form a storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The first storage electrode 1153 is extended in the horizontal direction (first direction) and is connected to the adjacent first storage electrode 1153.

The lower shielding layer 3155 of the third transistor T3 may overlap a gate electrode 3151 of the third transistor T3. The lower shielding layer 4155 of the fourth transistor T4 may overlap a channel 4137 and a gate electrode 4151 of the fourth transistor T4.

The second gate conductive layer may further include a lower second scan line 152*a*, a lower initialization control line 153*a*, and a first initialization voltage line 127. The lower second scan line 152*a*, the lower initialization control line 153*a*, and the first initialization voltage line 127 may extend substantially in the horizontal direction (first direction). The lower second scan line 152*a* may be connected with the lower shielding layer 3155 of the third transistor T3. The lower second scan line 152*a* may be integrally formed with the lower shielding layer 3155 of the third transistor T3. The lower initialization control line 153*a* may be connected with the lower shielding layer 4155 of the fourth transistor T4. The lower initialization control line 153*a* may be integrally formed with the lower shielding layer 4155 of the fourth transistor T4.

The second gate conductive layer GAT2 may include a metal such as copper (Cu), molybdenum (Mo), aluminum (Al), titanium (Ti), and the like, and may be formed of a single layer or multiple layers.

Referring to FIG. 25, a first interlayer insulating layer 161 may be disposed on the second gate conductive layer that includes the first storage electrode 1153 of the storage capacitor Cst, the lower shielding layer 3155 of the third transistor T3, and the lower shielding layer 4155 of the fourth transistor T4. The first interlayer insulating layer 161 may include an inorganic insulating layer including a silicon oxide ($SiO_X$), a silicon nitride ($SiN_X$), a silicon oxynitride ($SiO_XN_Y$), and the like, and an inorganic insulating material may be formed to be thick depending on embodiments.

Figure 16:
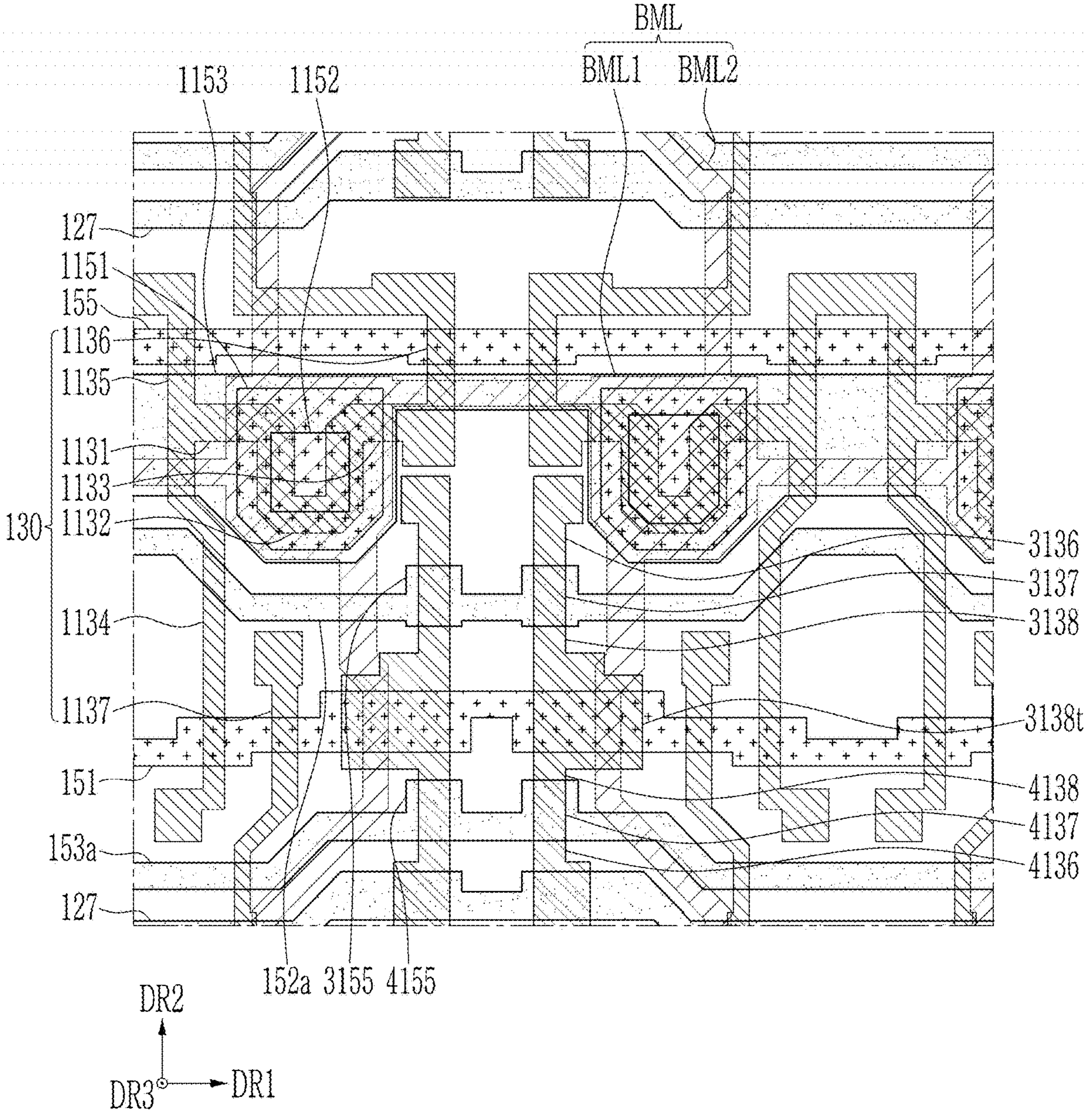

Referring to FIG. 16, an oxide semiconductor layer including the channel 3137, the first area 3136, and the second area 3138 of the third transistor T3, and a channel 4137, a first area 4136, and a second area 4138 of the fourth transistor T4, may be disposed on the first interlayer insulating layer 161. In addition, the oxide semiconductor layer may include an upper boost electrode 3138*t* of the capacitor $C_{boost}$.

The channel 3137, the first area 3136, and the second area 3138 of the third transistor T3, and the channel 4137, the first area 4136, and the second area 4138 of the fourth transistor T4, may be connected to each other and thus may be integrally formed with each other. The first area 3136 and the second area 3138 are disposed at opposite sides of the third transistor T3, and the first area 4136 and the second area 4138 of the fourth transistor T4 are disposed at opposite sides of the channel 4137 of the fourth transistor T4. The second area 3138 of the third transistor T3 is connected to the second area 4138 of the fourth transistor T4. The channel 3137 of the third transistor T3 overlaps the lower shielding layer 3155, and the channel 4137 of the fourth transistor T4 overlaps the lower shielding layer 4155.

The upper boost electrode 3138*t* of the capacitor $C_{boost}$ is disposed between the second area 3138 of the third transistor T3 and the second area 4138 of the fourth transistor T4. The upper boost electrode 3138*t* of the boost capacitor $C_{boost}$ overlaps a part of the first scan line 151 (also referred to as a lower boost electrode of the boost capacitor $C_{boost}$) such that the boost capacitor $C_{boost}$ is formed.

Referring to FIG. 25, a third gate insulating layer 143 may be disposed on the oxide semiconductor layer that includes the channel 3137, the first area 3136, and the second area 3138 of the third transistor T3, the channel 4137, the first area 4136, and the second area 4138 of the fourth transistor T4, and the upper boost electrode 3138*t* of the boost capacitor $C_{boost}$.

The third gate insulating layer 143 may be disposed over all of the oxide semiconductor layer and the first interlayer insulating layer 161. Thus, the third gate insulating layer 143 may cover top and side surfaces of the channel 3137, the first area 3136, and the second area 3138 of the third transistor T3, the channel 4137, the first area 4136, and the second area 4138 of the fourth transistor T4, and the upper boost electrode 3138*t* of the boost capacitor $C_{boost}$. However, the inventive concepts are not limited thereto, and the third gate insulating layer 143 may not be disposed over all of the oxide semiconductor layer and the first interlayer insulating layer 161. For example, the third gate insulating layer 143 may overlap the channel 3137 of the third transistor T3, and may not overlap the first area 3136 and the second area 3138. In addition, the third gate insulating layer 143 may overlap the channel 4137 of the fourth transistor T4, and may not overlap the first area 4136 and the second area 4138.

The third gate insulating layer 143 may include an inorganic insulating layer including a silicon oxide ($SiO_X$), a silicon nitride ($SiN_X$), a silicon oxynitride ($SiO_XN_Y$), and the like.

Figure 17:
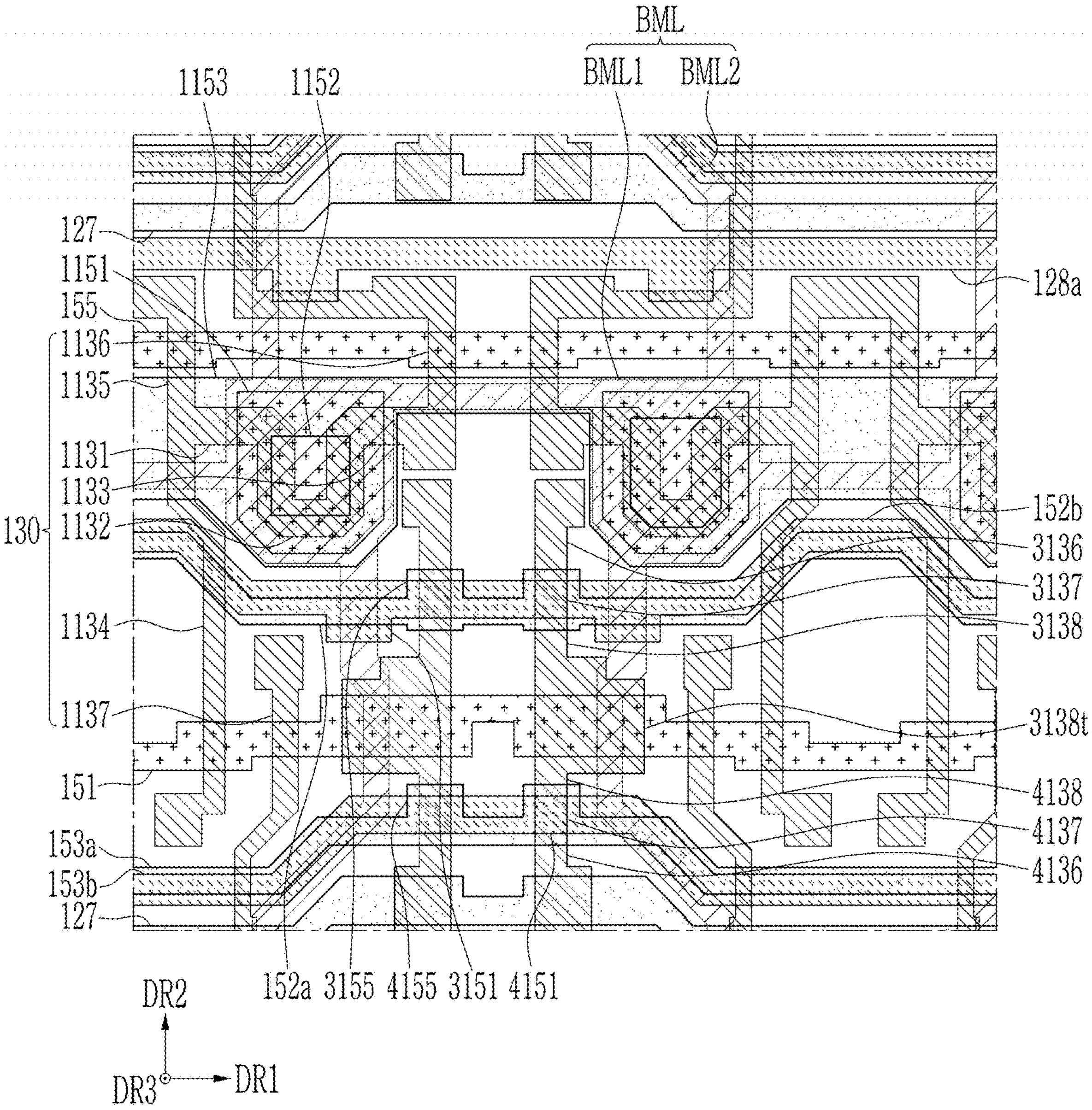

Referring to FIG. 17, a third gate conductive layer including the gate electrode 3151 of the third transistor T3 and the gate electrode 4151 of the fourth transistor T4 may be disposed on the third gate insulating layer 143.

The gate electrode 3151 of the third transistor T3 may overlap the channel 3137 of the third transistor T3. The gate electrode 3151 of the third transistor T3 may overlap the lower shielding layer 3155 of the third transistor T3.

The gate electrode 4151 of the fourth transistor T4 may overlap the channel 4137 of the fourth transistor T4. The gate electrode 4151 of the fourth transistor T4 may overlap the lower shielding layer 4155 of the fourth transistor T4.

The third gate conductive layer may further include an upper second scan line 152*b* and an upper initialization control line 153*b*.

The upper second scan line 152*b* and the upper initialization control line 153*b* may extend substantially in the horizontal direction (first direction). The upper second scan line 152*b* forms the second scan line 152 together with the lower second scan line 152*a*. The upper second scan line 152*b* may be connected with the gate electrode 3151 of the third transistor T3. The upper second scan line 152*b* may be integrally formed with the gate electrode 3151 of the third transistor T3. The upper initialization control line 153*b* and the lower initialization control line 153*a* form the initialization control line 153. The upper initialization control line 153*b* may be connected with the gate electrode 4151 of the fourth transistor T4. The upper initialization control line 153*b* may be integrally formed with the gate electrode 4151 of the fourth transistor T4.

In addition, the third gate conductive layer may further include a lower second initialization voltage line 128*a*. The lower second initialization voltage line 128*a* may extend substantially in the horizontal direction (first direction), and is applied with the second initialization voltage AVint.

The third gate conductive layer GAT3 may include a metal such as copper (Cu), molybdenum (Mo), aluminum (Al), titanium (Ti), and the like, and may be formed of a single layer or multiple layers.

After forming the third gate conductive layer including the gate electrode 3151 of the third transistor T3 and the gate electrode 4151 of the fourth transistor T4, a plasma treatment or doping process is carried out such that a portion of the oxide semiconductor layer, covered by the third gate conductive layer, is formed as a channel, and a portion of the oxide semiconductor layer, not covered by the third gate conductive layer, becomes conductive. The channel 3137 of the third transistor T3 may be disposed below the gate electrode 3151 to be overlapped with the gate electrode 3151. The first area 3136 and the second area 3138 of the third transistor T3 may not overlap the gate electrode 3151. The channel 4137 of the fourth transistor T4 may be disposed below the gate electrode 4151 so as to overlap the gate electrode 4151. The first area 4136 and the second area 4138 of the fourth transistor T4 may not overlap the gate electrode 4151. The upper boost electrode 3138*t* may not overlap the third gate conductive layer. A transistor including the oxide semiconductor layer may have a characteristic of an n-type transistor.

Referring to FIG. 25, a second interlayer insulating layer 162 may be disposed on the third gate conductive layer including the gate electrode 3151 of the third transistor T3 and the gate electrode 4151 of the fourth transistor T4. The second interlayer insulating layer 162 may have a single-layered or multi-layered structure. The second interlayer insulating layer 162 may include an inorganic insulating material such as a silicon oxide ($SiO_X$), a silicon nitride ($SiN_X$), a silicon oxynitride ($SiO_XN_Y$), and the like, and depending on embodiments, it may include an organic material.

Figure 18:
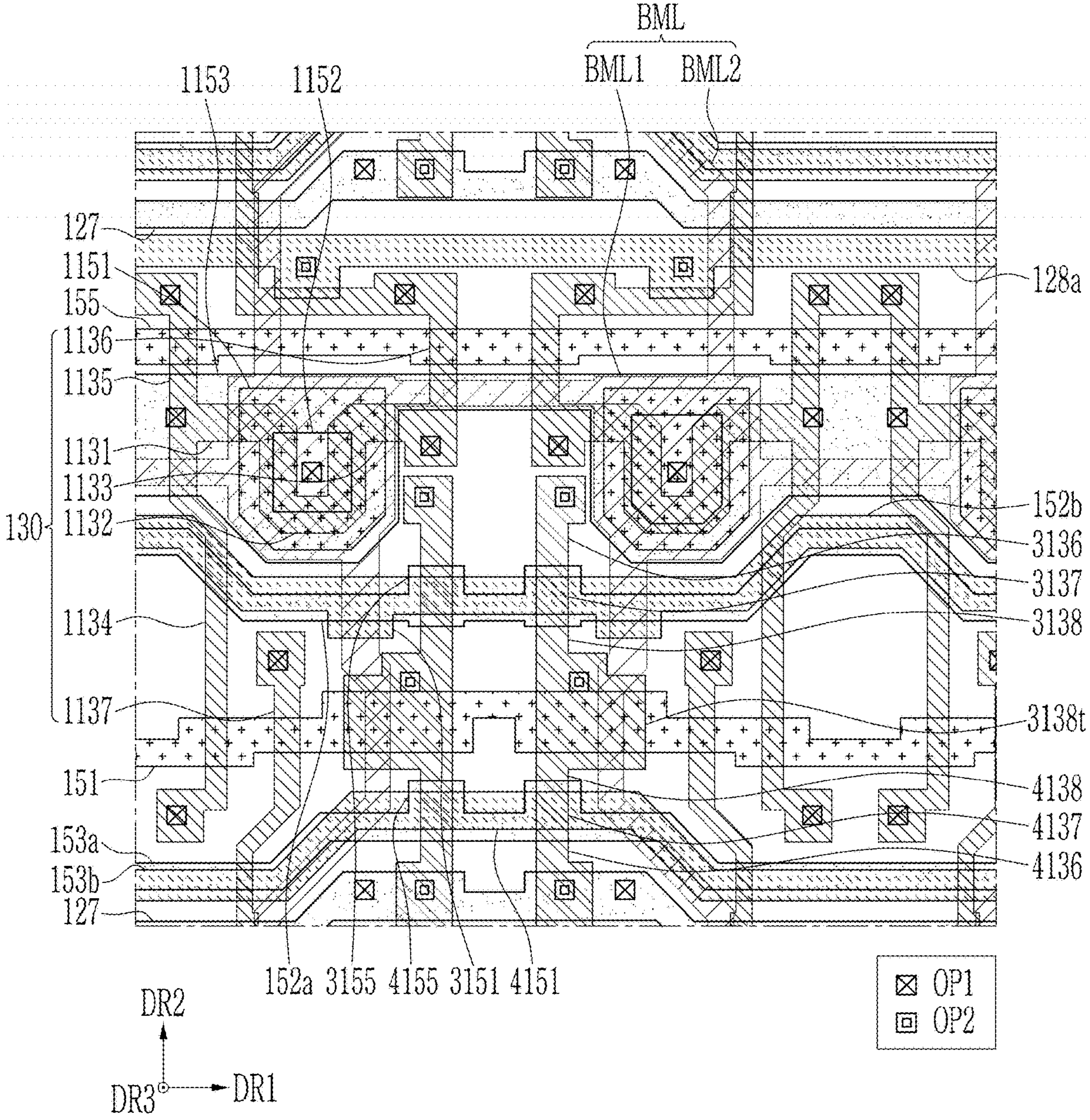

Referring to FIG. 18, the second interlayer insulating layer 162 may include two types of openings OP1 and OP2. The two types of the openings OP1 and OP2 may be formed using different masks.

The opening OP1 forms an opening in at least one of the second interlayer insulating layer 162, the third gate insulating layer 143, the first interlayer insulating layer 161, the second gate insulating layer 142, and the first gate insulating layer 141, and may expose the first semiconductor layer 130, the first gate conductive layer, or the second gate conductive layer.

The opening OP2 forms an opening in the second interlayer insulating layer 162 and/or the third gate insulating layer 143, and may expose the oxide semiconductor layer or the third gate conductive layer.

One of the openings OP1 overlaps at least a portion of the gate electrode 1151 of the driving transistor T1, and may also be formed in the third gate insulating layer 143, the first interlayer insulating layer 161, and the second gate insulating layer 142. In this case, one of the openings OP1 may overlap the opening 1152 of the first storage electrode 1153, and may be disposed inside the opening 1152 of the first storage electrode 1153.

One of the openings OP2 may overlap at least partially with the boost capacitor $C_{boost}$, and may be further formed on the third gate insulating layer 143.

Another one of the openings OP1 overlaps at least a part of the second area 1133 of the driving transistor T1, and the third opening 3165 may be formed in the third gate insulating layer 143, the first interlayer insulating layer 161, the second gate insulating layer 142, and the first gate insulating layer 141.

Another one of the openings OP2 overlaps at least a part of the first area 3136 of the third transistor T3 and may be formed in the third gate insulating layer 143.

Figure 19:
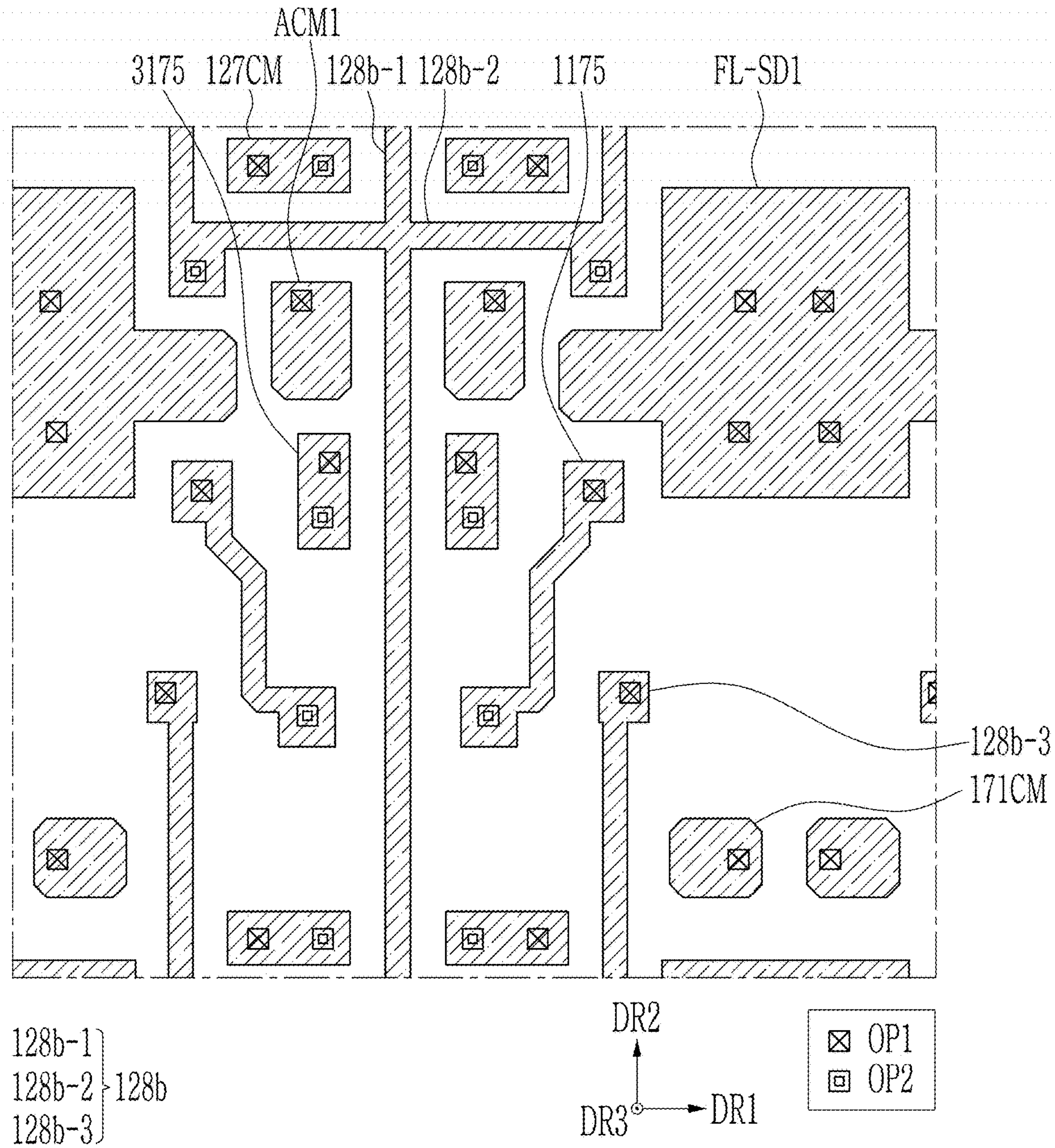
Figure 20:
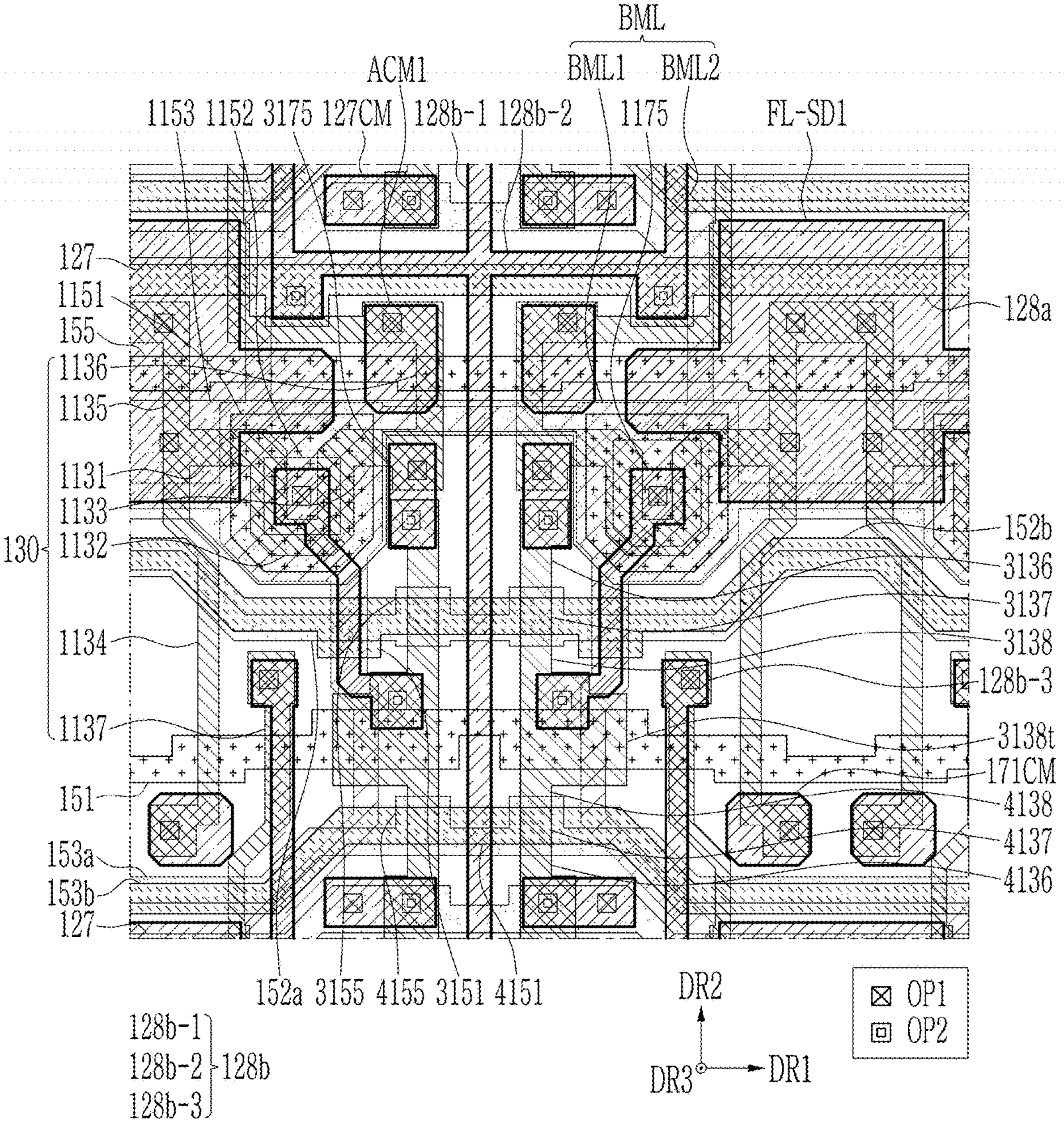

Referring to FIG. 19 and FIG. 20, a first data conductive layer including a first connection electrode 1175 and a second connection electrode 3175 may be disposed on the second interlayer insulating layer 162. It may be difficult to easily recognize the first data conductive layer in FIG. 20, and thus FIG. 19 illustrates only the first data conductive layer and the openings OP1 and OP2 as a top plan view, and FIG. 20 is a top plan view illustrating all the layers, except for the first data conductive layer.

The first connection electrode 1175 may overlap the gate electrode 1151 of the driving transistor T1. The first connection electrode 1175 may be connected with the gate electrode 1151 of the driving transistor T1 through the opening OP1 and the opening 1152 of the first storage electrode 1153. The first connection electrode 1175 may overlap the boost capacitor $C_{boost}$. The first connection electrode 1175 may be connected with the upper boost electrode 3138*t* of the boost capacitor $C_{boost}$ through the opening OP2. Accordingly, the gate electrode 1151 of the driving transistor T1 and the upper boost electrode 3138*t* of the boost capacitor $C_{boost}$ can be connected by the first connection electrode 1175. In this case, the gate electrode 1151 of the driving transistor T1 may also be connected with the second area 3138 of the third transistor T3 and the second area 4138 of the fourth transistor by the first connection electrode 1175.

The second connection electrode 3175 may overlap the second area 1133 of the driving transistor T1. The second connection electrode 3175 may be connected with the second area 1133 of the driving transistor T1 through the opening OP1. The second connection electrode 3175 may overlap the first area 3136 of the third transistor T3. The second connection electrode 3175 may be connected with the first area 3136 of the third transistor T3 through the opening OP2. Thus, the second area 1133 of the driving transistor T1 and the first area 3136 of the third transistor T3 may be connected by the second connection electrode 3175.

The first data conductive layer may further include a second initialization voltage line 128. The second initialization voltage line 128 includes a wiring portion 128*b*-1 extending in a vertical direction (second direction), a first extension portion 128*b*-2 protruding toward opposite sides of the horizontal direction (first direction) from the wiring portion 128*b*-1, and a second extension portion 128*b*-2 located while being bent again in the vertical direction (second direction) from the first extension portion 128*b*-2. The second initialization voltage line 128 is electrically connected with the second initialization voltage line 128*a* that is disposed in the third gate conductive layer through an opening OP2 in a portion where the first extension portion 128*b*-2 and the second extension portion 128*b*-3 meet. As a result, the second initialization voltage AVint is transmitted in the horizontal direction (first direction) through the second initialization voltage line 129*a* disposed in the third gate conductive layer, and the first data conductive layer is transmitted in the vertical direction (second direction) through the second initialization voltage line 128*b*.

The second extension portion 128*b*-3 is electrically connected with a portion 1137 of the first semiconductor layer 130 through an opening OP1 at an end of the second extension portion 128*b*-3.

The first data conductive layer may further include connection portions 127CM and 171CM, an anode connecting part ACM1, and an expansion portion FL-SD1.

The connection portion 127CM is connected with the first initialization voltage line 127 of the second gate conductive layer through the opening OP1, and is connected with a portion 4136 of the second semiconductor layer (oxide semiconductor layer) through an opening OP2 such that the first initialization voltage Vint flowing through the first initialization voltage line 127 is transmitted to the fourth transistor T4 of the oxide semiconductor layer.

The connection portion 171CM is electrically connected with the portion 1137 of the first semiconductor layer 130, that is, the second transistor T2, through the opening OP1.

The anode connecting part ACM1 is electrically connected with the portion 1136 of the first semiconductor layer 130, that is, the sixth transistor T6, through the opening OP1.

The expansion portion FL-SD1 is formed wide in order to flatten the anode disposed thereon. In addition, the expansion portion FL-SD1 is connected with a portion 1135 of the first semiconductor layer 130, that is, the fifth transistor T5, through the opening OP1, and is also electrically connected with the first storage electrode 1153 through the opening OP1.

The first data conductive layer SD1 may include a metal such as aluminum (Al), copper (Cu), molybdenum (Mo), titanium (Ti), and the like, or a metal alloy thereof, and may be formed of a single layer or multiple layers.

Referring to FIG. 25, a first organic layer 181 may be disposed on a first data conductive layer including a first connection electrode 1175 and a second connection electrode 3175. The first organic layer 181 may be an organic insulator including an organic material, and the organic material may include one or materials selected from a group consisting of polyimide, polyamide, acryl resin, benzocyclobutene, and phenol resin.

Figure 21:
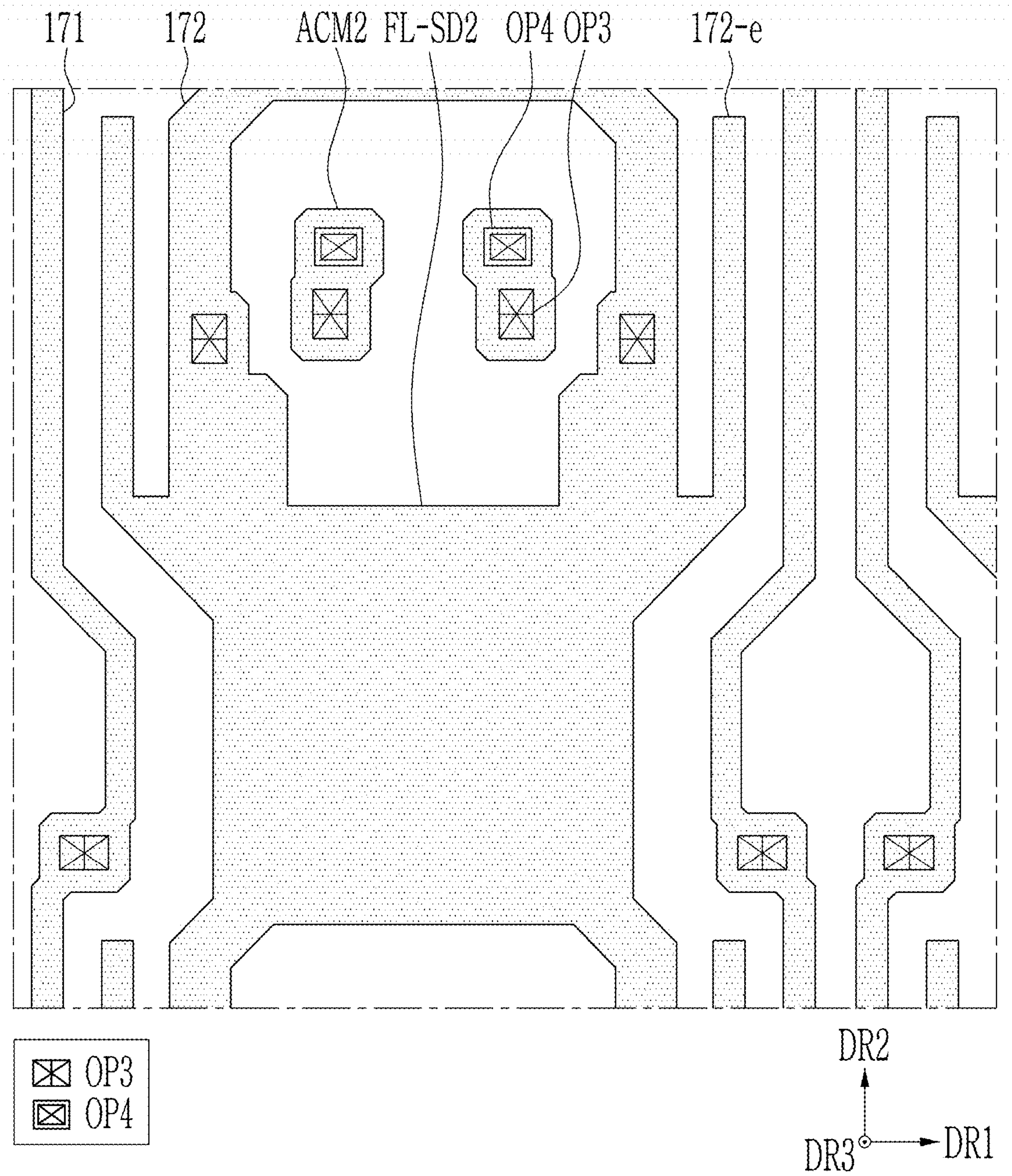
Figure 22:
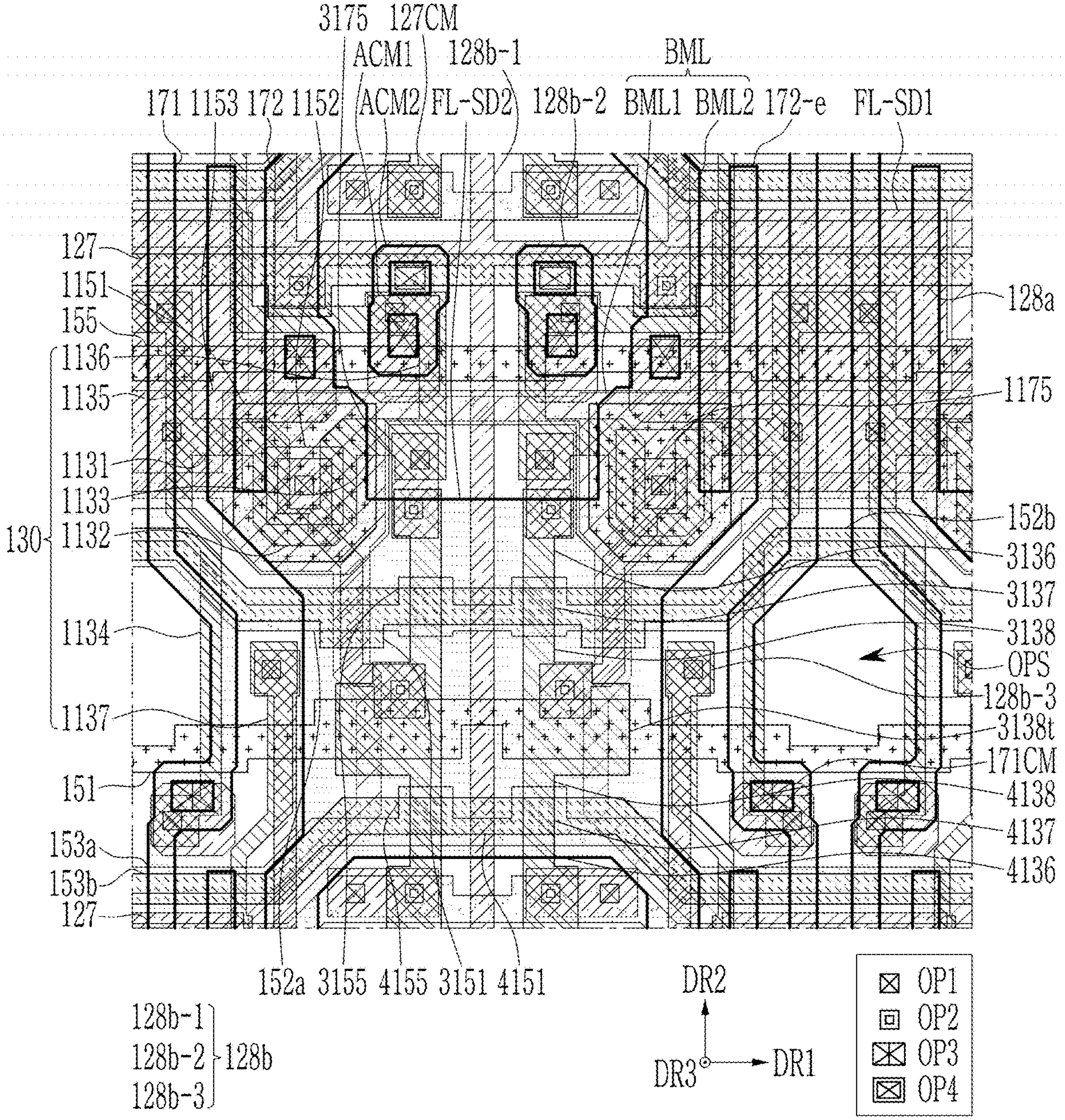

Referring to FIG. 21, FIG. 22, and FIG. 25, an opening OP3 is disposed in the first organic layer 181. A second data conductive layer including a data line 171, a driving voltage line 172, and an anode connecting part ACM2 may be disposed on the first organic layer 181. As second organic layer 182 and a third organic layer 183 are disposed on the second data conductive layer, and an opening OP4 is formed in the second organic layer 182 and the third organic layer 183. The anode connecting part ACM2 is electrically connected with the anode through the opening OP4. It may be difficult to easily recognize the second data conductive layer in FIG. 22, and thus FIG. 21 illustrates only the second data conductive layer and the openings OP3 and OP4 as a top plan view, and FIG. 22 is a top plan view illustrating the second data conductive layer and all the peripheral layers.

Referring to FIG. 21 and FIG. 22, the openings OP3 overlap the connection portion 171CM, the anode connecting part ACM1, and the expansion portion FL-SD1 disposed in the first data conductive layer and thus expose them, respectively.

The second data conductive layer may include the data line 171, the driving voltage line 172, and the anode connecting part ACM2.

The data line 171 and the driving voltage line 172 may extend substantially in the vertical direction (second direction). The data line 171 is connected with the connection portion 171CM of the first data conductive layer through the opening OP3, and is connected with the second transistor T2 therethrough. The driving voltage line 172 is electrically connected with the fifth transistor T5 and the first storage electrode 1153 through the expansion portion FL-SD1 of the first data conductive layer. The anode connecting part ACM2 is electrically connected with the anode connecting part ACM1 through the opening OP3, and is electrically connected with the sixth transistor T6.

Referring to FIG. 21, the driving voltage line 172 further includes an expansion portion FL-SD2 and a protruded wiring portion 172-*e*, and is not formed in a portion where the anode connecting part ACM2 is formed.

The expansion portion FL-SD2 is formed wide to flatten the anode disposed thereabove.

Two protruded wiring portions 172-*e* of the driving voltage line 172 are formed at opposite sides of two data lines 171 to flatten the anode disposed on the driving voltage line 172, and thus a total of four wiring portions 171 and 172-*e* are disposed below the anode.

The anode has a flatness characteristic by the structure below the anode (expansion portion FL-SD1 and wiring portion 128*b*-1 of the first data conductive layer, expansion portion FL-SD2 of the second data conductive layer, data line 171, and wiring portion 172-*e*) and the organic layers 181, 182, and 183.

In the present embodiment, the expansion portion FL-SD1 and the expansion portion FL-SD2 are electrically connected with the driving voltage line 172 such that the driving voltage ELVDD is transmitted.

The second data conductive layer SD2 may include a metal such as aluminum (Al), copper (Cu), molybdenum (Mo), titanium (Ti), and the like or a metal alloy thereof, and may be formed as a single layer or multiple layers.

Referring to FIG. 25, the second organic layer 182 and the third organic layer 183 are disposed on the second data conductive layer. The second organic layer 182 and the third organic layer 183 may be organic insulating layers, and may include at least one material selected from a group consisting of polyimide, polyamide, acryl resin, benzocyclobutene, and phenol resin. Depending on embodiments, the third organic layer 183 can be omitted.

The openings OP4 are formed in the second organic layer 182 and the third organic layer 183, and the anode and the anode connecting part ACM2 are electrically connected through the opening OP4.

Figure 23:
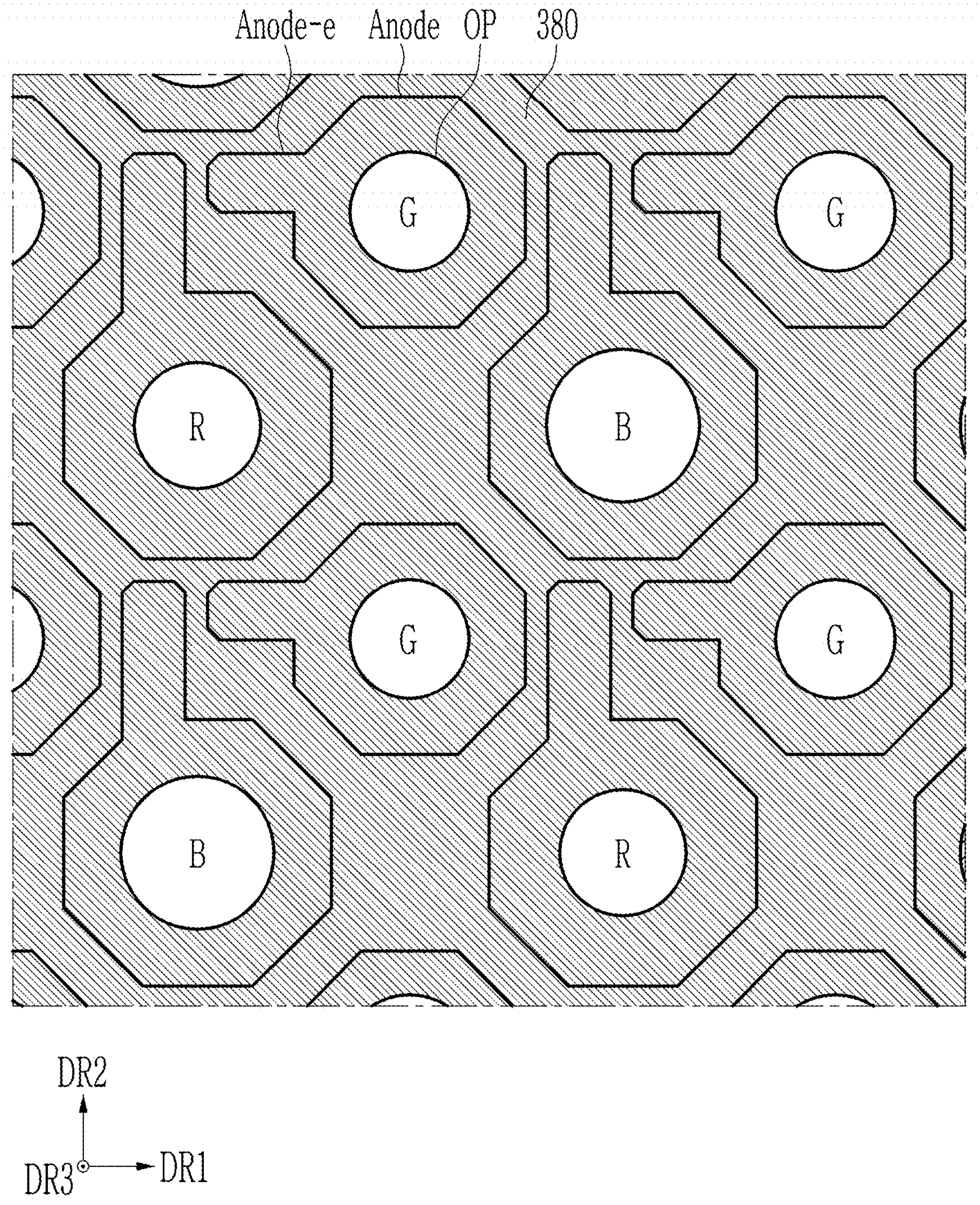

Referring to FIG. 23, the anode Anode is formed on the third organic layer 183. The anode Anode may further include an extension portion Anode-e to receive a current from a pixel circuit through the opening OP4.

Referring to FIG. 23 and FIG. 25, a black pixel defining layer 380 is disposed on the anode Anode, and an opening OP of the black pixel defining layer 380 is formed to overlap the anode Anode.

A structure in which the above-stated structures are wholly layered is illustrated in FIG. 24. In the present embodiment, as briefly described with reference to FIG. 3, a portion of the anode Anode, exposed through at least the opening OP of the black pixel defining layer 380, can be flattened by the expansion portion FL-SD1 of the first data conductive layer and the expansion portion FL-SD2 of the second data conductive layer disposed below the anode Anode. More specifically, the anode has a flatness characteristic by the expansion portion FL-SD1 of the first data conductive layer, the expansion portion FL-SD2 of the second data conductive layer, the data line 171, the wiring portion 172-*e*, and the organic layers 181, 182, and 183.

In addition, referring to FIG. 24, it can be determined that in the case that the light emitting display panel DP has the second element area OPS as shown in FIG. 9, each conductive layer or semiconductor layer disposed on the lower panel layer has a structure through which light can be transmitted because a pattern is not formed in the second element area OPS. In the second element area OPS, only a conductive layer or a semiconductor layer is not provided, and all insulating layers such as an inorganic film and an organic layer can be stacked. However, depending on embodiments, some of all inorganic and organic layers of the lower panel layer may be omitted.

As shown in FIG. 10, when additional openings OPBM-1 and OPC-1 are formed in the light blocking layer 220 or the red color filter 230R at a position of the upper panel layer corresponding to the second element area OPS, a photosensor on the rear side can sense the front of the light emitting display device.

In a normal pixel, as shown in FIG. 24, the second element area OPS may be disposed in the lower panel layer, but the upper panel layer disposed above prevents an additional opening from being formed in the light blocking layer 220 or the red color filter 230R as shown in FIG. 4 such that the second element area OPS may not be formed.

Based on such a planar structure, the entire cross-sectional structure of the light emitting display device will be described with reference to FIG. 25.

FIG. 25 is a cross-sectional view of the light emitting display device according to the embodiment.

In FIG. 25, a layered structure of the light transmissive area LTA of the first element area DA2 is also illustrated in addition to the layered structure of the display area DA.

First, referring to FIG. 25, a detailed layered structure of a pixel of the display area DA will be described. Here, the display area DA may be a layered structure of a pixel disposed in a main display area DA1 (also referred to as a first display area) and a component area DA2 (also referred to as a first element area).

A substrate 110 may include a material having a rigid characteristic such as glass and the like and thus not being bendable, or a flexible material that can be bent such as plastic or polyimide. FIG. 25 illustrates a flexible substrate, and the substrate 110 may have a two-layer structure of polyimide and a barrier layer formed of an inorganic insulating material thereon.

A metal layer BML is disposed on the substrate 110, and the metal layer BML is disposed in an area overlapping a channel of a first semiconductor layer ACT1. The metal layer BML is also called a lower shielding layer, and may include a metal such as copper (Cu), molybdenum (Mo), aluminum (Al), titanium (Ti), and the like, and may be formed of a single layer or multiple layers. A buffer layer 111 may be disposed on the metal layer BML to cover the metal layer BML, and the buffer layer 111 serves to prevent permeation of an impurity element to the first semiconductor layer 130, and may be an inorganic insulating layer including a silicon oxide ($SiO_X$), a silicon nitride ($SiN_X$), a silicon oxynitride ($SiO_XN_Y$), and the like.

The first semiconductor layer ACT1 is disposed on the buffer layer 111. The first semiconductor layer ACT1 includes a channel area, and a first area and a second area that are disposed at opposite sides of the channel area.

The first gate insulating layer 141 may be disposed to cover the first semiconductor layer ACT1 or overlap only the channel area of the first semiconductor layer ACT1. The first gate insulating layer 141 may be an inorganic insulating layer including a silicon oxide ($SiO_X$), a silicon nitride ($SiN_X$), a silicon oxynitride ($SiO_XN_Y$), and the like.

A first gate conductive layer GAT1 is disposed on the first gate insulating layer 141, and the first gate conductive layer GAT1 includes a gate electrode of a transistor LTPS TFT including a silicon semiconductor. The first gate conductive layer GAT1 may include a metal such as copper (Cu), molybdenum (Mo), aluminum (Al), titanium (Ti), and the like, and may be formed of a single layer or multiple layers. An area of the first semiconductor layer ACT1, overlapping the gate electrode on a plane may be the channel area. In addition, the gate electrode may serve as one electrode of a storage capacitor.

The first gate conductive layer GAT1 is covered by the second gate insulating layer 142, and the second gate insulating layer 142 may be an inorganic insulating layer including a silicon oxide ($SiO_X$), a silicon nitride ($SiN_X$), a silicon oxynitride ($SiO_XN_Y$), and the like.

A second gate conductive layer GAT2 is disposed on the second gate insulating layer 142, and the second gate conductive layer GAT2 may include a first storage electrode that forms the storage capacitor by overlapping the gate electrode and a lower shielding layer for an oxide semiconductor transistor disposed below the oxide semiconductor layer ACT2. The second gate conductive layer GAT2 may include a metal such as copper (Cu), molybdenum (Mo), aluminum (Al), titanium (Ti), and the like, and may be formed of a single layer or multiple layers.

The second gate conductive layer GAT2 is covered by the first interlayer insulating layer 161, and first interlayer insulating layer 161 may include an inorganic insulating layer including a silicon oxide ($SiO_X$), a silicon nitride ($SiN_X$), a silicon oxynitride ($SiO_XN_Y$), and the like.

The oxide semiconductor layer ACT2 is disposed on the first interlayer insulating layer 161, and the oxide semiconductor layer ACT2 includes a channel area, and a first area and a second area disposed at opposite sides of the channel area.

The oxide semiconductor layer ACT2 is covered by the third gate insulating layer 143, and the third gate insulating layer 143 may include an inorganic insulating layer including a silicon oxide ($SiO_X$), a silicon nitride ($SiN_X$), a silicon oxynitride ($SiO_XN_Y$), and the like.

The third gate insulating layer 143 and the first interlayer insulating layer 161 may include an opening that overlaps a part of the lower shielding layer for the oxide semiconductor transistor of the second gate conductive layer GAT2.

A third gate conductive layer GAT3 is disposed on the third gate insulating layer 143, and the third gate conductive layer GAT3 includes a connecting part that is connected with the gate electrode of the oxide semiconductor transistor and the lower shielding layer of the oxide semiconductor transistor. The third gate conductive layer GAT3 may include a metal such as copper (Cu), molybdenum (Mo), aluminum (Al), titanium (Ti), and the like, and may be formed of a single layer or multiple layers.

The third gate conductive layer GAT3 is covered by the second interlayer insulating layer 162, and the second interlayer insulating layer 162 may include an inorganic insulating layer including a silicon oxide ($SiO_X$), a silicon nitride ($SiN_X$), a silicon oxynitride ($SiO_XN_Y$), and the like, and may include an organic material depending on embodiments.

A second interlayer insulating layer 162 and an insulating layer disposed below the second interlayer insulating layer 162 may include an opening that overlaps the first semiconductor layer ACT1 and the oxide semiconductor layer ACT2.

A first data conductive layer SD1 is disposed on the second interlayer insulating layer 162, and the first data conductive layer SD1 includes a connecting part to provide a voltage or a current to the first semiconductor layer ACT1 and the oxide semiconductor layer ACT2 or transmits the voltage or current to other elements. The first data conductive layer SD1 may include a metal such as aluminum (Al), copper (Cu), molybdenum (Mo), titanium (Ti), and the like or a metal alloy thereof, and may be formed as a single layer or multiple layers.

The first data conductive layer SD1 is covered by a first organic layer 181. The first organic layer 181 may be an organic insulating layer including an organic material, and the organic material may include at least one material selected from a group consisting of polyimide, polyamide, acryl resin, benzocyclobutene, and phenol resin.

The first organic layer 181 may include an opening overlapping the first data conductive layer SD1, and a second data conductive layer SD2 is disposed on the first organic layer 181. The second data conductive layer SD2 may be connected with the first conductive layer SD1 through the opening. The second data conductive layer SD2 may include a metal such as aluminum (Al), copper (Cu), molybdenum (Mo), titanium (Ti), and the like or a metal alloy thereof, and may be formed as a single layer or multiple layers.

The second data conductive layer SD2 is covered by a second organic layer 182 and a third organic layer 183. The second organic layer 182 and the third organic layer 183 may be organic insulators, and may include at least one material selected from a group consisting of polyimide, polyamide, acryl resin, benzocyclobutene, and phenol resin. Depending on embodiments, the third organic layer 183 can be omitted. However, an anode Anode may have a flatter characteristic due to the third organic layer 183.

The anode Anode may be disposed on the third organic layer 183, and has a structure of being connected with the second data conductive layer SD2 through an opening formed in the third organic layer 183. The anode Anode may be formed of a single layer or multiple layers including a transparent conductive oxide film and a metal material. The transparent conductive oxide film may include an indium tin oxide (ITO), a poly-ITO, a indium zinc oxide (IZO), an indium gallium zinc oxide (IGZO), and an indium tin zinc oxide (ITZO), and the metal material may include silver (Ag), molybdenum (Mo), copper (Cu), gold (Au), aluminum (Al), and the like.

A black pixel defining layer 380 that includes an opening overlapping at least a part of the anode Anode and covers another part of the anode Anode is disposed on the anode Anode. The black pixel defining layer 380 may further include a light blocking material in addition to an organic insulating material. The light blocking material may include carbon black, carbon nanotubes, a resin or paste containing a black dye, metal particles, such as nickel, aluminum, molybdenum, and its alloys, metal oxide particles (e.g., chromium nitride), and the like. The black pixel defining layer 380 may be formed of an organic material with a negative type of black color. Since the negative type is used as the organic material, it can have a characteristic that a part covered by the mask is removed.

The black pixel defining layer 380 has an opening OP, and an emission layer EML is disposed within the opening OP. The emission layer EML may be formed of an organic light emitting material, and adjacent emission layers EML may display different colors. Depending on embodiments, each emission layer EML may display the same color light due to a color filter 230 disposed thereabove.

A spacer 385 is formed on the black pixel defining layer 380. The spacer 385 may be formed in a structure having a step, and the spacer 385 includes a first portion 385-1 disposed in a high and narrow area and a second portion 385-2 disposed in a low and wide area. The first portion 385-1 and the second portion 385-2 may be integrally formed. The spacer 385 may be formed of photosensitive polyimide (PSPI).

A functional layer FL is disposed on the emission layer EML, the spacer 385, and the exposed black pixel defining layer 380, and the functional layer FL may be formed on the entire surface of the light emitting display device DP. The functional layer FL may include an electron injection layer, an electron transport layer, a hole transport layer, and a hole injection layer, and the functional layer FL may be disposed above and below the emission layer EML. That is, the hole injection layer, the hole transport layer, the emission layer EML, the electron transport layer, the electron injection layer, and the cathode are sequentially disposed on the anode, and thus the hole injection layer and the hole transport layer of the functional layer FL are disposed below the emission layer EML, while the electron transport layer and the electron injection layer may be disposed above the emission layer EML. Depending on embodiments, the functional layer FL may also be disposed in the light transmissive area LTA.

A cathode Cathode may be formed as a light-transmitting electrode or a reflecting electrode. Depending on embodiments, the cathode may be a transparent or semi-transparent electrode, and may be formed of a metal thin film having a small work function, such as lithium (Li), calcium (Ca), lithium fluoride/calcium fluoride (LiF/Ca), lithium fluoride/aluminum (LiF/Al), aluminum (Al), silver (Ag), magnesium (Mg), and a compound thereof. In addition, a transparent conductive oxide (TCO) such as an indium tin oxide (ITO), an indium zinc oxide (IZO), a zinc oxide (ZnO), or an indium oxide ($In_2O_3$) can be further disposed on the metal thin film. The cathode may be integrally formed over the entire surface of the light emitting display device DP, except for the light transmissive area LTA.

An encapsulation layer 400 is disposed on the cathode Cathode. The encapsulation layer 400 includes at least one inorganic layer and at least one organic layer, and may have a triple layer structure including a first inorganic encapsulation layer 401, an organic encapsulation layer 402, and a second inorganic encapsulation layer 403. The encapsulation layer 400 may be to protect the emission layer EML formed of an organic material from moisture or oxygen that may be inflowed from the outside. Depending on embodiments, the encapsulation layer 400 may include a structure in while an inorganic layer and an organic layer are sequentially further stacked. Here, a thickness of the organic encapsulation layer 402 may be formed to be 3.5 μm or more and 4.5 μm or less, for example, 4 μm. The thickness of the organic encapsulation layer 402 is reduced from 8 μm or more to half the thickness to improve the effect of touch sensing on top, and a distance between the black pixel defining layer 380 and the light blocking layer 220 is reduced to allow a user to view an image at a wide angle.

Sensing insulating layers 501, 510, and 511 and two sensing electrodes 540 and 541 are disposed on the encapsulation layer 400 for touch sensing. Here, the sensing electrodes 540 and 541 may include a metal such as aluminum (Al), copper (Cu), silver (Ag), gold (Au), molybdenum (Mo), titanium (Ti), tantalum (Ta), and the like, or a metal alloy thereof, and may be formed as a single layer or multiple layers. The plurality of sensing electrodes 540 and 541 may be insulated from each other, while disposing an intermediate sensing insulating layer 510 therebetween, and a lower sensing electrode 541 is disposed above a lower sensing insulating layer 501, an upper sensing electrode 540 is disposed above the intermediate sensing insulating layer 510, and the upper sensing electrode 540 is covered by the upper sensing insulating layer 511. The plurality of sensing electrodes 540 and 541 may be electrically connected through an opening disposed in the intermediate sensing insulating layer 510. In the embodiment of FIG. 25, two sensing electrodes 540 and 541 are used to sense touch in a capacitive type, but depending on embodiments, touch can also be sensed in a cell cap method using only one sensing electrode.

A light blocking layer 220 and a color filter 230 are disposed on the upper sensing electrodes 540 and 541, that is, on the upper sensing insulating layer 511.

The light blocking layer 220 may be disposed so as to overlap the sensing electrodes 540 and 541 on a plane, and disposed to not overlap the anode Anode on a plane. This is to prevent the anode Anode and the emission layer EML, which can display an image, from being blocked by the light blocking layer 220 and the sensing electrodes 540 and 541.

The color filter 230 is disposed on the sensing insulating layers 501, 510, and 511 and the light blocking layer 220. The color filter 230 includes a red color filter that transmits red light, a green color filter that transmits green light, and a blue color filter that transmits blue light. Each color filter 230 may be disposed to overlap the anode Anode of the light emitting diode LED on a plane. Since light emitted from the emission layer EML may be emitted while being changed to a corresponding color while passing through a color filter, all of the light emitted from the emission layer EML may have the same color. However, in the emission layer EML, different colors of light are displayed, and the displayed color may be enhanced by passing through a color filter of the same color.

The light blocking layer 220 may be disposed between each color filter 230. Depending on embodiments, the color filter 230 may be replaced with a color conversion layer or may further include a color conversion layer. The color conversion layer may include quantum dots.

Depending on embodiments, the color filter 230 may have a structure in which one color among three colors is formed as a whole, and only an opening corresponding to the other two colors is formed, and a color filter of the other two colors is formed in the corresponding opening. (Refer to FIG. 8) Depending on embodiments, an additional opening may be included as shown in FIG. 10.

A planarization layer 550 covering the color filter 230 is disposed on the color filter 230. The planarization layer 550 is for planarizing an upper surface of the light emitting display device, and may be a transparent organic insulator including at least one material selected from a group consisting of polyimide, polyamide, acryl resin, benzocyclobutene, and phenol resin.

Depending on embodiments, a low refractive layer and an additional planarization layer may be further disposed on the planarization layer 550 to improve front visibility and light emission efficiency of the display device. Light can be emitted while being refracted to the front by the low refractive layer and the additional planarization layer having a high refractive characteristic. In this case, the low refractive layer and the additional planarization layer may be disposed directly on the color filter 230, and thus the planarization layer 550 can be omitted depending on embodiments.

In the present embodiment, a polarizer is not included on the planarization layer 550. That is, the polarizer may serve to prevent display deterioration while the user recognizes external light incident thereon and reflected from the anode Anode. However, in the present embodiment, a structure in which the black pixel defining layer 380 covers the side of the anode Anode to reduce the degree of reflection from the anode Anode, and the light blocking layer 220 formed to reduce the incidence of light to prevent deterioration of display quality due to reflection, is also included. Therefore, it is not necessary to separately form the polarizer on the front surface of the light emitting display device DP.

Hereinafter, a layered structure of the light transmissive area LTA will be described with reference to FIG. 25.

The light transmissive area LTA removes a semiconductor, a metal, the light blocking layer 220, the color filter 230, and the black pixel defining layer 380 such that light can be transmitted without blocking, and is layered only with a transparent material. The transparent material includes an inorganic insulating layer or an organic insulating layer, and may additionally include a functional layer FL. A structure in which an inorganic insulating layer or an organic insulating layer is layered on the light transmissive area LTA may vary, and the stacked structure of the light transmissive area LTA according to the embodiment of FIG. 25 is as follows.

A buffer layer 111 is disposed on the flexible substrate 110 including polyimide and a barrier layer, and a first organic layer 181 is formed on the buffer layer 111. The functional layer FL and the encapsulation layer 400 are disposed on top of the first organic layer 181. That is, the functional layer FL, the first inorganic encapsulation layer 401, the organic encapsulation layer 402, and the second inorganic encapsulation layer 403 are sequentially layered on the first organic layer 181. Depending on embodiments, the functional layer FL between the first organic layer 181 and the encapsulation layer 400 can be omitted. An upper layered structure of the encapsulation layer 400 may be the same as a layer stacked on a pixel of a component area DA2 (also referred to as a first element area) except for the sensing electrode 540, the light blocking layer 220, and the color filter 230. That is, the sensing insulating layers 501, 510, and 511 and the planarization layer 550 may be disposed on the encapsulation layer 400 in the light transmissive area LTA. Depending on embodiments, an additional planarization layer may be further disposed on the planarization layer 550 of the light transmissive area LTA to improve front visibility and light emission efficiency of the display device.

The layers (the first gate insulating layer 141, the second gate insulating layer 142, the first interlayer insulating layer 161, the third gate insulating layer 143, and the second interlayer insulating layer 162) that were stacked under the first organic layer 181 in the pixel of the display area DA are removed. However, depending on embodiments, at least one of the above-stated insulating layers may not be removed.

In addition, depending on embodiments, a second organic layer 182 and/or a third organic layer 183 may further be included in the light transmissive area LTA.

In addition, the cathode Cathode disposed on the functional layer FL is also removed, and additionally, the light blocking layer 220, the color filter 230, and the black pixel defining layer 380 are also removed. The functional layer FL may be omitted from the light transmissive area LTA, but may remain in the light transmissive area LTA.

Hereinabove, the layered structure of the display area DA and the light transmissive area LTA was described with reference to FIG. 25.

Hereinafter, referring to FIG. 26 to FIG. 28, a layer relationship of the first data conductive layer, the second data conductive layer, and the anode according to another embodiment will be described.

Figure 26:
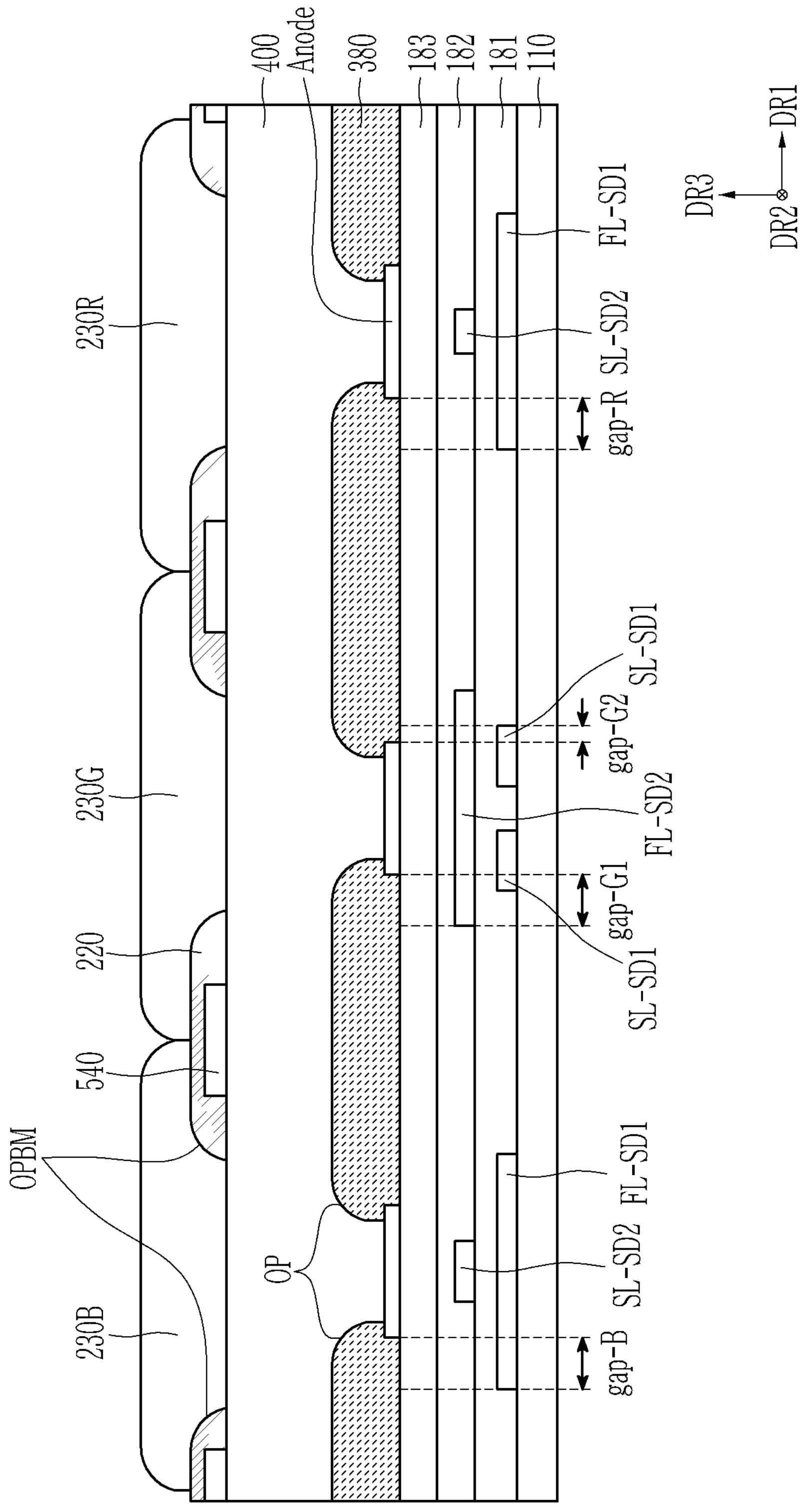
FIGS. 26, 27, and 28 are enlarged cross-sectional views of a part of a light emitting display device according to another embodiment.
Figure 27:
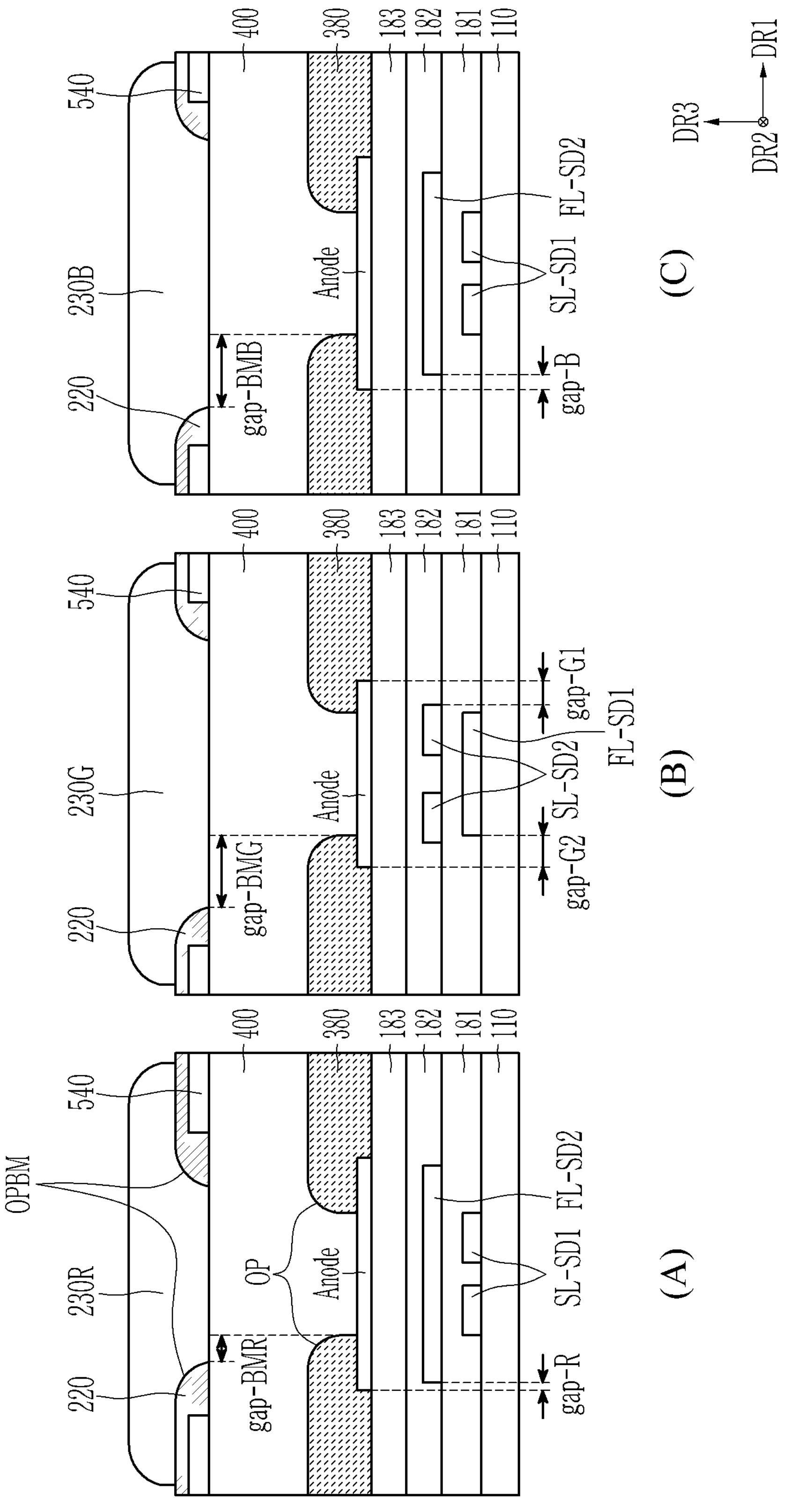
Figure 28:
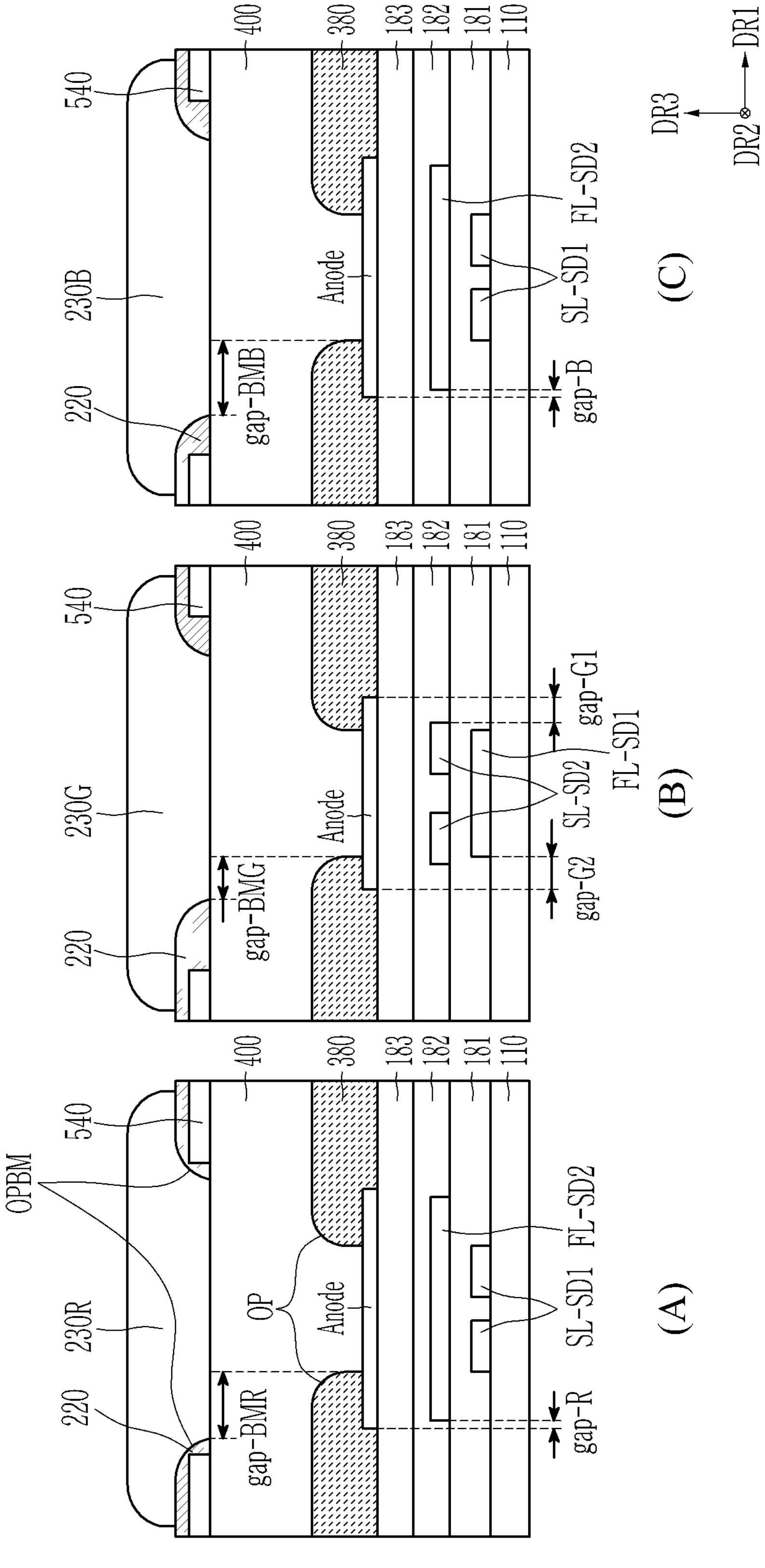

FIG. 26 to FIG. 28 are enlarged cross-sectional views of a part of a light emitting display device according to another embodiment.

First, not as in FIG. 2, in FIG. 26, an embodiment in which an expansion portion FL-SD2 of a second data conductive layer is disposed in a green pixel, and an expansion portion FL-SD1 of a first data conductive layer is disposed in a red pixel and a blue pixel, is shown.

A pixel structure for each color according to the embodiment of FIG. 26 will be described hereinafter.

First, in the blue pixel, a wiring portion SL-SD2 is disposed in the second data conductive layer SD2 that is disposed below an anode Anode in the blue pixel, and the expansion portion FL-SD1 is disposed in the first data conductive layer SD1. An edge of the expansion portion FL-SD1 disposed in the first data conductive layer SD1 is formed wider from an edge of the anode Anode by a gap-B interval on a plane. Only a single wiring portion SL-SD2 disposed in the second data conductive layer SD2 is illustrated, but depending on embodiments, it may be formed in one pair or two pairs, and may be formed in various other numbers. A step disposed below the organic layers 181, 182, and 183, the expansion portion FL-SD1, and the wiring portion SL-SD2 having an edge disposed more outside the edge of the anode Anode is removed by the the organic layers 181, 182, and 183, the expansion portion FL-SD1, and the wiring portion SL-SD2. As a result, the anode Anode that is disposed on the organic layers 181, 182, and 183, the expansion portion FL-SD1, and the wiring portion SL-SD2, while overlapping on a plane is flattened.

In the green pixel, an expansion portion FL-SD2 is disposed in the second data conductive layer SD2 disposed below the anode Anode, and the wiring portion SL-SD1 is disposed in the first data conductive layer SD1 disposed therebelow. An edge of the expansion portion FL-SD2 disposed in the second data conductive layer SD2 is formed wider from an edge of the anode Anode by a gap-G1 interval on a plane. An outer edge of the wiring portion SL-SD1 may also be disposed more outside by a gap-G1 interval than the edge of the anode Anode. The organic layers 181, 182, and 183, the expansion portion FL-SD2, and the wiring portion SL-SD1 removes a step formed therebelow such that the anode Anode formed above, while overlapping on a plane, can be flattened. Although the wiring portion SL-SD1 overlapping the expansion portion FL-SD2 is shown as a pair, one or three or more wiring portions SL-SD1 may be formed.

In the red pixel, a wiring portion SL-SD2 is disposed in the second data conductive layer SD2 that is disposed below an anode Anode in the blue pixel, and the expansion portion FL-SD1 is disposed in the first data conductive layer SD1. An edge of the expansion portion FL-SD1 disposed in the first data conductive layer SD1 is formed wider from an edge of the anode Anode by a gap-R interval on a plane. Only a single wiring portion SL-SD2 disposed in the second data conductive layer SD2 is illustrated, but depending on embodiments, it may be formed in one pair or two pairs, and may be formed in various other numbers. A step disposed below the organic layers 181, 182, and 183, the expansion portion FL-SD1, and the wiring portion SL-SD2 having an edge disposed more outside than the edge of the anode Anode is removed by the organic layers 181, 182, and 183, the expansion portion FL-SD1, and the wiring portion SL-SD2. As a result, the anode Anode that is disposed on the organic layers 181, 182, and 183, the expansion portion FL-SD1, and the wiring portion SL-SD2, while overlapping on a plane, is flattened.

In FIG. 27 and FIG. 28, not as illustrated in FIG. 6, as an exemplary variation of the embodiment of FIG. 6, an embodiment in which the expansion portions FL-SD1 and FL-SD2 do not entirely overlap the opening OP of the black pixel defining layer 380 on a plane is shown. An overlapping ratio between the opening OP of the black pixel defining layer 380 and the expansion portions FL-SD1 and FL-SD2 on a plane may be 95% or more and 100% or less. In an embodiment of FIG. 27 and FIG. 28, unlike the embodiment of FIG. 6, the edges of the expansion portions FL-SD1 and FL-SD2 are disposed more inside than the edge of the anode Anode.

In the embodiment of FIG. 27 and FIG. 28, the edge of the expansion portion FL-SD2 of the red pixel is disposed more inside than the edge of the anode Anode by a gap-R interval on a plane, and the edge of the expansion portion FL-SD2 of the blue pixel is disposed more inside than the edge of the anode Anode by a gap-B interval on a plane. The edge of the expansion portion FL-SD1 of the green pixel is disposed at an inner side than the edge of the anode Anode by a gap-G2 interval on a plane, and the edge of the wiring portion SL-SD2 of the green pixel is disposed more inside than the edge of the anode Anode by a gap-G1 interval.

When the opening OP and expansion portions L-SD1 and FL-SD2 of the black pixel defining layer 380 overlap on a plane with an overlapping ratio of 95% or more, the presence of wiring portions SL-SD1 and SL-SD2 and at least two or more organic layers may be disposed to form a flat top.

As described, although the expansion portions FL-SD1 and FL-SD2 or the wiring portions SL-SD1 and SL-SD2 are disposed more inside than the anode Anode or the black pixel defining layer 380, the anode corresponding to the opening OP of the black pixel defining layer 380 can be substantially flattened, and thus there is no significant difference in display quality compared to FIG. 6.

The expansion portion FL-SD2 is disposed in the second data conductive layer in the blue and red pixels, the expansion portion FL-SD1 is disposed in the first data conductive layer in the green pixel, and the wiring portion SL-SD2 is formed in the second data conductive layer. In addition, each of the wiring portions SL-SD1 and SD-SD2 is provided as a pair.

In FIG. 27 and FIG. 28, a gap between the opening OP of the black pixel defining layer 380 and the opening OPBM of the light blocking layer 220 is additionally compared.

In FIG. 27 and FIG. 28, a gap-BMM interval between the opening OP of the black pixel defining layer 380 and the opening OPBM of the light blocking layer 220 are equal in the blue pixel. However, the case where the distance between the two openings OP and OPBM is different is shown in the red pixel and the green pixel.

In FIG. 27, the gap-BMR interval between the two openings OP and OPBM in the red pixel is smaller than the interval shown in the embodiment of FIG. 28. However, in the embodiment of FIG. 27, the gap-BMG interval between the two openings OP and OPBM of the green pixel and the red pixel are larger than the gap shown in the embodiment of FIG. 28. As the gap-BMG interval between the openings OP and OPBM is increased, light emitted from the emission layer disposed above the anode Anode is provided at a large angle, which has the merit of widening an angle at which the user can view am image. However, when the gap-BMG interval between the openings OP and OPBM is too wide, the top surface of the black pixel defining layer 380 may be visually recognized, and therefore it may be appropriate to have a gap within a certain range.

Hereinafter, referring to FIG. 29, a detailed planar structure of an embodiment where expansion portions FL-SD1 and FL-SD2 or wiring portions SL-SD1 and SL-SD2 are disposed more inside than an anode Anode as shown in the embodiment of FIG. 27 or FIG. 28 will be described in detail.

Figure 29:
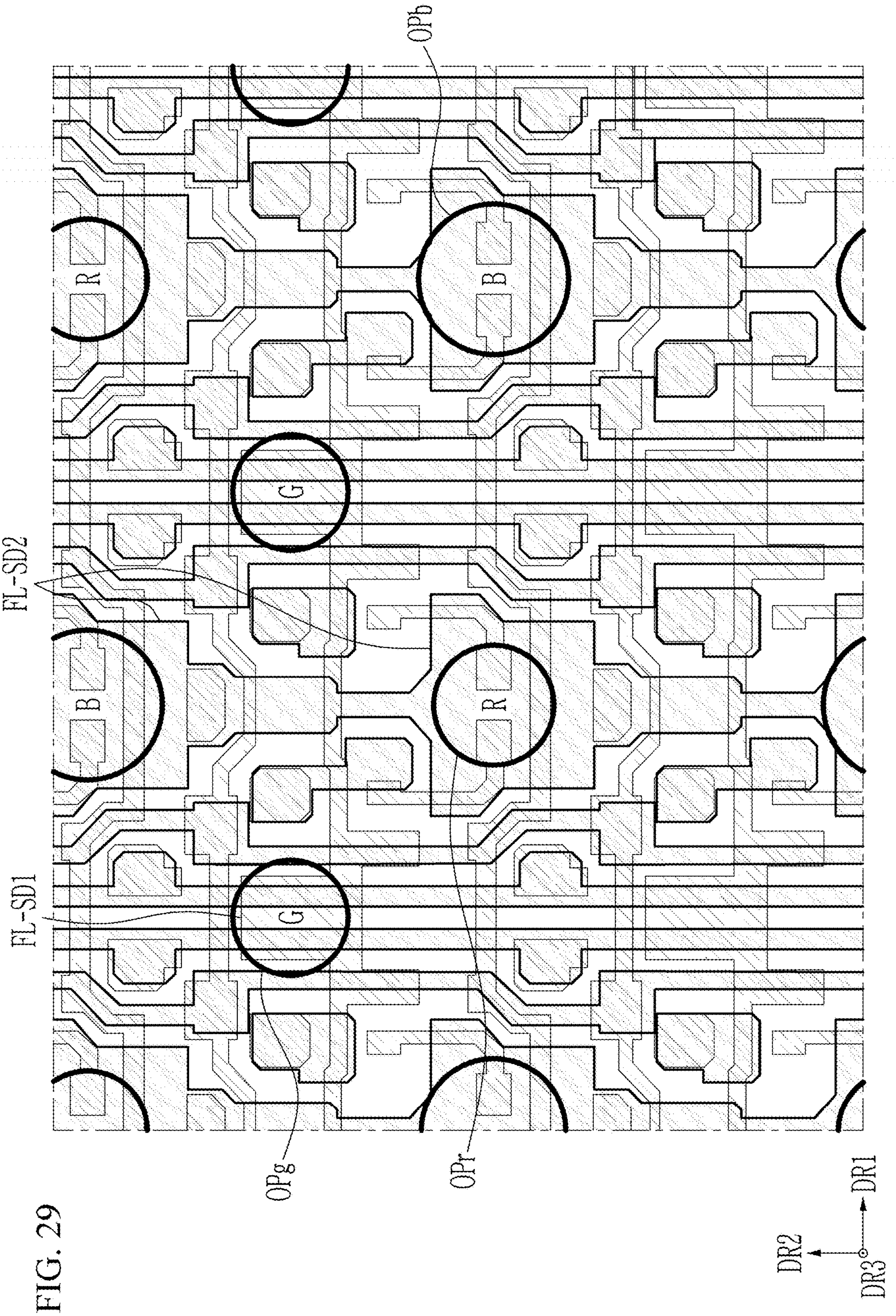
FIG. 29 is a top plan view of a part of a lower panel layer of a light emitting display device according to another embodiment.

FIG. 29 is a top plan view of a part of a lower panel layer of a light emitting display device according to another embodiment.

In FIG. 29, only openings OPr, OPg, and OPb for red, green, and blue formed in a black pixel defining layer 380, a first data conductive layer, and a second conductive layer according to another embodiment are illustrated. In FIG. 29, the first data conductive layer and the second data conductive layer are shown with different hatching.

Figure 38:
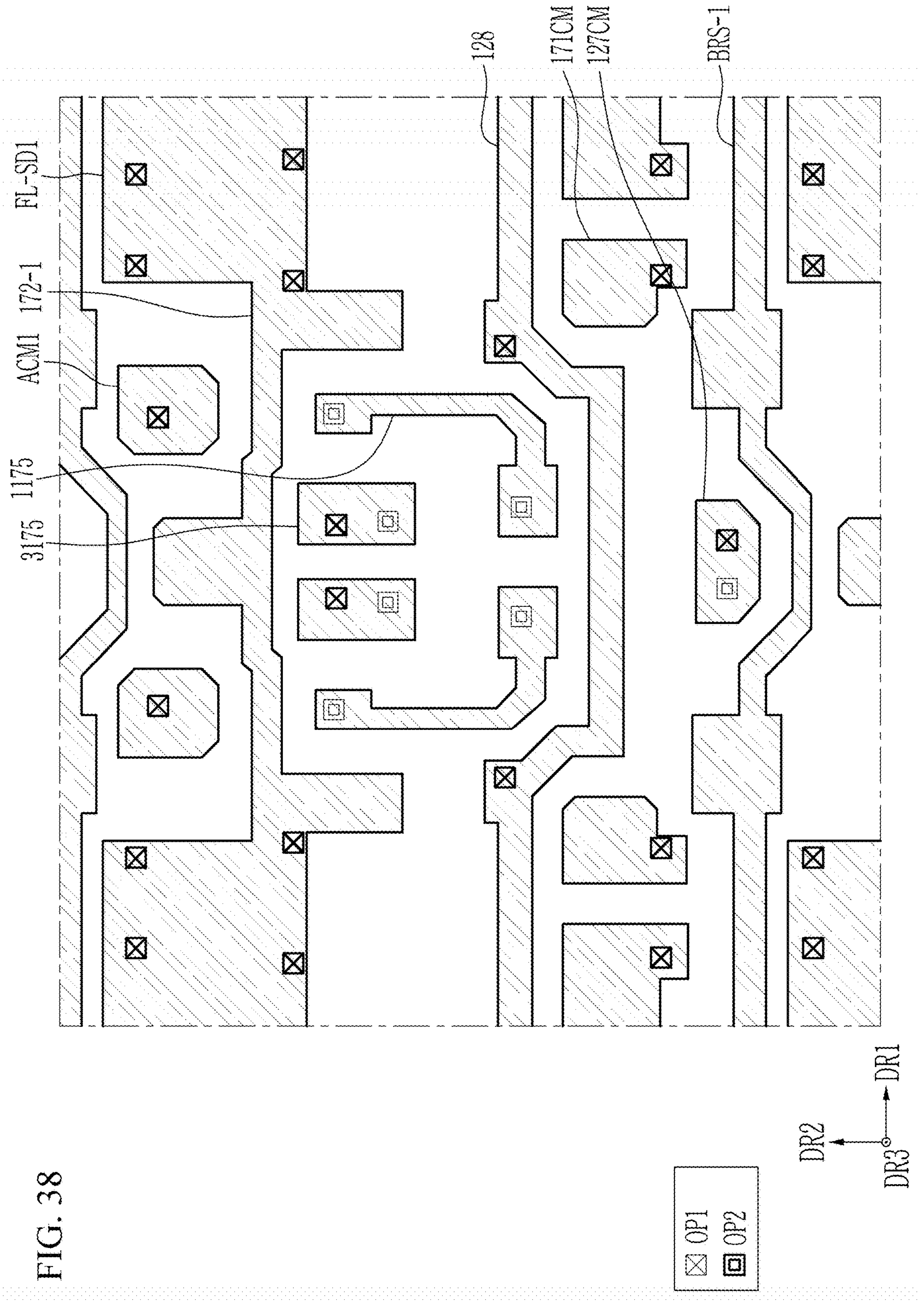

A widely formed expansion portion FL-SD2 is formed in the second data conductive layer below the red and blue openings OPr and OPb. That is, the expansion portion FL-SD2 of the second data conductive layer and the red and blue openings OPr and OPb overlap each other on a plane. In the first data conductive layer, a single wiring portion horizontally crosses the expansion portion FL-SD2 of the second data conductive layer and the red and blue openings OPr and OPb. Referring to FIG. 38, a wiring portion of the first data conductive layer may be a part of the second initialization voltage line 128. The expansion portion FL-SD2 of the second data conductive layer, the wiring portion of the first data conductive layer, and at least one of organic layers 181, 182, and 183 may flatten an overlapping anode. In FIG. 29, a structure in which the expansion portion FL-SD2 of the second data conductive layer overlaps the entire region of the red and blue openings OPr and OPb in the red and blue pixels is illustrated.

On the contrary, in a green pixel, a part of a green opening OPg is not overlapped with the expansion portion FL-SD1 of the first data conductive layer on a plane.

Figure 40:
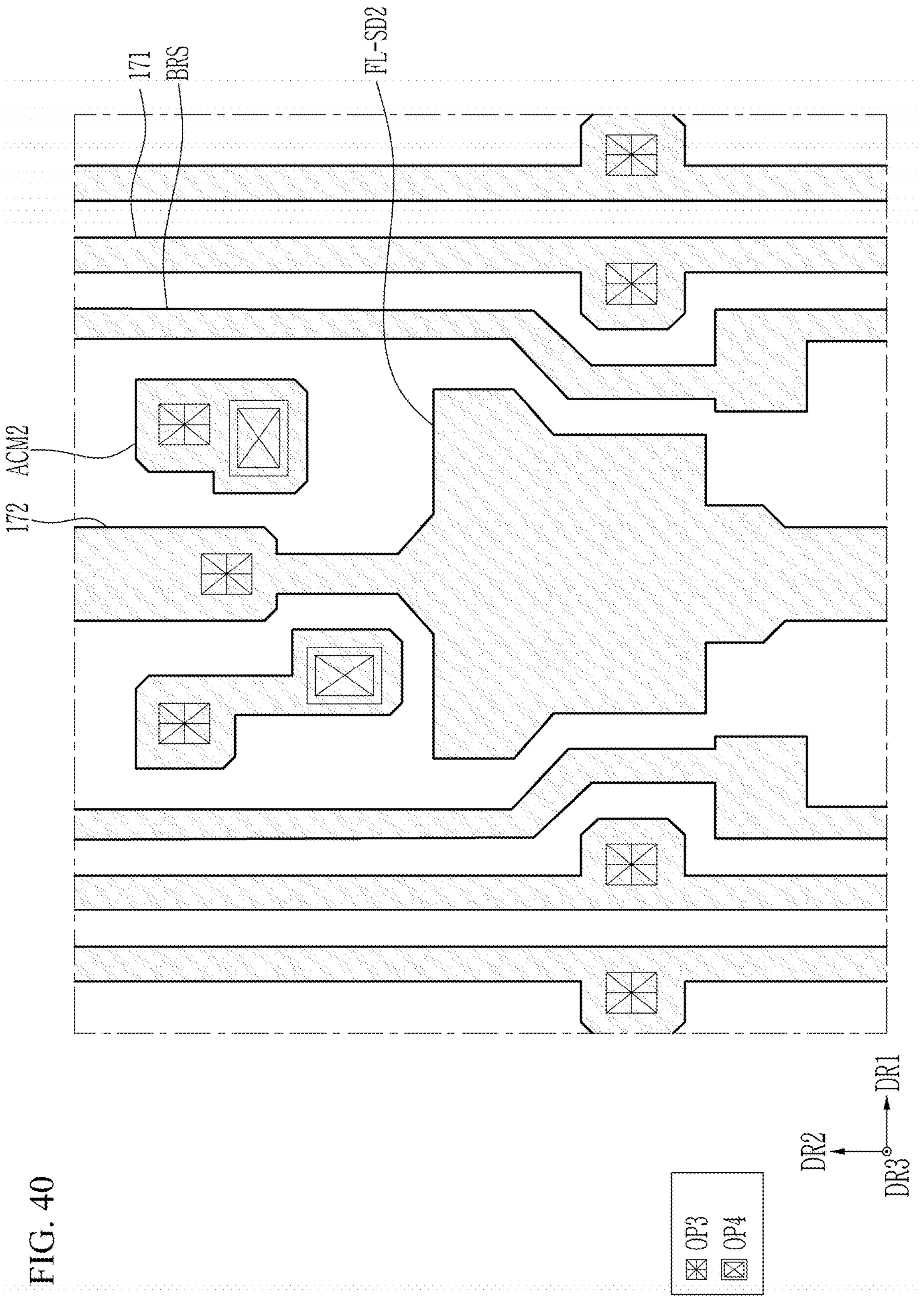

That is, a widely formed expansion portion FL-SD1 is formed in the first data conductive layer below the green opening OPg. That is, the expansion portion FL-SD1 of the first data conductive layer and the green opening OPg overlap each other on a plane, but some areas are not overlapped on a plane. In FIG. 29, a total of two wiring portions disposed in the second data conductive layer overlap the expansion portion FL-SD1 of the first data conductive layer and the green opening OPg, and referring to FIG. 40, a wiring portion of the second data conductive layer may be a part of the data line 171. In addition, referring to FIG. 29, the wiring portion disposed in the second data conductive layer may further include two additional wiring portions. That is, at least a part of an end of the green opening OPg overlaps with the additional wiring portion or the end of the green opening OPg and the additional wiring portion may contact each other on a plane, and thus a non-flat portion at the end of the anode Anode can be removed. Referring to FIG. 40, the additional wiring portion disposed in the second data conductive layer may be an additional signal wire BRS. The additional signal wire BRS may be wiring for transmitting a data voltage applied to the data line, and may be parallel to the data line.

In the embodiment of FIG. 29, the green opening OPg is formed smaller than other openings OPr and OPb. Considering an actual line width of one wiring, the size of the green opening OPg formed in the black pixel defining layer 380, and the degree of flatness by the organic layers 182 and 183, even through the green opening OPg overlaps only two wiring portions disposed in the data conductive layer and partially overlaps with two additional wiring portions, the anode disposed in the green opening OPg can be formed flat as a whole.

Referring to FIG. 29, the green opening OPg and the expansion portion FL-SD1 of the first data conductive layer do not overlap the entire region and overlap more than 95%. Therefore, an edge of the expansion portion FL-SD1 of the first data conductive layer is disposed more inside than an edge of the anode Anode or the black pixel defining layer 380, and thus the edge of the expansion portion FL-SD1 of the first data conductive layer overlaps with the anode Anode on a plane. Since the anode corresponding to the green opening OPg does not have a flat expansion portion structure in the second data conductive layer disposed therebelow, there is a possibility that the flatness of the anode may be lowered. In addition, a portion of the green opening OPg does not overlap with the expansion portion FL-SD1. However, due to the structure of the wiring portion disposed in the second data conductive layer (including the additional wiring portion), the anode Anode may be formed flat as a whole.

Therefore, even in the green pixel, the anode overlapping the green opening OPg is flattened by the expansion portion FL-SD1 of the first data conductive layer, the wiring portion of the second data conductive layer, and at least one of organic layers 181, 182, and 183.

Hereinabove, referring to FIG. 29, a planar relationship between the red, green, and blue openings OPr, OPg, and OPb formed in the first data conductive layer, the second data conductive layer, and the black pixel defining layer 380 among the lower panel layers was described in detail. Hereinafter, a planar structure of an upper pattern will be described in detail with reference to FIG. 30.

Figure 30:
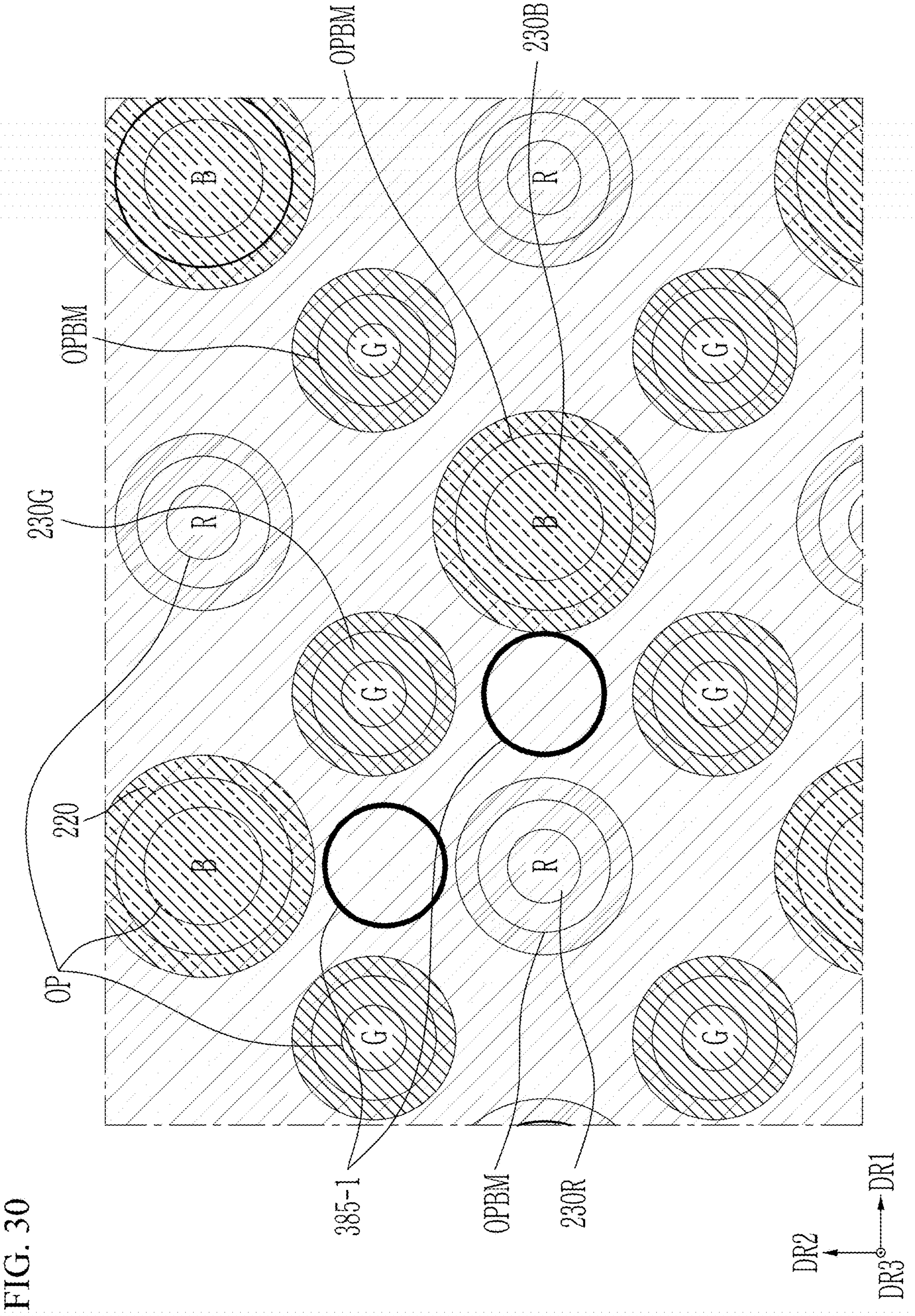
FIG. 30 is a top plan view of a part of an upper panel layer of a light emitting display device according to another embodiment.

FIG. 30 is a top plan view of a part of an upper panel layer of a light emitting display device according to another embodiment.

Not as illustrated in FIG. 8, an upper panel layer of FIG. 30 has a structure in which color filters 230R, 230G, and 230B for red, green, and blue are formed only in each opening OPBM of each light blocking layer 220. The light blocking layers 220 are formed entirely, excluding the openings OPBM, and the color filters 230R, 230G, and 230B are not disposed on the light blocking layers 220, except for some area where some light blocking layer 220 and the color filters 230R, 230G, and 230B overlap. That is, a red color filter 230R is filled in a red pixel opening OPBM, a green color filter 230G is filled in a green pixel opening OPBM, and a blue color filter 230B is filled in a blue pixel opening OPBM among the openings OPBM of light blocking layers 220. However, depending on embodiments, the structure of the upper panel layer shown in FIG. 8 may be used.

Hereinafter, a detailed pixel structure according to an embodiment corresponding to FIG. 29 will be described in detail with reference to FIG. 31 to FIG. 44.

First, a planar structure will be described with reference to FIG. 31 to FIG. 43.

FIG. 31 to FIG. 43 illustrate a structure of each layer according to a manufacturing process of a lower panel layer of a light emitting display device according to another embodiment.

Figure 31:
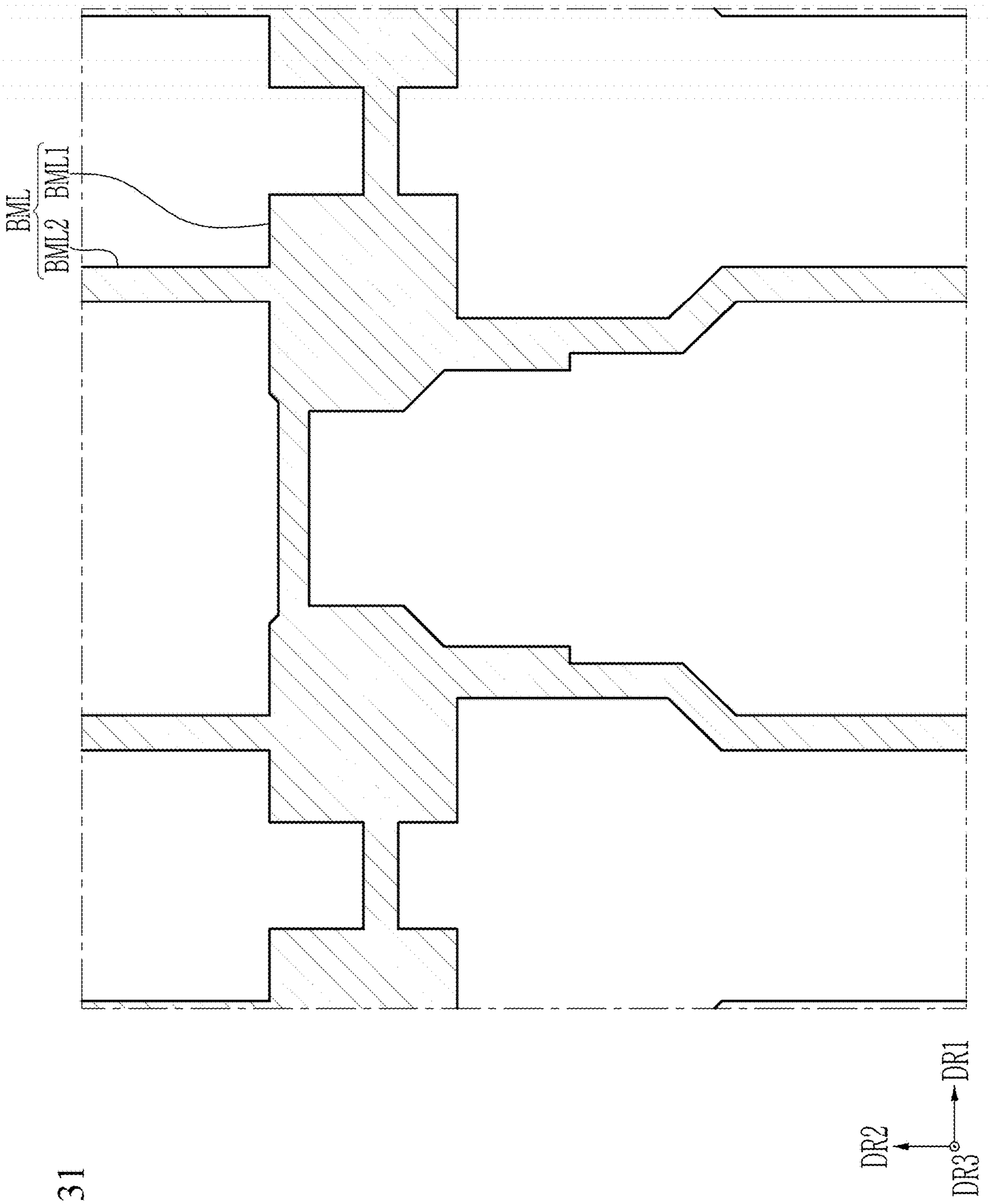
FIGS. 31, 32, 33, 34, 35, 36, 37, 38, 39, 40, 41, 42, and 43 illustrate a structure of each layer according to a manufacturing process of a lower panel layer of a light emitting display device according to another embodiment.

Referring to FIG. 31, a metal layer BML is disposed on a substrate 110.

The substrate 110 may include a material that does not bend due to a rigid characteristic such as glass, or a flexible material that can be bent, such as plastic or polyimide. In case of the flexible substrate, as shown in FIG. 44, the substrate 110 may have a two-layer structure of polyimide and a barrier layer formed of an inorganic insulating material thereon.

The metal layer BML includes a plurality of expansion portions BML1 and a connection portion BML2 that connects the plurality of expansion portions BML1 to each other. The expansion portion BML1 of the metal layer BML may be formed at a position that overlaps a channel 1132 of the driving transistor T1 among a first semiconductor layer, which will be described later, on a plane. The metal layer BML is also called a lower shielding layer, and may include a metal such as copper (Cu), molybdenum (Mo), aluminum (Al), titanium (Ti), and the like and may additionally include amorphous silicon, and may be formed of a single layer or multiple layers.

Figure 44:
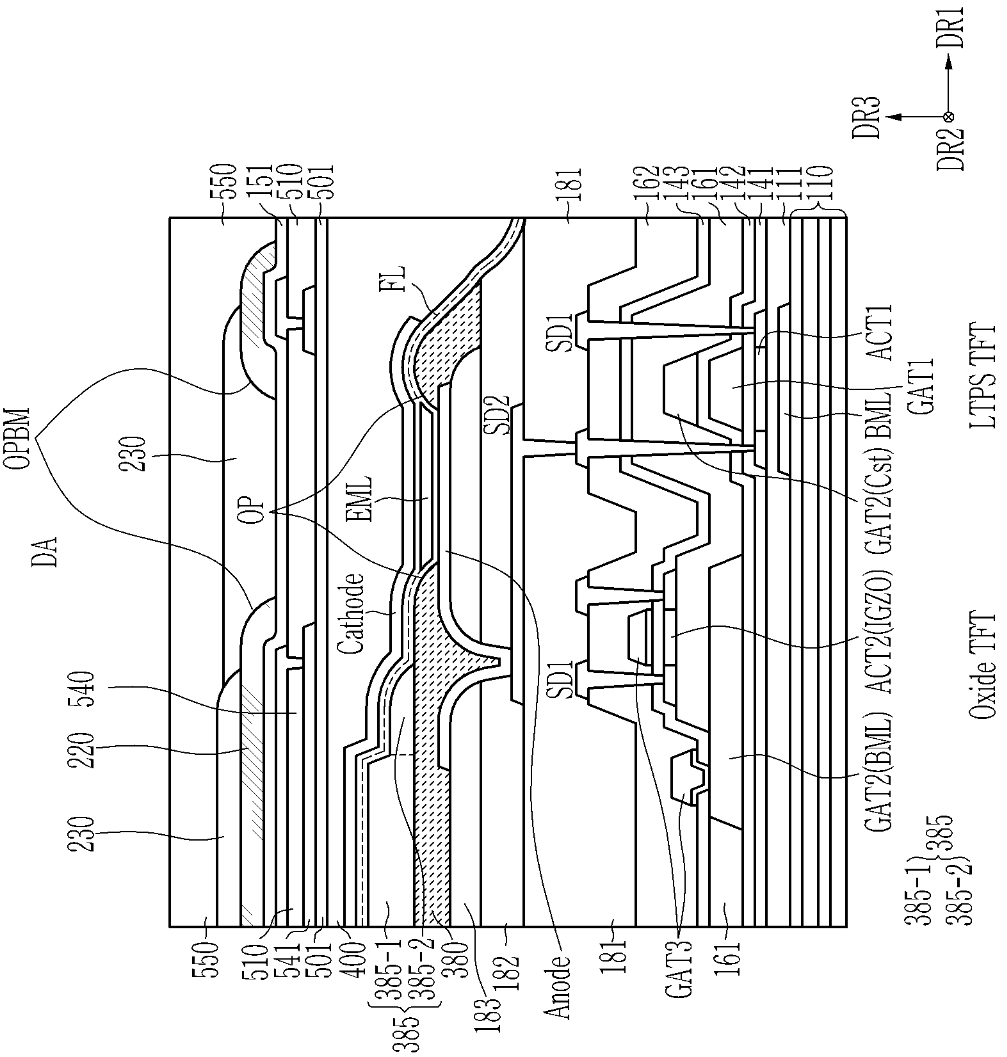
FIG. 44 is a cross-sectional view of the light emitting display device according to the embodiment.

Referring to FIG. 44, a buffer layer 111 is disposed on the substrate 110 and the metal layer BML, while covering the substrate 110 and the metal layer BML. The buffer layer 111 serves to prevent permeation of an impurity element to the first semiconductor layer 130, and may be an inorganic insulating layer including a silicon oxide ($SiO_X$), a silicon nitride ($SiN_X$), a silicon oxynitride ($SiO_XN_Y$), and the like.

Figure 32:
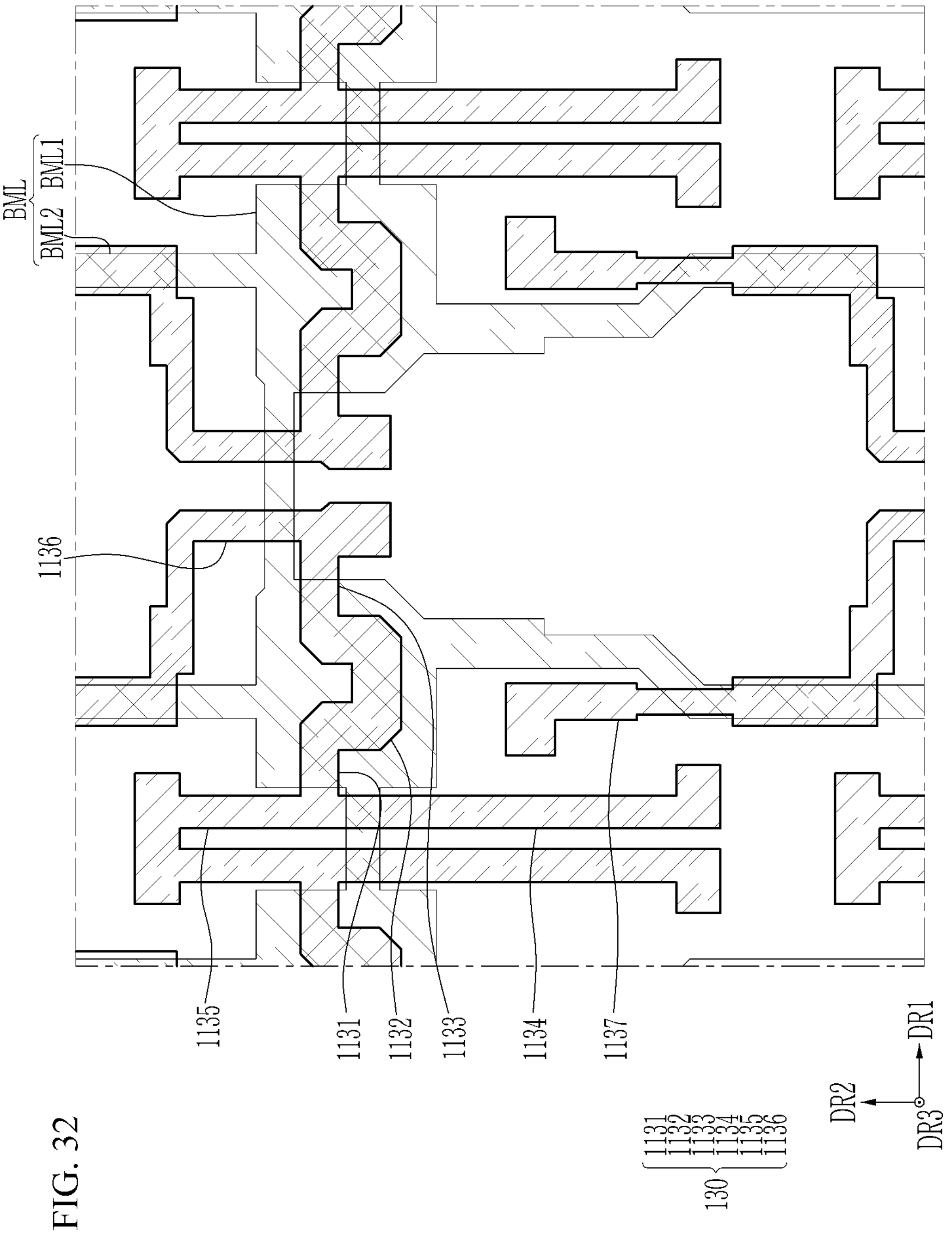

As shown in FIG. 32, the first semiconductor layer 130 formed of a silicon semiconductor (e.g., a polycrystalline semiconductor) is disposed on the buffer layer 111. The first semiconductor layer 130 includes the channel 1132, a first area 1131, and a second area 1133 of the driving transistor T1. In addition, the first semiconductor layer 130 includes not only the channel of the driving transistor T1 but also channels of a second transistor T2, a fifth transistor T5, a sixth transistor T6, and a seventh transistor T7, and includes a region having a conductive layer characteristic provided on both sides of each channel by plasma treatment or doping to serve as the first electrode and the second electrode.

The channel 1132 of the driving transistor T1 may have a curved shape on a plane. However, the shape of channel 1132 of the driving transistor T1 is not limited thereto, and may be variously changed. For example, the channel 1132 of the driving transistor T1 may be bent into a different shape or may have a bar shape. The first area 1131 and the second area 1133 of the driving transistor T1 may be disposed on both sides of the channel 1132 of the driving transistor T1. The first area 1131 and the second area 1133 disposed in the first semiconductor layer serve as the first electrode and the second electrode of the driving transistor T1.

In the first semiconductor layer 130, a channel, a first area, and a second area of the second transistor T2 are disposed in a portion 1134 extending downward from the first area 1131 of the driving transistor T1. A channel, a first area, and a second area of the fifth transistor T5 are disposed in a portion 1135 extending upward from the first area 1131 of the driving transistor T1. A channel, a first area, and a second area of the sixth transistor T6 are disposed in a portion 1136 extending upward from the second area 1133 of the driving transistor T1. A channel, a first area, and a second area of the seventh transistor T7 are disposed in a portion 1137 further extended while being bent at the portion 1136 of the first semiconductor layer 130.

Referring to FIG. 44, a first gate insulating layer 141 may be disposed on the first semiconductor layer 130 that includes the channel 1132, the first area 1131, and the second area 1133 of the driving transistor T1. The first gate insulating layer 141 may be an inorganic insulating layer including a silicon oxide ($SiO_X$), a silicon nitride ($SiN_X$), a silicon oxynitride ($SiO_XN_Y$), and the like.

Figure 33:
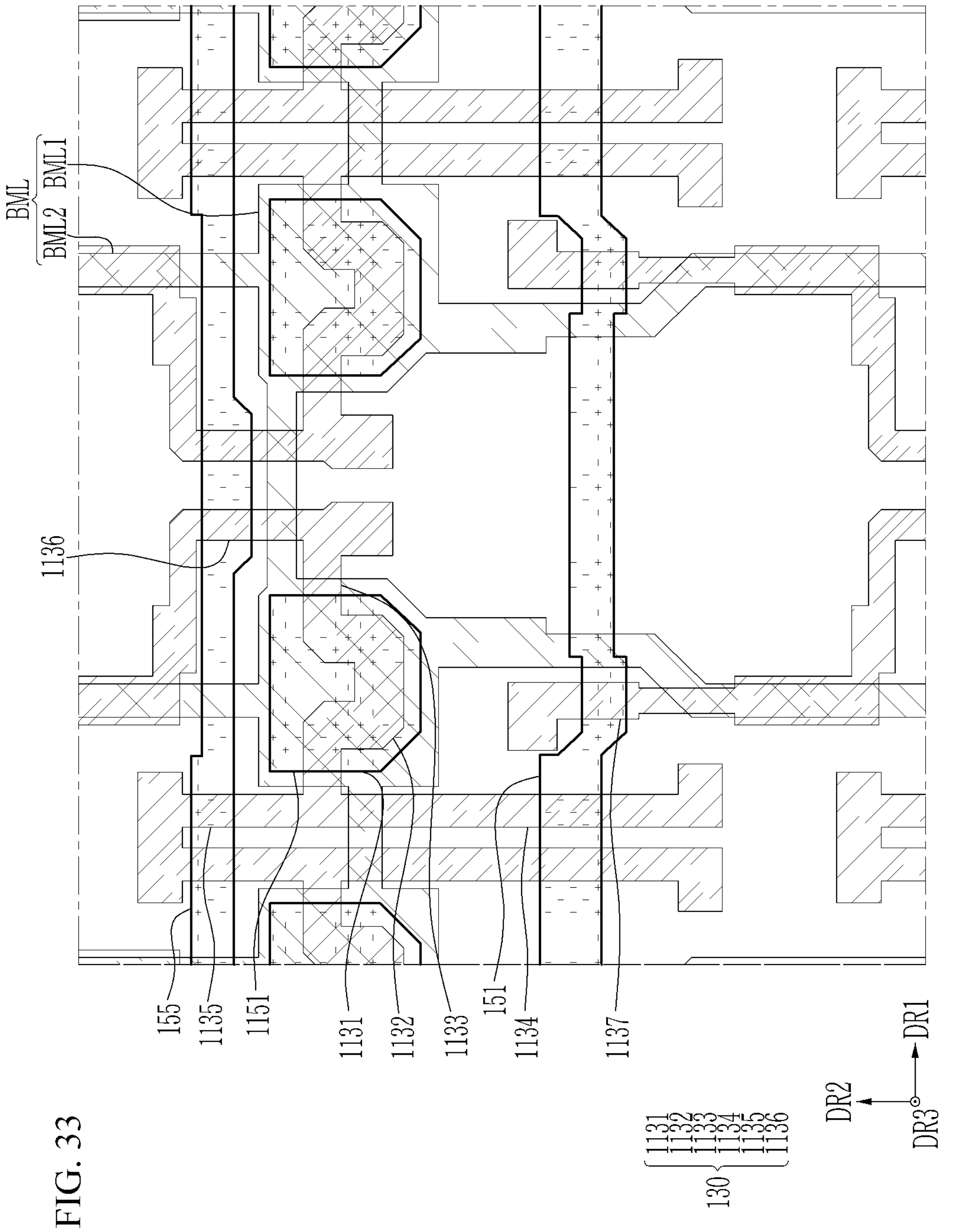

Referring to FIG. 33, a first gate conductive layer including a gate electrode 1151 of the driving transistor T1 may be disposed on the first gate insulating layer 141. The first gate conductive layer includes not only the gate electrode of the driving transistor T1 but also a gate electrode of each of the second transistor T2, the fifth transistor T5, the sixth transistor T6, and the seventh transistor T7. The gate electrode 1151 of the driving transistor T1 may overlap the channel 1132 of the driving transistor T1. The channel 1132 of the driving transistor T1 is covered by the gate electrode 1151 of the driving transistor T1.

The first gate conductive layer may further include the first scan line 151 and the light emission control line 155. The first scan line 151 and the light emission control line 155 may extend substantially in a horizontal direction (hereinafter also referred to as a first direction). The first scan line 151 may be connected with the gate electrode of the second transistor T2. The first scan line 151 may be integrally formed with the gate electrode of the second transistor T2. The first scan line 151 is also connected to a gate electrode of a seventh transistor T7 in the next pixel.

The light emission control line 155 may be connected with the gate electrode of the fifth transistor T5 and the gate electrode of the sixth transistor T6, and the light emission control line 155 and the gate electrodes of the fifth transistor T5 and sixth transistor T6 may be integrally formed.

The first gate conductive layer may include a metal such as copper (Cu), molybdenum (Mo), aluminum (Al), titanium (Ti), and the like, and may be formed of a single layer or multiple layers.

After forming the first gate conductive layer including the gate electrode 1151 of the driving transistor T1, a plasma treatment or doping process is carried out to make an exposed portion of the first semiconductor layer be conductive. That is, the first semiconductor layer covered by the first gate conductive layer does not become conductive, and a portion of the first semiconductor layer, not covered by the first gate conductive layer, may have the same characteristic as a conductive layer. Thus, the transistor including the conductive portion has a p-type transistor characteristic, and the driving transistor T1, the second transistor T2, the fifth transistor T5, the sixth transistor T6, and the seventh transistor T7 may be p-type or n-type transistors.

Referring to FIG. 44, a second gate insulating layer 142 may be disposed on the first gate conductive layer including the gate electrode 1151 of the driving transistor T1 and the first gate insulating layer 141. The second gate insulating layer 142 may be an inorganic insulating layer including a silicon oxide ($SiO_X$), a silicon nitride ($SiN_X$), a silicon oxynitride ($SiO_XN_Y$), and the like.

Figure 34:
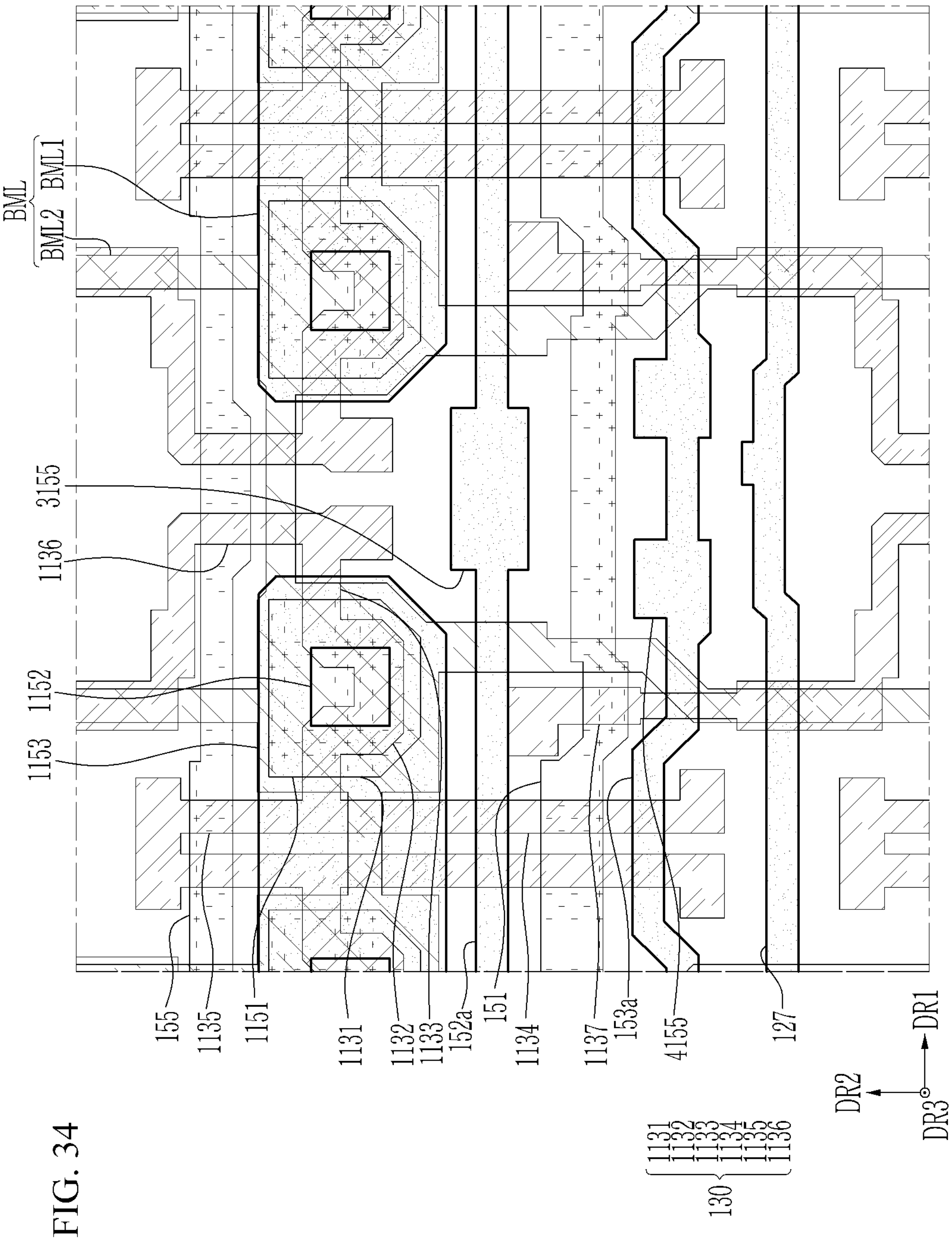

Referring to FIG. 34, a second gate conductive layer including a first storage electrode 1153 of the storage capacitor Cst, a lower shielding layer 3155 of the third transistor T3, and a lower shielding layer 4155 of the fourth transistor T4 on the second gate insulating layer 142 are shown. The lower shielding layers 3155 and 4155 are disposed in a lower portion of the channels of the third transistor T3 and the fourth transistor T4 to serve to shield from light or electromagnetic interference provided to the channel from the lower side.

The first storage electrode 1153 overlaps the gate electrode 1151 of the driving transistor T1 to form a storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The first storage electrode 1153 is extended in the horizontal direction (first direction) and is connected to the adjacent first storage electrode 1153.

The lower shielding layer 3155 of the third transistor T3 may overlap a gate electrode 3151 of the third transistor T3. The lower shielding layer 4155 of the fourth transistor T4 may overlap a channel 4137 and a gate electrode 4151 of the fourth transistor T4.

The second gate conductive layer may further include a lower second scan line 152*a*, a lower initialization control line 153*a*, and a first initialization voltage line 127. The lower second scan line 152*a*, the lower initialization control line 153*a*, and the first initialization voltage line 127 may extend substantially in the horizontal direction (first direction). The lower second scan line 152*a* may be connected with the lower shielding layer 3155 of the third transistor T3. The lower second scan line 152*a* may be integrally formed with the lower shielding layer 3155 of the third transistor T3. The lower initialization control line 153*a* may be connected with the lower shielding layer 4155 of the fourth transistor T4. The lower initialization control line 153*a* may be integrally formed with the lower shielding layer 4155 of the fourth transistor T4.

The second gate conductive layer GAT2 may include a metal such as copper (Cu), molybdenum (Mo), aluminum (Al), titanium (Ti), and the like, and may be formed of a single layer or multiple layers.

Referring to FIG. 44, a first interlayer insulating layer 161 may be disposed on the second gate conductive layer that includes the first storage electrode 1153 of the storage capacitor Cst, the lower shielding layer 3155 of the third transistor T3, and the lower shielding layer 4155 of the fourth transistor T4. The first interlayer insulating layer 161 may include an inorganic insulating layer including a silicon oxide ($SiO_X$), a silicon nitride ($SiN_X$), a silicon oxynitride ($SiO_XN_Y$), and the like, and an inorganic insulating material may be formed to be thick depending on embodiments.

Figure 35:
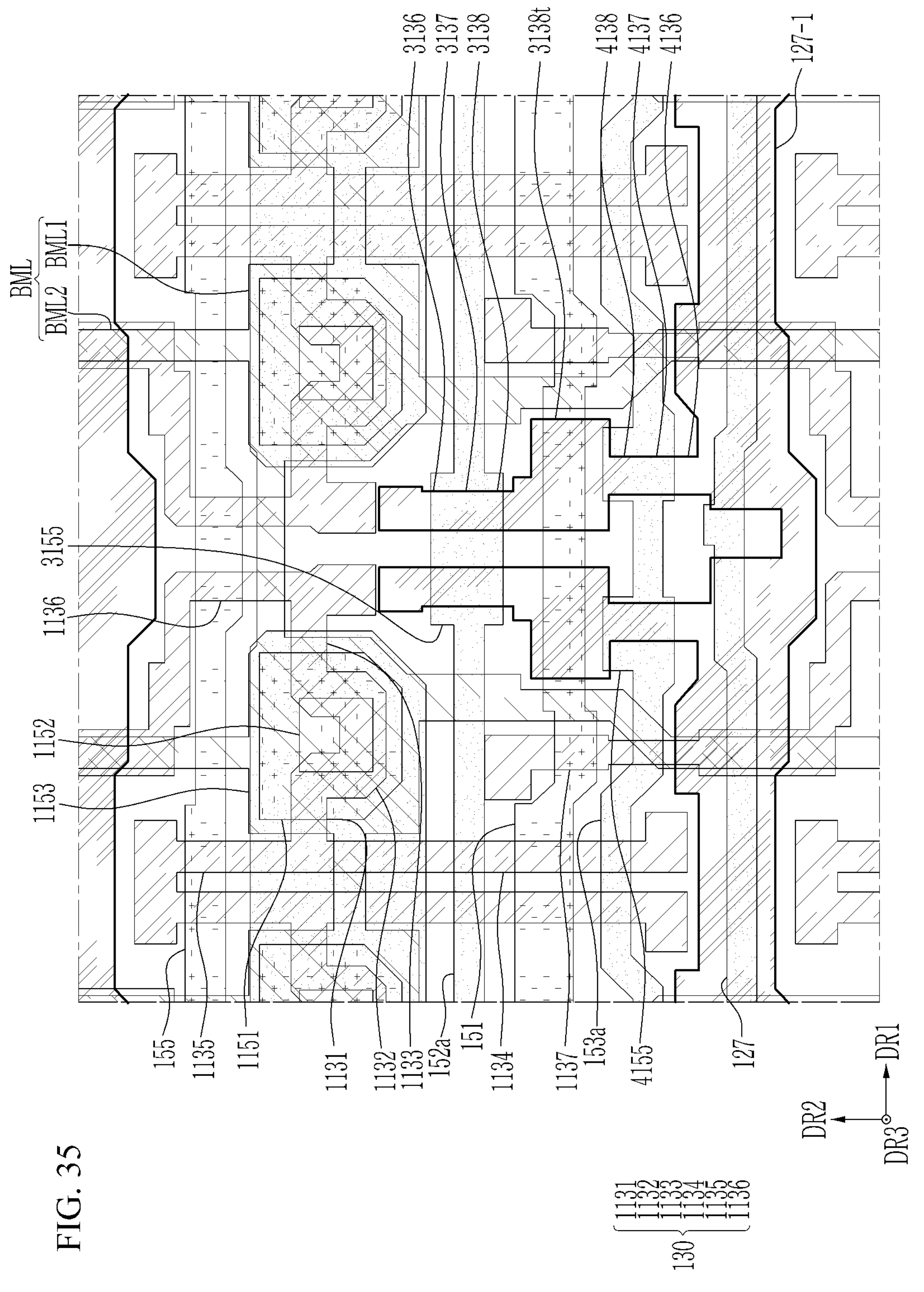

Referring to FIG. 35, an oxide semiconductor layer including the channel 3137, the first area 3136, and the second area 3138 of the third transistor T3, and a channel 4137, a first area 4136, and a second area 4138 of the fourth transistor T4, may be disposed on the first interlayer insulating layer 161. In addition, the oxide semiconductor layer may include an upper boost electrode 3138*t* of the capacitor $C_{boost}$. In addition, the oxide semiconductor layer may further include an extension portion 127-1 extended in the horizontal direction (first direction), and the extension portion 127-1 may be electrically connected with the first initialization voltage line 127.

The channel 3137, the first area 3136, and the second area 3138 of the third transistor T3, and the channel 4137, the first area 4136, and the second area 4138 of the fourth transistor T4, may be connected to each other and thus may be integrally formed with each other. The first area 3136 and the second area 3138 are disposed at opposite sides of the third transistor T3, and the first area 4136 and the second area 4138 of the fourth transistor T4 are disposed at opposite sides of the channel 4137 of the fourth transistor T4. The second area 3138 of the third transistor T3 is connected to the second area 4138 of the fourth transistor T4. The channel 3137 of the third transistor T3 overlaps the lower shielding layer 3155, and the channel 4137 of the fourth transistor T4 overlaps the lower shielding layer 4155.

The upper boost electrode 3138*t* of the capacitor $C_{boost}$ is disposed between the second area 3138 of the third transistor T3 and the second area 4138 of the fourth transistor T4. The upper boost electrode 3138*t* of the boost capacitor $C_{boost}$ overlaps a part of the first scan line 151 (also referred to as a lower boost electrode of the boost capacitor $C_{boost}$) such that the boost capacitor $C_{boost}$ is formed.

The extension portion 127-1 extended in the horizontal direction (first direction) is formed below the first area 4136 of the fourth transistor T4, and is electrically connected with the first area 4136 of the fourth transistor T4 of the adjacent pixel.

Referring to FIG. 44, a third gate insulating layer 143 may be disposed on the oxide semiconductor layer that includes the channel 3137, the first area 3136, and the second area 3138 of the third transistor T3, the channel 4137, the first area 4136, and the second area 4138 of the fourth transistor T4, the upper boost electrode 3138*t* of the boost capacitor $C_{boost}$, and the extension portion 127-1.

The third gate insulating layer 143 may be disposed over all of the oxide semiconductor layer and the first interlayer insulating layer 161. Thus, the third gate insulating layer 143 may cover top and side surfaces of the channel 3137, the first area 3136, and the second area 3138 of the third transistor T3, the channel 4137, the first area 4136, and the second area 4138 of the fourth transistor T4, the upper boost electrode 3138*t* of the boost capacitor $C_{boost}$, and the extension portion 127-1. However, the inventive concepts are not limited thereto, and the third gate insulating layer 143 may not be disposed over all of the oxide semiconductor layer and the first interlayer insulating layer 161. For example, the third gate insulating layer 143 may overlap the channel 3137 of the third transistor T3, and may not overlap the first area 3136 and the second area 3138. In addition, the third gate insulating layer 143 overlaps the channel 4137 of the fourth transistor T4, and may not overlap the first area 4136 and the second area 4138.

The third gate insulating layer 143 may be an inorganic insulating layer including a silicon oxide ($SiO_X$), a silicon nitride ($SiN_X$), a silicon oxynitride ($SiO_XN_Y$), and the like.

Figure 36:
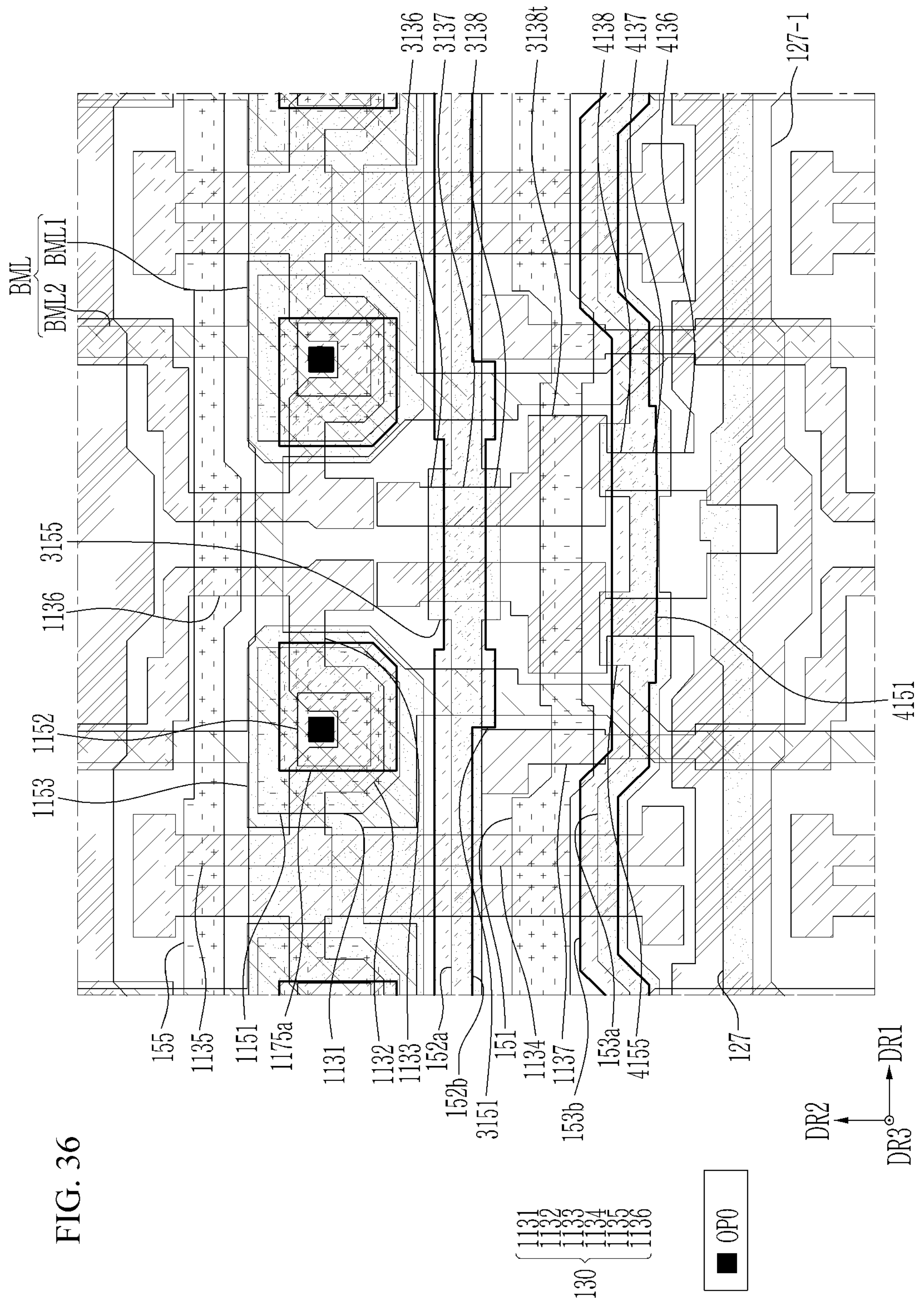

Referring to FIG. 36, a third gate conductive layer including the gate electrode 3151 of the third transistor T3 and the gate electrode 4151 of the fourth transistor T4 may be disposed on the third gate insulating layer 143.

The gate electrode 3151 of the third transistor T3 may overlap the channel 3137 of the third transistor T3. The gate electrode 3151 of the third transistor T3 may overlap the lower shielding layer 3155 of the third transistor T3.

The gate electrode 4151 of the fourth transistor T4 may overlap the channel 4137 of the fourth transistor T4. The gate electrode 4151 of the fourth transistor T4 may overlap the lower shielding layer 4155 of the fourth transistor T4.

The third gate conductive layer may further include an upper second scan line 152*b* and an upper initialization control line 153*b*.

The upper second scan line 152*b* and the upper initialization control line 153*b* may extend substantially in the horizontal direction (first direction). The upper second scan line 152*b* forms the second scan line 152 together with the lower second scan line 152*a*. The upper second scan line 152*b* may be connected with the gate electrode 3151 of the third transistor T3. The upper second scan line 152*b* may be integrally formed with the gate electrode 3151 of the third transistor T3. The upper initialization control line 153*b* and the lower initialization control line 153*a* form the initialization control line 153. The upper initialization control line 153*b* may be connected with the gate electrode 4151 of the fourth transistor T4. The upper initialization control line 153*b* may be integrally formed with the gate electrode 4151 of the fourth transistor T4.

In addition, the third gate conductive layer may further include a connection portion 1175*a*. The connection portion 1175*a* is electrically connected with the gate electrode 1151 of the driving transistor T1 through an opening OP0 formed in the third gate insulating layer 143, the first interlayer insulating layer 161, and the second gate insulating layer 142. In this case, the opening OP0 may be connected with the gate electrode 1151 of the driving transistor T1 in a portion overlapping the opening 1152 disposed in the first storage electrode 1153.

The third gate conductive layer GAT3 may include a metal such as copper (Cu), molybdenum (Mo), aluminum (Al), titanium (Ti), and the like, and may be formed of a single layer or multiple layers.

After forming the third gate conductive layer including the gate electrode 3151 of the third transistor T3 and the gate electrode 4151 of the fourth transistor T4, a plasma treatment or doping process is carried out such that a portion of the oxide semiconductor layer, covered by the third gate conductive layer, is formed as a channel, and a portion of the oxide semiconductor layer, not covered by the third gate conductive layer, becomes conductive. The channel 3137 of the third transistor T3 may be disposed below the gate electrode 3151 to be overlapped with the gate electrode 3151. The first area 3136 and the second area 3138 of the third transistor T3 may not overlap the gate electrode 3151. The channel 4137 of the fourth transistor T4 may be disposed below the gate electrode 4151 so as to overlap the gate electrode 4151. The first area 4136 and the second area 4138 of the fourth transistor T4 may not overlap the gate electrode 4151. The upper boost electrode 3138*t* and the extension portion 127-1 may not overlap the third gate conductive layer. A transistor including the oxide semiconductor layer may have a characteristic of an n-type transistor.

Referring to FIG. 44, a second interlayer insulating layer 162 may be disposed on the third gate conductive layer including the gate electrode 3151 of the third transistor T3 and the gate electrode 4151 of the fourth transistor T4. The second interlayer insulating layer 162 may have a single-layered or multi-layered structure. The second interlayer insulating layer 162 may include an inorganic insulating material such as a silicon nitride ($SiN_X$), a silicon oxide ($SiO_X$), a silicon oxynitride ($SiO_XN_Y$), and the like, and depending on embodiments, it may include an organic material.

Figure 37:
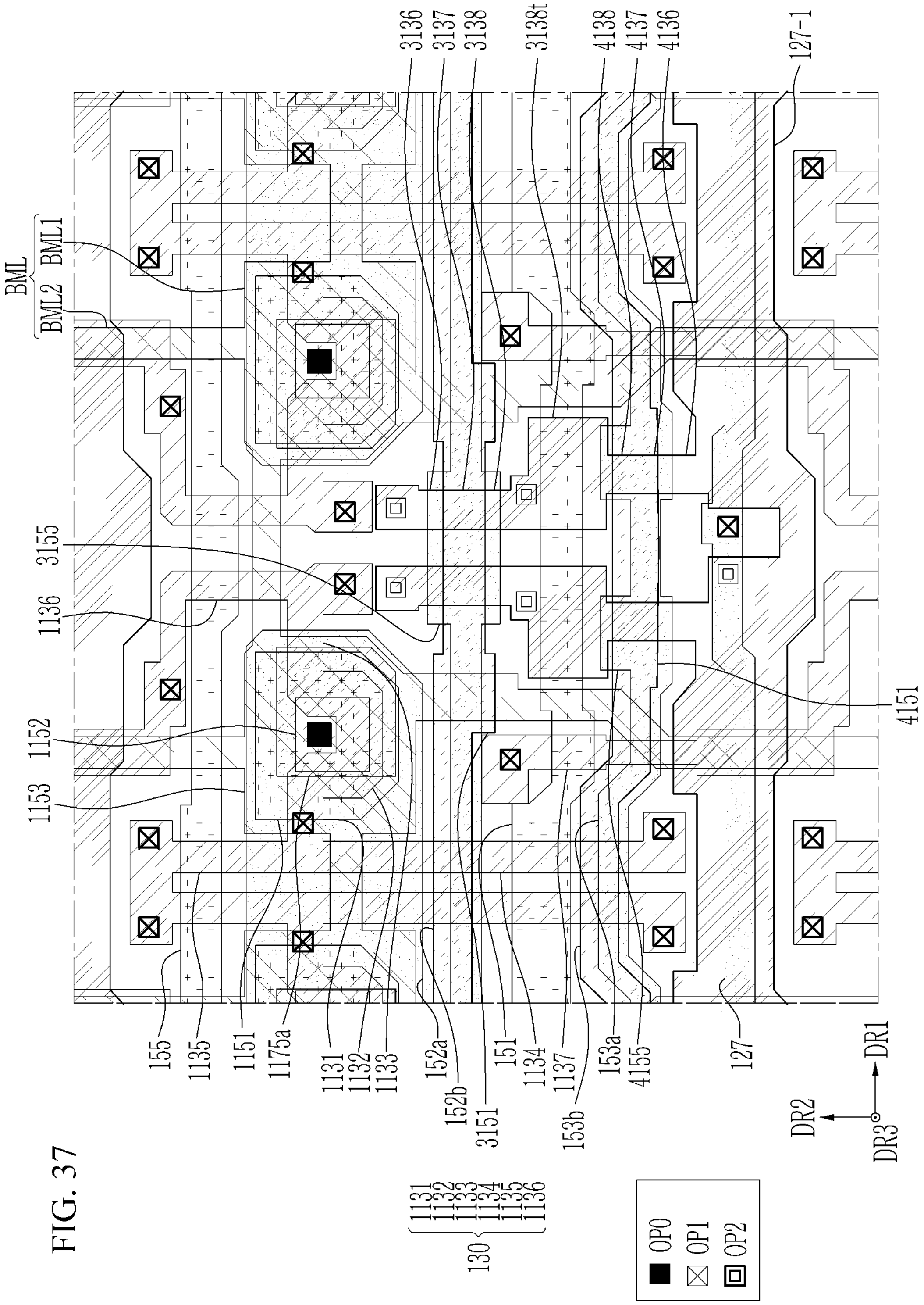

Referring to FIG. 37, the second interlayer insulating layer 162 may include two types of openings OP1 and OP2. The two types of the openings OP1 and OP2 may be formed using different masks.

The opening OP1 forms an opening in at least one of the second interlayer insulating layer 162, the third gate insulating layer 143, the first interlayer insulating layer 161, the second gate insulating layer 142, and the first gate insulating layer 141, and may expose the first semiconductor layer 130, the first gate conductive layer, or the second gate conductive layer.

The opening OP2 forms an opening in the second interlayer insulating layer 162 and/or the third gate insulating layer 143, and may expose the oxide semiconductor layer or the third gate conductive layer.

One of the openings OP1 overlaps at least a portion of the gate electrode 1151 of the driving transistor T1, and may also be formed in the third gate insulating layer 143, the first interlayer insulating layer 161, and the second gate insulating layer 142. In this case, one of the openings OP1 may overlap the opening 1152 of the first storage electrode 1153, and may be disposed inside the opening 1152 of the first storage electrode 1153.

One of the openings OP2 may overlap at least partially with the boost capacitor $C_{boost}$, and may be further formed on the third gate insulating layer 143.

Another one of the openings OP1 overlaps at least a part of the second area 1133 of the driving transistor T1, and the third opening 3165 may be formed in the third gate insulating layer 143, the first interlayer insulating layer 161, the second gate insulating layer 142, and the first gate insulating layer 141.

Another one of the openings OP2 overlaps at least a part of the first area 3136 of the third transistor T3 and may be formed in the third gate insulating layer 143.

Figure 39:
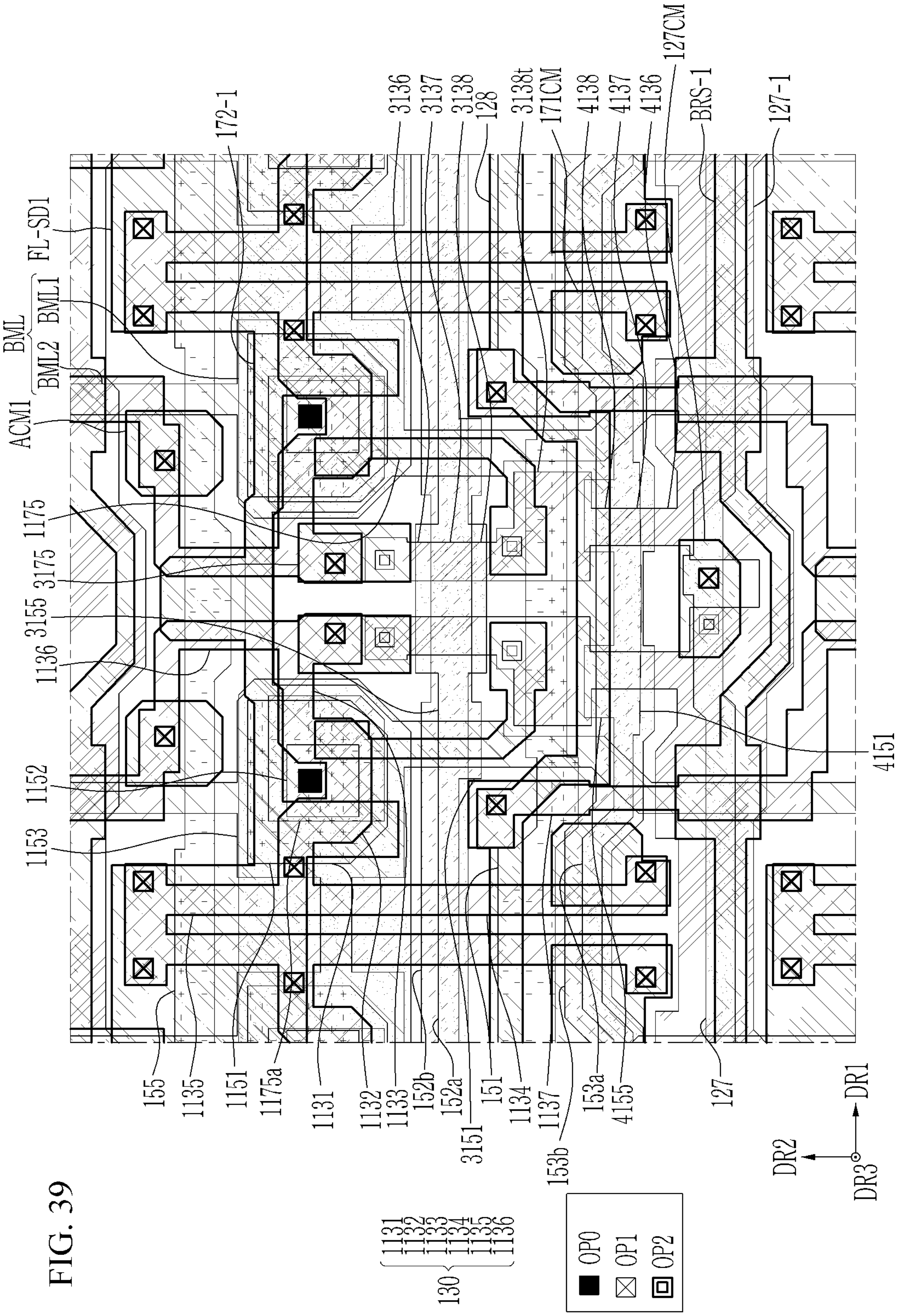

Referring to FIG. 38 and FIG. 39, a first data conductive layer including a first connection electrode 1175 and a second connection electrode 3175 may be disposed on the second interlayer insulating layer 162. It may be difficult to easily recognize the first data conductive layer in FIG. 39, and thus FIG. 38 illustrates only the first data conductive layer and the openings OP1 and OP2 as a top plan view, and FIG. 39 is a top plan view illustrating all the layers below the first data conductive layer.

The first connection electrode 1175 may overlap the gate electrode 1151 of the driving transistor T1. The first connection electrode 1175 may be connected with the gate electrode 1151 of the driving transistor T1 through the opening OP1 and the opening 1152 of the first storage electrode 1153. The first connection electrode 1175 may overlap the boost capacitor $C_{boost}$. The first connection electrode 1175 may be connected with the upper boost electrode 3138*t* of the boost capacitor $C_{boost}$ through the opening OP2. Accordingly, the gate electrode 1151 of the driving transistor T1 and the upper boost electrode 3138*t* of the boost capacitor $C_{boost}$ can be connected by the first connection electrode 1175. In this case, the gate electrode 1151 of the driving transistor T1 may also be connected with the second area 3138 of the third transistor T3 and the second area 4138 of the fourth transistor by the first connection electrode 1175.

The second connection electrode 3175 may overlap the second area 1133 of the driving transistor T1. The second connection electrode 3175 may be connected with the second area 1133 of the driving transistor T1 through the opening OP1. The second connection electrode 3175 may overlap the first area 3136 of the third transistor T3. The second connection electrode 3175 may be connected with the first area 3136 of the third transistor T3 through the opening OP2. Thus, the second area 1133 of the driving transistor T1 and the first area 3136 of the third transistor T3 may be connected by the second connection electrode 3175.

The first data conductive layer may further include a second initialization voltage line 128*b*. The second initialization voltage line 128 extends in a horizontal direction (first direction). The second initialization voltage line 128 is electrically connected with a portion 1137 of the first semiconductor layer 130 through the opening OP1.

The first data conductive layer may further include connection portions 127CM and 171CM, an anode connecting part ACM1, an expansion portion FL-SD1, and a first additional signal wire BRS-1.

The connection portion 127CM is connected with the first initialization voltage line 127 of the second gate conductive layer through the opening OP1, and is connected with a portion 4136 of the second semiconductor layer (oxide semiconductor layer) through the opening OP2 such that the first initialization voltage Vint flowing through the first initialization voltage line 127 is transmitted to the fourth transistor T4 of the oxide semiconductor layer.

The connection portion 171CM is electrically connected with a portion 1137 of the first semiconductor layer 130, that is, the second transistor T2, through the opening OP1.

The anode connecting part ACM1 is electrically connected with a portion 1136 of the first semiconductor layer 130, that is, the sixth transistor T6, through the opening OP1.

The expansion portion FL-SD1 is formed wide in order to flatten the anode disposed thereon. In addition, the expansion portion FL-SD1 is connected with a portion 1135 of the first semiconductor layer 130, that is, the fifth transistor T5, through the opening OP1, and is electrically connected with the first storage electrode 1153 through the opening OP1. In addition, the expansion portion FL-SD1 has an extension portion 172-1 extending in a horizontal direction (first direction) and thus the left and right adjacent expansion portions FL-SD1 are connected to each other.

The first additional signal wire BRS-1 has a structure that extends in the horizontal direction (first direction). An extended portion exists in the first additional signal wire BRS-1, and the portion is formed to be electrically connected to the additional signal wire BRS if necessary.

The first data conductive layer SD1 may include a metal such as aluminum (Al), copper (Cu), molybdenum (Mo), titanium (Ti), or a metal alloy thereof, and may be formed as a single layer or multiple layers.

Referring to FIG. 44, a first organic layer 181 may be disposed on a first data conductive layer that includes a first connection electrode 1175 and a second connection electrode 3175. The first organic layer 181 may be an organic insulating layer including an organic material, and the organic material may include at least one material selected from a group consisting of polyimide, polyamide, acryl resin, benzocyclobutene, and phenol resin.

Figure 41:
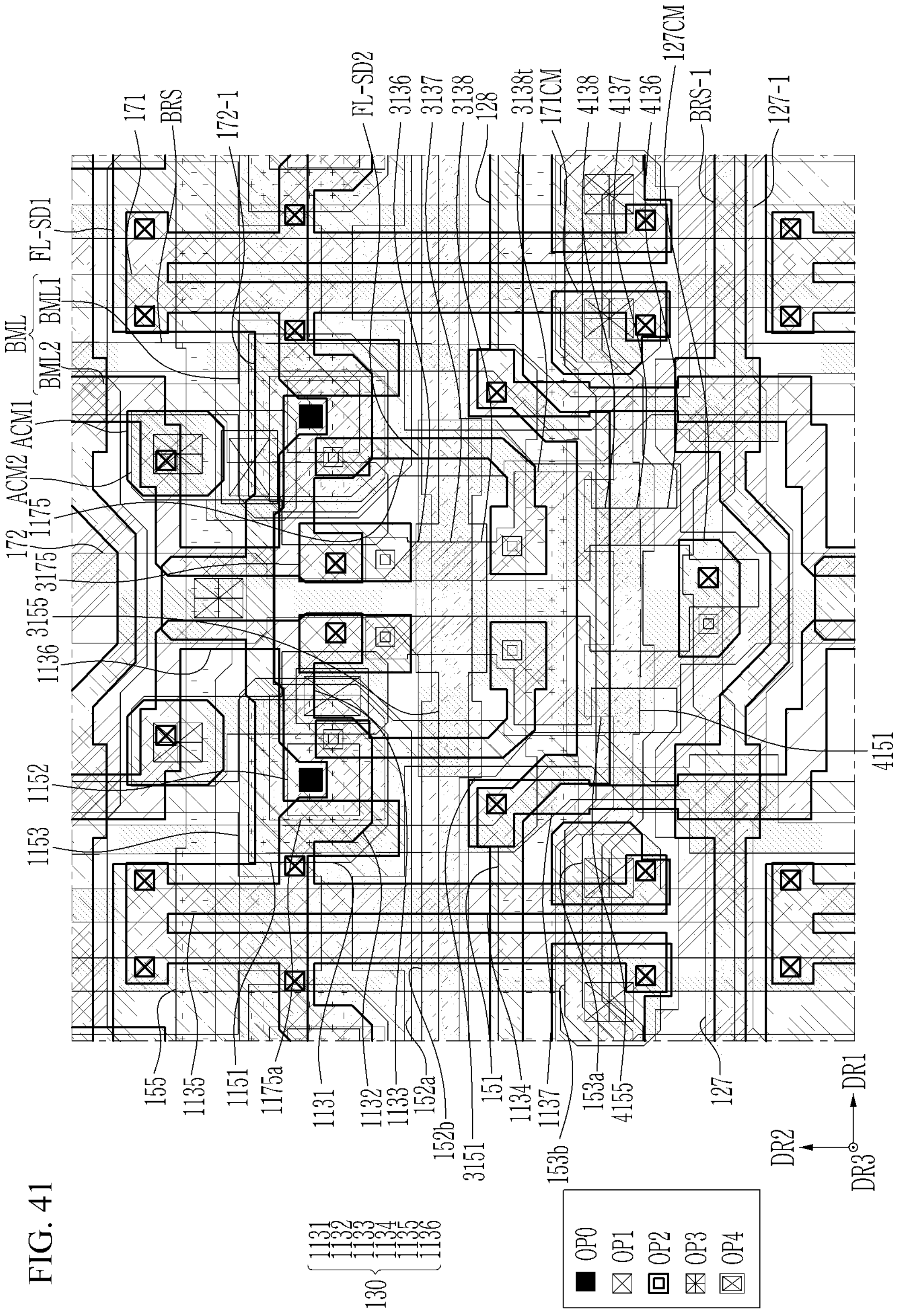

Referring to FIG. 40, FIG. 41, and FIG. 44, an opening OP3 is formed in the first organic layer 181. A second data conductive layer including the data line 171, the driving voltage line 172, the anode connecting part ACM2, and the additional signal wire BRS may be disposed on the first organic layer 181. The second organic layer 182 and the third organic layer 183 are disposed on the second data conductive layer, and openings OP4 are formed in the second organic layer 182 and the third organic layer 183. The anode connecting part ACM2 is electrically connected with the anode through the opening OP4. It may be difficult to easily recognize the second data conductive layer in FIG. 41, and thus FIG. 40 illustrates only the second data conductive layer and the openings OP3 and OP4 as a top plan view, and FIG. 41 is a top plan view illustrating the second data conductive layer and all the peripheral layers.

Referring to FIG. 40 and FIG. 41, the opening OP3 overlaps the connection portion 171CM, the anode connecting part ACM1, and the expansion portion FL-SD1 disposed in the first data conductive layer and thus expose them, respectively.

The second data conductive layer may include the data line 171, the driving voltage line 172, the anode connecting part ACM2, and the additional signal wire BRS.

The data line 171 and the driving voltage line 172 may extend substantially in the vertical direction (second direction). The data line 171 is connected with the connection portion 171CM of the first data conductive layer through the opening OP3, and is connected with the second transistor T2 therethrough. The driving voltage line 172 is electrically connected with an extension portion 172-1 that connects the expansion portion FL-SD1 of the first data conductive layer through the opening OP3, and is also connected with the expansion portion FL-SD1 through the expansion portion FL-SD1. In addition, the driving voltage line 172 is electrically connected with the fifth transistor T5 and the first storage electrode 1153 through the expansion portion FL-SD1. The anode connecting part ACM2 is electrically connected with the anode connecting part ACM1 through the opening OP3, and is electrically connected with the sixth transistor T6.

The additional signal wire BRS extends in the vertical direction (second direction), and includes an expanded portion. The extended portions of the additional signal wire BRS and the first additional signal wire BRS-1 overlap each other on a plane and are formed to be electrically connected to each other when necessary. A role of the additional signal wire will be described in detail with reference to FIG. 45.

Referring to FIG. 40, the driving voltage line 172 further includes an expansion portion FL-SD2. The expansion portion FL-SD2 is formed wide in order to flatten the anode disposed thereon.

The anode has a flattening characteristic due to the structure under the anode as described above (expansion portion FL-SD1 and second initialization voltage line 128 of the first data conductive layer, and expansion portion FL-SD2 of the second data conductive layer, the data line 171, the additional signal wire BRS, and the organic layers 181, 182, and 183).

In the present embodiment, the expansion portion FL-SD1 and the expansion portion FL-SD2 are electrically connected with the driving voltage line 172 and thus a driving voltage ELVDD is transmitted.

The second data conductive layer SD2 may include a metal such as aluminum (Al), copper (Cu), molybdenum (Mo), titanium (Ti), and the like or a metal alloy thereof, and may be formed as a single layer or multiple layers.

Referring to FIG. 44, the second organic layer 182 and the third organic layer 183 are disposed on the second data conductive layer. The second organic layer 182 and the third organic layer 183 may be organic insulating layers, and may include at least one material selected from a group consisting of polyimide, polyamide, acryl resin, benzocyclobutene, and phenol resin. Depending on embodiments, the third organic layer 183 can be omitted.

Openings OP4 are formed in the second organic layer 182 and the third organic layer 183, and the anode and the anode connecting part ACM2 are electrically connected with the opening OP4.

Figure 42:
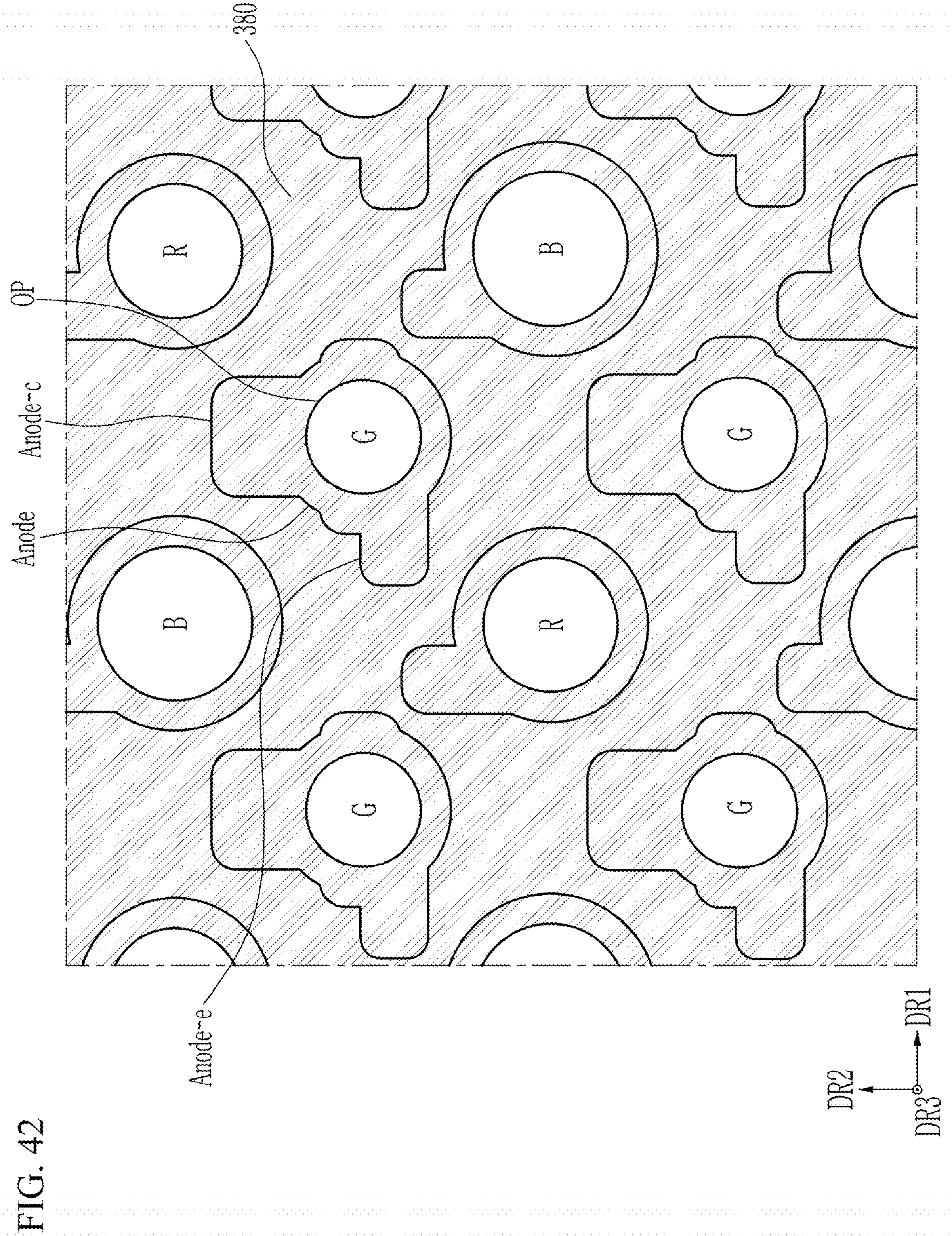

Referring to FIG. 42, the anode Anode is formed on the third organic layer 183. The anode Anode may further include an extension portion Anode-e to receive a current from a pixel circuit portion through the opening OP4. In addition, in the embodiment of FIG. 42, an additional expansion portion Anode-c is further formed in the anode Anode. This may be a portion to cover a part of the lower pixel circuit by extending the anode Anode. Thereby, it can play a role of catching voltage fluctuations of the corresponding node.

Referring to FIG. 42 and FIG. 44, the black pixel defining layer 380 is disposed on the anode Anode, and the opening OP of the black pixel defining layer 380 is formed to overlap the anode Anode.

Figure 43:
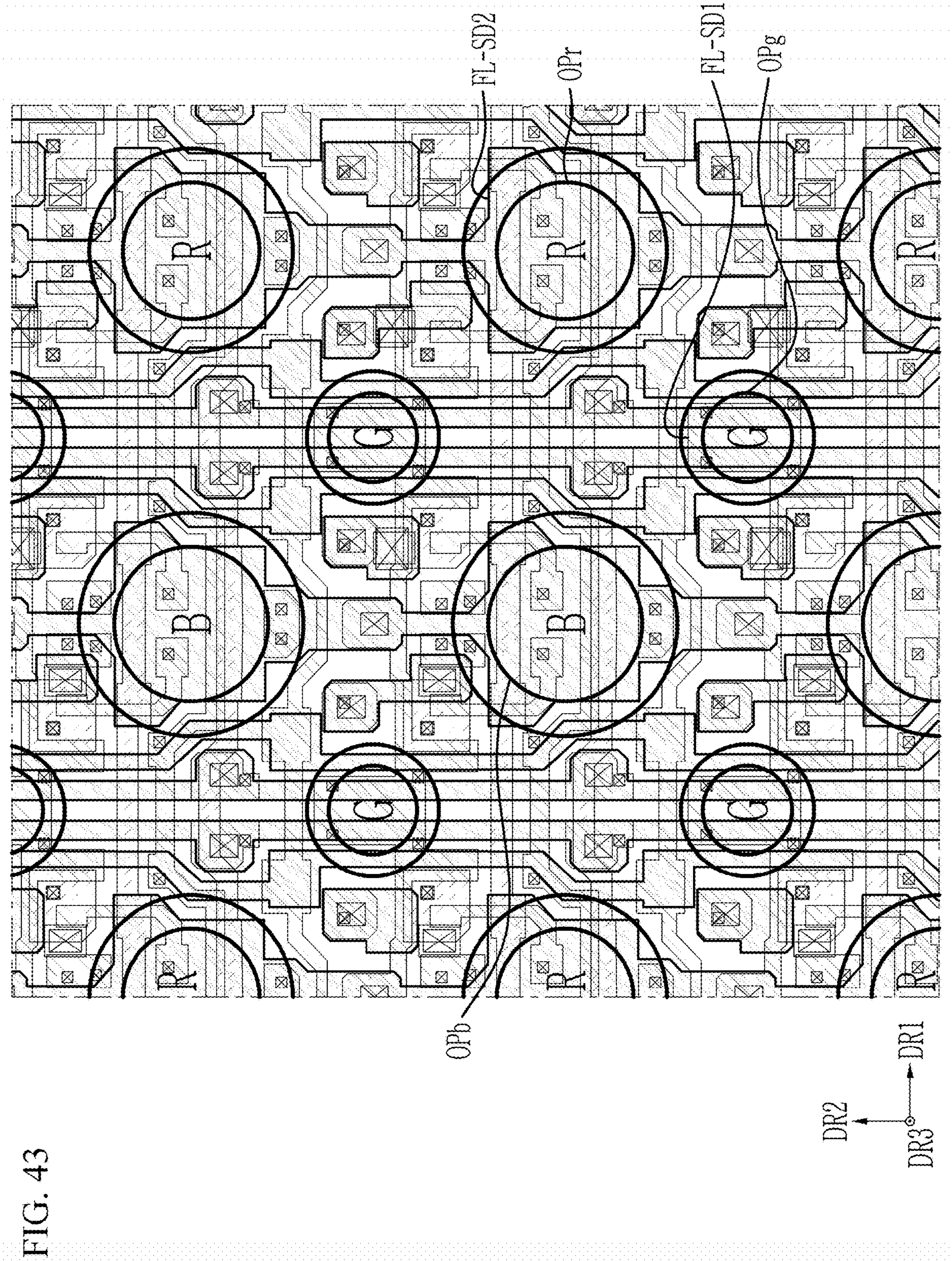

A structure in which the above structures are stacked as a whole is shown in FIG. 43. In the present embodiment, as briefly described with reference to FIG. 29, a portion of the anode Anode, exposed through at least the opening OP of the black pixel defining layer 380, can be flattened by the expansion portion FL-SD1 of the first data conductive layer and the expansion portion FL-SD2 of the second data conductive layer disposed below the anode Anode. More specifically, the anode has a flatness characteristic by the expansion portion FL-SD1 of the first data conductive layer, the expansion portion FL-SD2 of the second data conductive layer, the data line 171, the wiring portion 172-*e*, and the organic layers 181, 182, and 183. In addition, at least a part of the opening OP of the black pixel defining layer 380 may not overlap with the expansion portions FL-SD1 and FL-SD2, but due to a structure of the wiring portion (e.g., additional signal wire BRS), the anode Anode can be flattened even at the edge portion thereof.

Based on such a planar structure, the entire cross-sectional structure of the light emitting display device will be described with reference to FIG. 44.

FIG. 44 is a cross-sectional view of the light emitting display device according to the embodiment.

In FIG. 44, a layered structure of the light transmissive area LTA of the first element area DA2 is also illustrated in addition to the layered structure of the display area DA.

First, referring to FIG. 44, a detailed layered structure of a pixel of the display area DA will be described. Here, the display area DA may be a layered structure of a pixel disposed in a main display area DA1 (also referred to as a first display area) and a component area DA2 (also referred to as a first element area).

A substrate 110 may include a material having a rigid characteristic such as glass and the like and thus not being bendable, or a flexible material that can be bent such as plastic or polyimide. FIG. 44 illustrates a flexible substrate, and the substrate 110 may have a two-layer structure of polyimide and a barrier layer formed of an inorganic insulating material thereon.

A metal layer BML is disposed on the substrate 110, and the metal layer BML is disposed in an area overlapping a channel of a first semiconductor layer ACT1. The metal layer BML is also called a lower shielding layer, and may include a metal such as copper (Cu), molybdenum (Mo), aluminum (Al), titanium (Ti), and the like, and may be formed of a single layer or multiple layers. A buffer layer 111 may be disposed on the metal layer BML to cover the metal layer BML, and the buffer layer 111 serves to prevent permeation of an impurity element to the first semiconductor layer 130, and may be an inorganic insulating layer including a silicon oxide ($SiO_X$), a silicon nitride ($SiN_X$), a silicon oxynitride ($SiO_XN_Y$), and the like.

The first semiconductor layer ACT1 is disposed on the buffer layer 111. The first semiconductor layer ACT1 includes a channel area, and a first area and a second area that are disposed at opposite sides of the channel area.

The first gate insulating layer 141 may be disposed to cover the first semiconductor layer ACT1 or overlap only the channel area of the first semiconductor layer ACT1. The first gate insulating layer 141 may be an inorganic insulating layer including a silicon oxide ($SiO_X$), a silicon nitride ($SiN_X$), a silicon oxynitride ($SiO_XN_Y$), and the like.

A first gate conductive layer GAT1 is disposed on the first gate insulating layer 141, and the first gate conductive layer GAT1 includes a gate electrode of a transistor LTPS TFT including a silicon semiconductor. The first gate conductive layer GAT1 may include a metal such as copper (Cu), molybdenum (Mo), aluminum (Al), titanium (Ti), and the like, and may be formed of a single layer or multiple layers. An area of the first semiconductor layer ACT1, overlapping the gate electrode on a plane, may be the channel area. In addition, the gate electrode may serve as one electrode of a storage capacitor.

The first gate conductive layer GAT1 is covered by the second gate insulating layer 142, and the second gate insulating layer 142 may be an inorganic insulating layer including a silicon oxide ($SiO_X$), a silicon nitride ($SiN_X$), a silicon oxynitride ($SiO_XN_Y$), and the like.

A second gate conductive layer GAT2 is disposed on the second gate insulating layer 142, and the second gate conductive layer GAT2 may include a first storage electrode that forms the storage capacitor by overlapping the gate electrode and a lower shielding layer for an oxide semiconductor transistor disposed below the oxide semiconductor layer ACT2. The second gate conductive layer GAT2 may include a metal such as copper (Cu), molybdenum (Mo), aluminum (Al), titanium (Ti), and the like, and may be formed of a single layer or multiple layers.

The second gate conductive layer GAT2 is covered by the first interlayer insulating layer 161, and first interlayer insulating layer 161 may include an inorganic insulating layer including a silicon oxide ($SiO_X$), a silicon nitride ($SiN_X$), a silicon oxynitride ($SiO_XN_Y$), and the like.

The oxide semiconductor layer ACT2 is disposed on the first interlayer insulating layer 161, and the oxide semiconductor layer ACT2 includes a channel area, and a first area and a second area disposed at opposite sides of the channel area.

The oxide semiconductor layer ACT2 is covered by the third gate insulating layer 143, and the third gate insulating layer 143 may include an inorganic insulating layer including a silicon oxide ($SiO_X$), a silicon nitride ($SiN_X$), a silicon oxynitride ($SiO_XN_Y$), and the like.

The third gate insulating layer 143 and the first interlayer insulating layer 161 may include an opening that overlaps a part of the lower shielding layer for the oxide semiconductor transistor of the second gate conductive layer GAT2.

A third gate conductive layer GAT3 is disposed on the third gate insulating layer 143, and the third gate conductive layer GAT3 includes a connecting part that is connected with the gate electrode of the oxide semiconductor transistor and the lower shielding layer of the oxide semiconductor transistor. The third gate conductive layer GAT3 may include a metal such as copper (Cu), molybdenum (Mo), aluminum (Al), titanium (Ti), and the like, and may be formed of a single layer or multiple layers.

The third gate conductive layer GAT3 is covered by the second interlayer insulating layer 162, and the second interlayer insulating layer 162 may include an inorganic insulating layer including a silicon oxide ($SiO_X$), a silicon nitride ($SiN_X$), a silicon oxynitride ($SiON_X$), and the like, and may include an organic material depending on embodiments.

A second interlayer insulating layer 162 and an insulating layer disposed below the second interlayer insulating layer 162 may include an opening that overlaps the first semiconductor layer ACT1 and the oxide semiconductor layer ACT2.

A first data conductive layer SD1 is disposed on the second interlayer insulating layer 162, and the first data conductive layer SD1 includes a connecting part to provide a voltage or a current to the first semiconductor layer ACT1 and the oxide semiconductor layer ACT2 or transmits the voltage or current to other elements. The first data conductive layer SD1 may include a metal such as aluminum (Al), copper (Cu), molybdenum (Mo), titanium (Ti), and the like or a metal alloy thereof, and may be formed as a single layer or multiple layers.

The first data conductive layer SD1 is covered by a first organic layer 181. The first organic layer 181 may be an organic insulating layer including an organic material, and the organic material may include at least one material selected from a group consisting of polyimide, polyamide, acryl resin, benzocyclobutene, and phenol resin.

The first organic layer 181 may include an opening overlapping the first data conductive layer SD1, and a second data conductive layer SD2 is disposed on the first organic layer 181. The second data conductive layer SD2 may be connected with the first conductive layer SD1 through the opening. The second data conductive layer SD2 may include a metal such as aluminum (Al), copper (Cu), molybdenum (Mo), titanium (Ti), and the like or a metal alloy thereof, and may be formed as a single layer or multiple layers.

The second data conductive layer SD2 is covered by a second organic layer 182 and a third organic layer 183. The second organic layer 182 and the third organic layer 183 may be organic insulators, and may include at least one material selected from a group consisting of polyimide, polyamide, acryl resin, benzocyclobutene, and phenol resin. Depending on embodiments, the third organic layer 183 can be omitted. However, an anode Anode may have a flatter characteristic due to the third organic layer 183.

The anode Anode may be disposed on the third organic layer 183, and has a structure of being connected with the second data conductive layer SD2 through an opening formed in the third organic layer 183. The anode Anode may be formed of a single layer or multiple layers including a transparent conductive oxide film and a metal material. The transparent conductive oxide film may include an indium tin oxide (ITO), a poly-ITO, an indium zinc oxide (IZO), an indium gallium zinc oxide (IGZO), and an indium tin zinc oxide (ITZO), and the metal material may include silver (Ag), molybdenum (Mo), copper (Cu), gold (Au), aluminum (Al), and the like.

A black pixel defining layer 380 that includes an opening overlapping at least a part of the anode Anode and covers another part of the anode Anode is disposed on the anode Anode. The black pixel defining layer 380 may further include a light blocking material in addition to an organic insulating material. The light blocking material may include carbon black, carbon nanotubes, a resin or paste containing a black dye, metal particles, such as nickel, aluminum, molybdenum, and its alloys, metal oxide particles (e.g., chromium nitride), and the like. The black pixel defining layer 380 may be formed of an organic material with a negative type of black color. Since the negative type is used as the organic material, it can have a characteristic that a part covered by the mask is removed.

The black pixel defining layer 380 has an opening OP, and an emission layer EML is disposed within the opening OP. The emission layer EML may be formed of an organic light emitting material, and adjacent emission layers EML may display different colors. Depending on embodiments, each emission layer EML may display the same color light due to a color filter 230 disposed thereabove.

A spacer 385 is formed on the black pixel defining layer 380. The spacer 385 may be formed in a structure having a step, and the spacer 385 includes a first portion 385-1 disposed in a high and narrow area and a second portion 385-2 disposed in a low and wide area. The spacer 385 may be formed of photosensitive polyimide (PSPI).

A functional layer FL is disposed on the emission layer EML, the spacer 385, and the exposed black pixel defining layer 380, and the functional layer FL may be formed on the entire surface of the light emitting display device DP. The functional layer FL may include an electron injection layer, an electron transport layer, a hole transport layer, and a hole injection layer, and the functional layer FL may be disposed above and below the emission layer EML. That is, the hole injection layer, the hole transport layer, the emission layer EML, the electron transport layer, the electron injection layer, and the cathode are sequentially disposed on the anode, and thus the hole injection layer and the hole transport layer of the functional layer FL are disposed below the emission layer EML, while the electron transport layer and the electron injection layer may be disposed above the emission layer EML. Depending on embodiments, the functional layer FL may also be disposed in the light transmissive area LTA.

A cathode Cathode may be formed as a light-transmitting electrode or a reflecting electrode. Depending on embodiments, the cathode may be a transparent or semi-transparent electrode, and may be formed of a metal thin film having a small work function, such as lithium (Li), calcium (Ca), lithium fluoride/calcium fluoride (LiF/Ca), lithium fluoride/aluminum (LiF/Al), aluminum (Al), silver (Ag), magnesium (Mg), and a compound thereof. In addition, a transparent conductive oxide (TCO) such as an indium tin oxide (ITO), an indium zinc oxide (IZO), a zinc oxide (ZnO), or an indium oxide ($In_2O_3$) can be further disposed on the metal thin film. The cathode may be integrally formed over the entire surface of the light emitting display device DP, except for the light transmissive area LTA.

An encapsulation layer 400 is disposed on the cathode Cathode. The encapsulation layer 400 includes at least one inorganic layer and at least one organic layer, and may have a triple layer structure including a first inorganic encapsulation layer 401, an organic encapsulation layer 402, and a second inorganic encapsulation layer 403. The encapsulation layer 400 may be to protect the emission layer EML formed of an organic material from moisture or oxygen that may be inflowed from the outside. Depending on embodiments, the encapsulation layer 400 may include a structure in while an inorganic layer and an organic layer are sequentially further stacked. Here, a thickness of the organic encapsulation layer 402 may be formed to be 3.5 μm or more and 4.5 μm or less, for example, 4 μm. The thickness of the organic encapsulation layer 402 is reduced from 8 μm or more to half the thickness to improve the effect of touch sensing on top, and a distance between the black pixel defining layer 380 and the light blocking layer 220 is reduced to allow a user to view an image at a wide angle.

Sensing insulating layers 501, 510, and 511 and two sensing electrodes 540 and 541 are disposed on the encapsulation layer 400 for touch sensing.

Here, the sensing electrodes 540 and 541 may include a metal such as aluminum (Al), copper (Cu), silver (Ag), gold (Au), molybdenum (Mo), titanium (Ti), tantalum (Ta), and the like, or a metal alloy thereof, and may be formed as a single layer or multiple layers. The plurality of sensing electrodes 540 and 541 may be insulated from each other, while disposing an intermediate sensing insulating layer 510 therebetween, and a lower sensing electrode 541 is disposed above a lower sensing insulating layer 501, an upper sensing electrode 540 is disposed above the intermediate sensing insulating layer 510, and the upper sensing electrode 540 is covered by the upper sensing insulating layer 511. The plurality of sensing electrodes 540 and 541 may be electrically connected through an opening disposed in the intermediate sensing insulating layer 510. In the embodiment of FIG. 25, a touch is sensed in a capacitive type using two sensing electrodes 540 and 541, but depending on embodiments, a touch may also be sensed in a cell cap method using only one sensing electrode.

A light blocking layer 220 and a color filter 230 are disposed above the upper sensing electrodes 540 and 541, that is, on the upper sensing insulating layer 511.

The light blocking layer 220 may be disposed so as to overlap the sensing electrodes 540 and 541 on a plane, and disposed to not overlap the anode Anode on a plane. This is to prevent the anode Anode and the emission layer EML, which can display an image, from being blocked by the light blocking layer 220 and the sensing electrodes 540 and 541.

The color filter 230 is disposed on the sensing insulating layers 501, 510, and 511 and the light blocking layer 220. The color filter 230 includes a red color filter that transmits red light, a green color filter that transmits green light, and a blue color filter that transmits blue light. Each color filter 230 may be disposed to overlap the anode Anode of the light emitting diode LED on a plane. Since light emitted from the emission layer EML may be emitted while being changed to a corresponding color while passing through a color filter, all of the light emitted from the emission layer EML may have the same color. However, in the emission layer EML, different colors of light are displayed, and the displayed color may be enhanced by passing through a color filter of the same color.

The light blocking layer 220 may be disposed between each color filter 230. Depending on embodiments, the color filter 230 may be replaced with a color conversion layer or may further include a color conversion layer. The color conversion layer may include quantum dots.

Depending on embodiments, the color filter 230 may have a structure in which one color among three colors is formed as a whole, and only an opening corresponding to the other two colors, and a color filter of the other two colors is formed in the corresponding opening. (Refer to FIG. 8) Depending on embodiments, an additional opening may be included as shown in FIG. 10.

A planarization layer 550 covering the color filter 230 is disposed on the color filter 230. The planarization layer 550 is for planarizing an upper surface of the light emitting display device, and may be a transparent organic insulator including at least one material selected from a group consisting of polyimide, polyamide, acryl resin, benzocyclobutene, and phenol resin.

Depending on embodiments, a low refractive layer and an additional planarization layer may be further disposed on the planarization layer 550 to improve front visibility and light emission efficiency of the display device. Light can be emitted while being refracted to the front by the low refractive layer and the additional planarization layer having a high refractive characteristic. In this case, the low refractive layer and the additional planarization layer may be disposed directly on the color filter 230, and thus the planarization layer 550 can be omitted depending on embodiments.

In the present embodiment, a polarizer is not included on the planarization layer 550. That is, the polarizer may serve to prevent display deterioration while the user recognizes external light incident thereon and reflected from the anode Anode. However, in the present embodiment, a structure in which the black pixel defining layer 380 covers the side of the anode Anode to reduce the degree of reflection from the anode Anode, and the light blocking layer 220 is also formed to reduce the incidence of light to prevent deterioration of display quality due to reflection is also included. Therefore, it is not necessary to separately form the polarizer on the front surface of the light emitting display device DP.

Hereinabove, a layered structure of the light transmissive area LTA has been described with reference to FIG. 44.

Hereinafter, roles of the additional signal wire BRS and the first additional signal wire BRS-1 stated with reference to FIG. 31 to FIG. 43 will be described with reference to FIG. 45.

Figure 45:
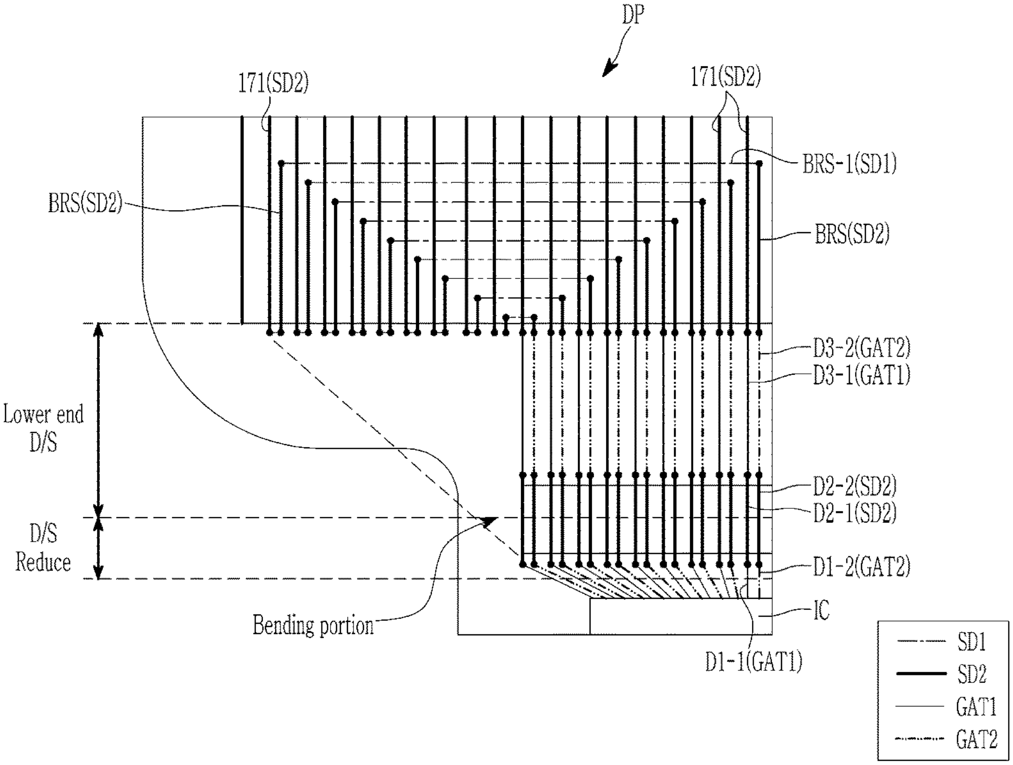
FIG. 45 schematically illustrates a wiring connection structure of the light emitting display device according to the embodiment.

FIG. 45 schematically illustrates a wiring connection structure of the light emitting display device according to the embodiment.

In FIG. 45, a data line connection structure for connection through the display area DA when a driving integrated circuit (IC) and a data line 171 are connected at a peripheral area of the light emitting display panel DP for reducing a width of the peripheral area is illustrated. In this case, the additional signal wire BRS disposed in the second data conductive layer and the first additional signal wire BRS-1 disposed in the first data conductive layer are used.

The additional signal wire BRS may be a wire that is parallel with the data line and transmits a data voltage applied to the data line. The first additional signal wire BRS-1 may be electrically connected with the additional signal wire BRS, and may extend in a direction that is perpendicular to the additional signal wire BRS.

Based on the embodiment of FIG. 45, a general wire connection structure from the driver IC to the data line 171 will be described.

An output terminal of the driver IC is connected with a wire D1-1 disposed in the first gate conductive layer GAT1, and then electrically connected with a wire D2-1 disposed in the second data conductive layer SD2 through a contact. The wire D2-1 passes through a bending portion, is connected with a wire D3-1 disposed in the first gate conductive layer GAT1 through a contact, and then is connected with the data line 171 disposed in the second data conductive layer SD2 through a contact.

However, the data line 171 disposed outside the display area is connected in a different way, and it will be described in detail as follows.

The output terminal of the driver IC is connected with a wire D1-2 disposed in the second gate conductive layer GAT2, and then is electrically connected with a wire D2-2 disposed in the second data conductive layer SD2 through a contact. The wire D2-2 passes through the bending portion, is connected with a wire D3-2 disposed in the second gate conductive layer GAT2 through a contact, and then is connected with the additional signal wire BRS disposed in the second data conductive layer SD2 through a contact. The additional signal wire BRS extends in a horizontal direction while being connected with the first additional signal wire BRS-1 disposed in the first data conductive layer, and extends in a direction that is perpendicular to the horizontal direction while being connected with the additional signal wire BRS through a contact. After that, the additional signal wire BRS is connected with the data line 171 disposed in the second data conductive layer SD2 through a contact from outside the display area.

For such a connection structure of the data line, the additional signal wire BRS disposed in the second data conductive layer and the first additional signal wire BRS-1 disposed in the first data conductive layer are used. Such a structure has a merit to reduce the width of the peripheral area.

Hereinafter, improvement of flatness of the anode according to the present embodiment will be described with reference to FIG. 46 and FIG. 47.

First, FIG. 46 will be described.

Figure 46A:
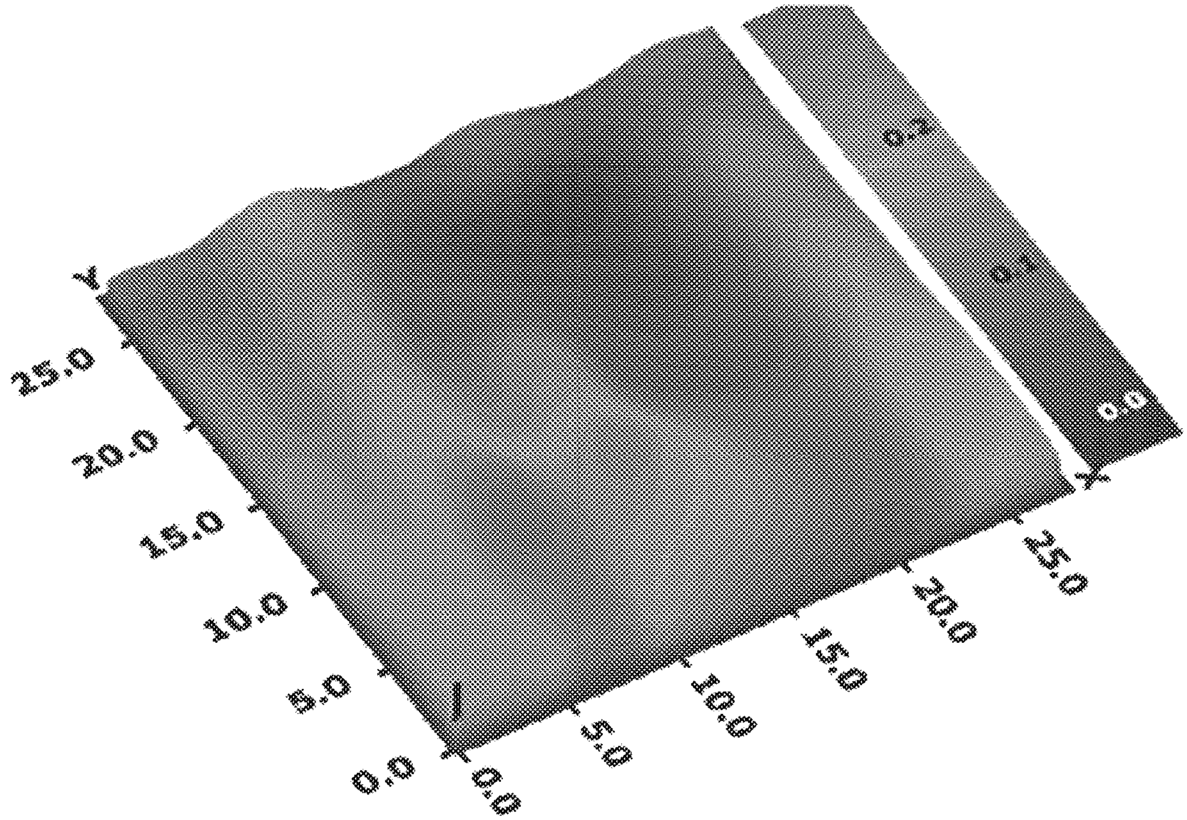
FIGS. 46 (A), 46 (B), and 46 (C) are results of simulating the anode flatness of the light emitting display device according to the comparative examples and the embodiment.
Figure 46B:
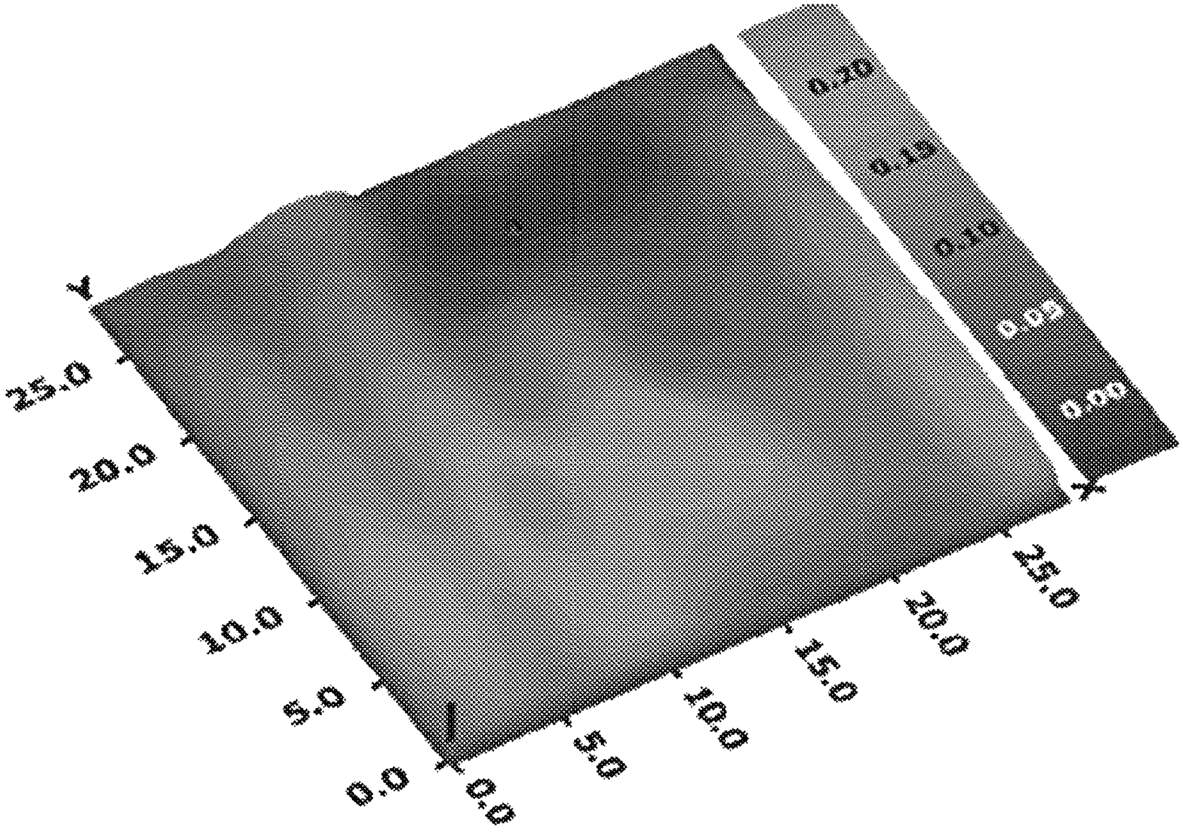
Figure 46C:
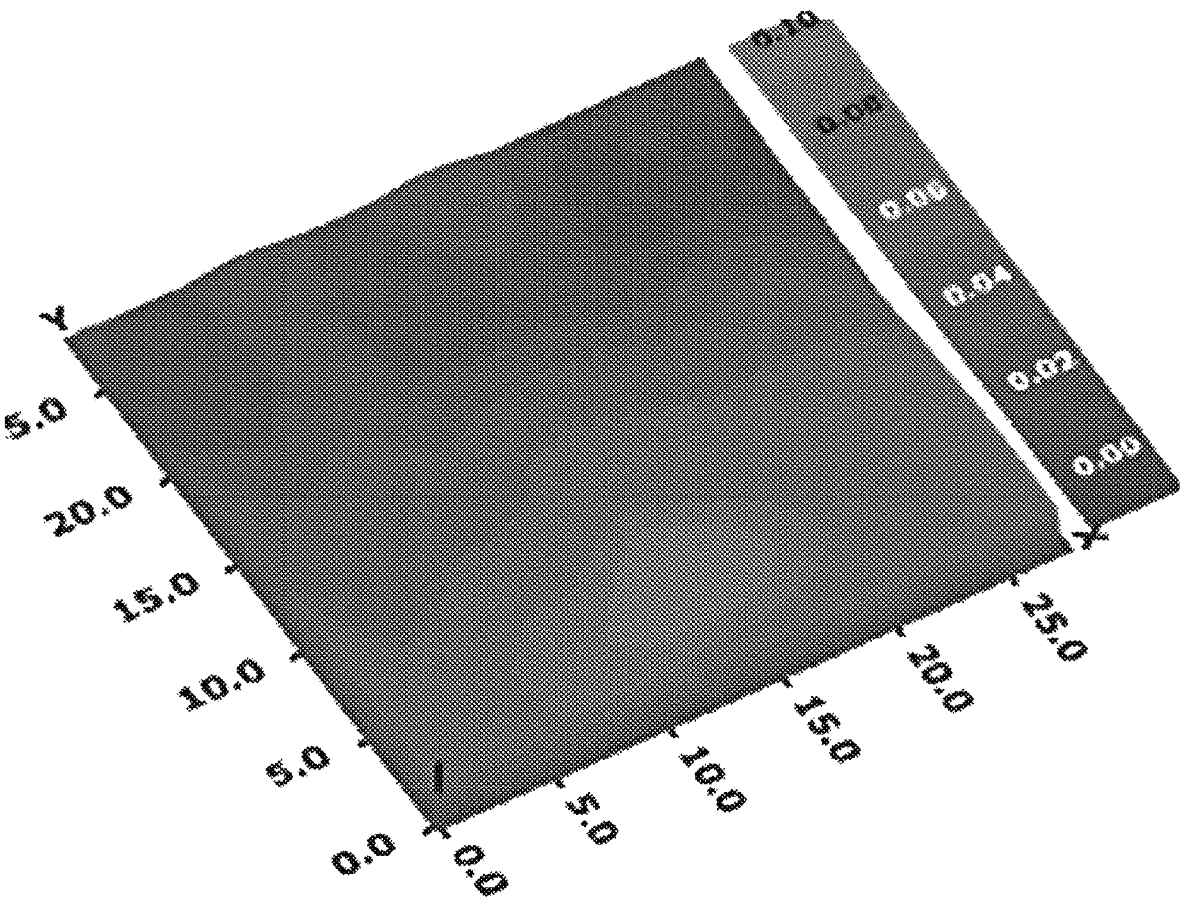

FIGS. 46 (A), 46 (B), and 46 (C) are results of simulating the anode flatness of the light emitting display device according to the comparative examples and the embodiment.

FIGS. 46 (A) and 46 (B) are respectively results of simulations of flatness of an anode according to Comparative Example 1 and Comparative Example 2, and FIG. 46 (C) is a simulation result of flatness of an anode according to the present embodiment.

In Comparative Example 1 corresponding to FIG. 46 (A), anode flatness in the case that no expansion portion is formed in a second data conductive layer disposed below an anode, and only one organic layer is formed between the anode and a second data conductive layer, is shown.

Unlike the Comparative Example 1, in Comparative Example 2 corresponding to FIG. 46 (B), anode flatness in the case that two organic layers are formed between an anode and a second data conductive layer, but no expansion portion is formed in the second second data conductive layer disposed below the anode, is shown.

As shown in FIGS. 46 (A) and 46 (B), Comparative Examples 1 and 2 show that the anode has poor flatness.

A simulation carried out in the embodiment of FIG. 46 (C) shows flatness in the case that two organic layers are formed between an anode and a second data conductive layer, and an expansion portion is entirely formed in the second data conductive layer disposed below the anode.

Referring to FIGS. 46 (A), 46 (B), and 46 (C), flatness shown in FIG. 46 (C), which illustrates the embodiment, is significantly improved.

Figure 47:
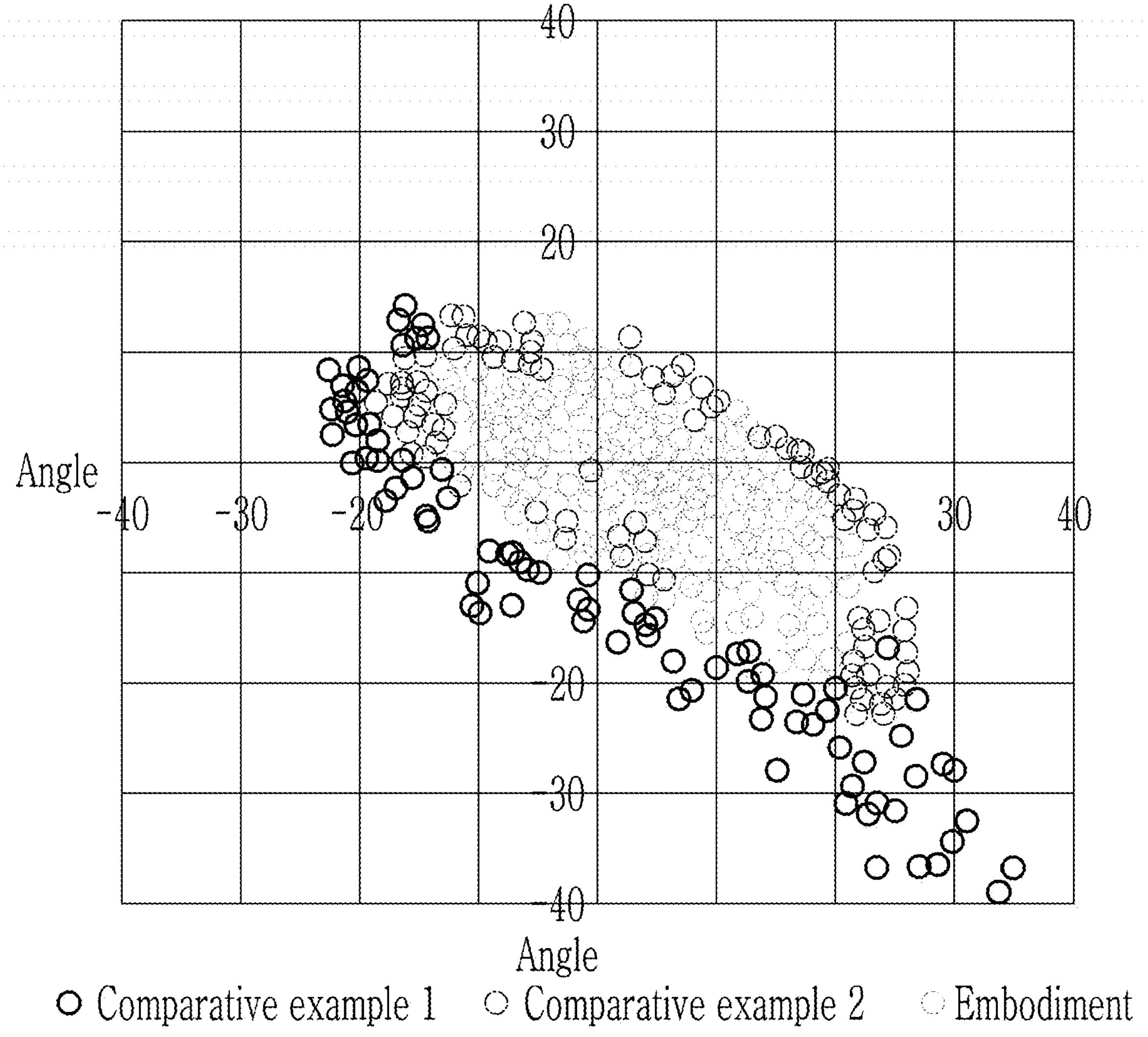
FIG. 47 is a graph illustrating a light emission angle in the light emitting display device according to the embodiment and the comparative examples.

Referring to FIG. 47, flatness is indirectly described through an angle of light reflected from the anode will now be described.

FIG. 47 is a graph illustrating a light emission angle in the light emitting display device according to the embodiment and the comparative examples.

In FIG. 47, the x axis and the y axis respectively denote angles, and are measured with reference to directions that are perpendicular to each other. In FIG. 47, as shown in FIG. 46, simulation results of the light emission angle of the light reflected from the anode according to Comparative Examples 1 and 2 and the present embodiment are illustrated.

That is, when the anode is flat, an angle of the incident light is reflected and thus no difference occurs in the angle of the emitted light, but when the anode surface is curved, the incident light is emitted at a different angle based on the angle of the incident light. In FIG. 47, how the angle of the emitted light differs based on the angle of the incident light was simulated.

In FIG. 47, it was determined through the center of the graph that a case that light was emitted at a larger angle than the angle of the embodiment was increased in Comparative Examples 1 and 2. According thereto, it can be determined that there is less flatness Comparative Example 1 and Comparative Example 2 compared to the embodiment.

As can be determined in FIG. 46 and FIG. 47, the flatness is improved when two organic layers are formed between the anode and the second data conductive layer and the expansion portion is formed in the second data conductive layer, which is below the anode. A more important feature of the two features different from the comparative example (two organic layers and expansion portion) is that the expansion portion is formed by overlapping the anode.

Depending on embodiments, there are an embodiment in which the entire opening OP of the black pixel defining layer 380 and the expansion portions FL-SD1 and FL-SD2 overlap on a plane (refer to FIG. 6), and an embodiment in which a part of the opening OP of the black pixel defining layer 380 and the expansion portions FL-SD1 and FL-SD2 overlap on a plane (refer to FIG. 27). When a part of the opening OP of the black pixel defining layer 380 and the expansion portions FL-SD1 and FL-SD2 overlap on a plane, at least 95% of the opening OP and the expansion portions FL-SD1 and FL-SD2 may overlap on a plane. When a part of the opening OP of the black pixel defining layer 380 and the expansion portions FL-SD1 and FL-SD2 overlap on a plane, the wiring portions SL-SD1 and SL-SD2 are used to flatten the anode overlapping the opening OP of the black pixel defining layer 380, and considering the width and spacing of the wiring, the size of the opening OP of the black pixel defining layer 380, and the like, four wires are formed under the anode or two wires are located in a lower portion, and the remaining two wires may partially overlap the opening OP of the black pixel defining layer 380.

Hereinafter, referring to FIG. 48 and FIG. 49, an embodiment in which a distance between the boundary between an opening (refer to OP4 of the preceding drawing) disposed on organic layers 181, 182, and 183 of a lower panel layer and an opening OP of a black pixel defining layer 380 is different depending on the emitted color will be described.

Figure 48A:
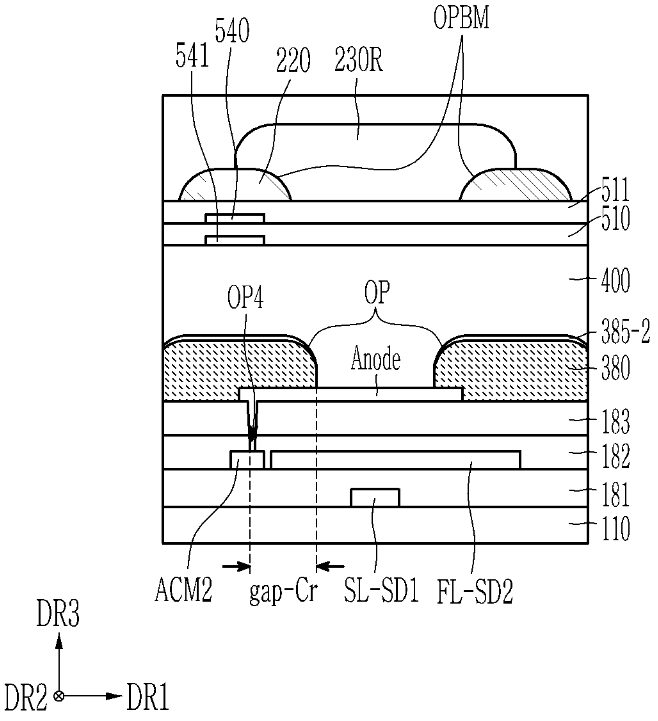
FIGS. 48 (A), 48 (B), and 48 (C) are respectively enlarged cross-sectional views of a portions (A), (B), and (C) of a light emitting display device according to another embodiment.
Figure 48B:
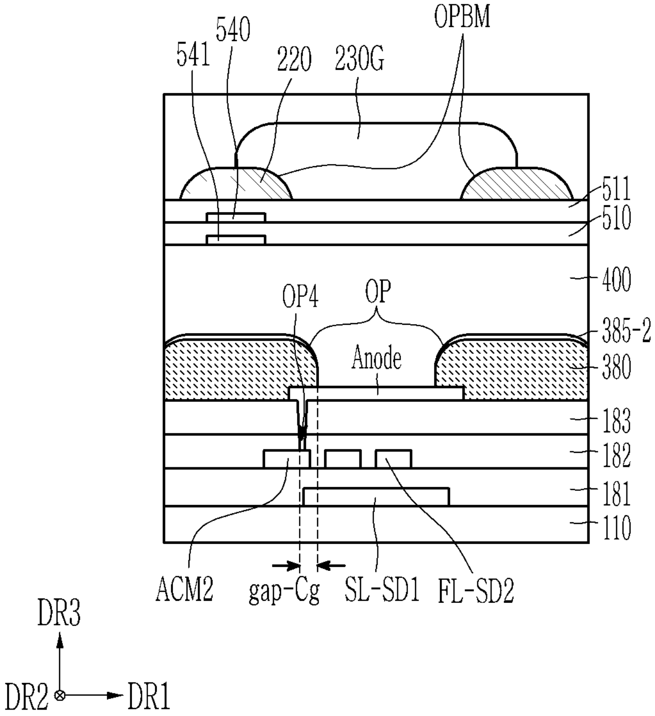
Figure 48C:
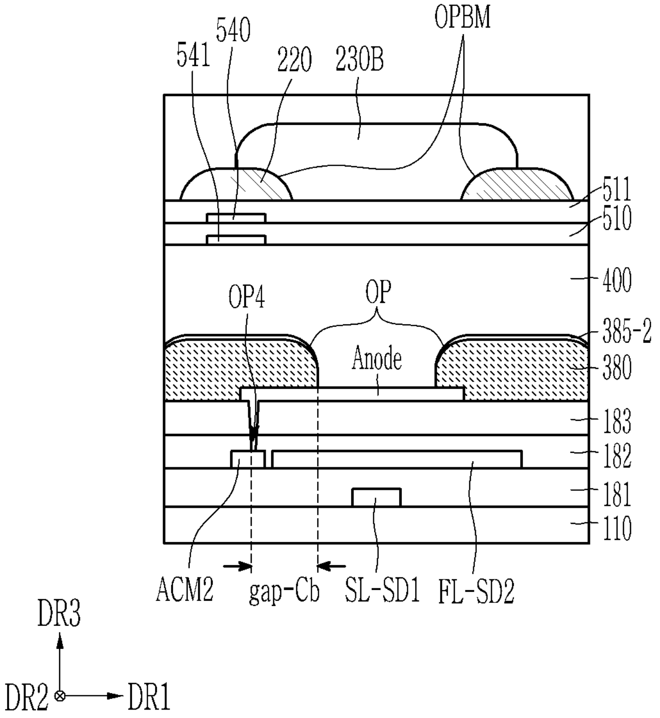
Figure 49:
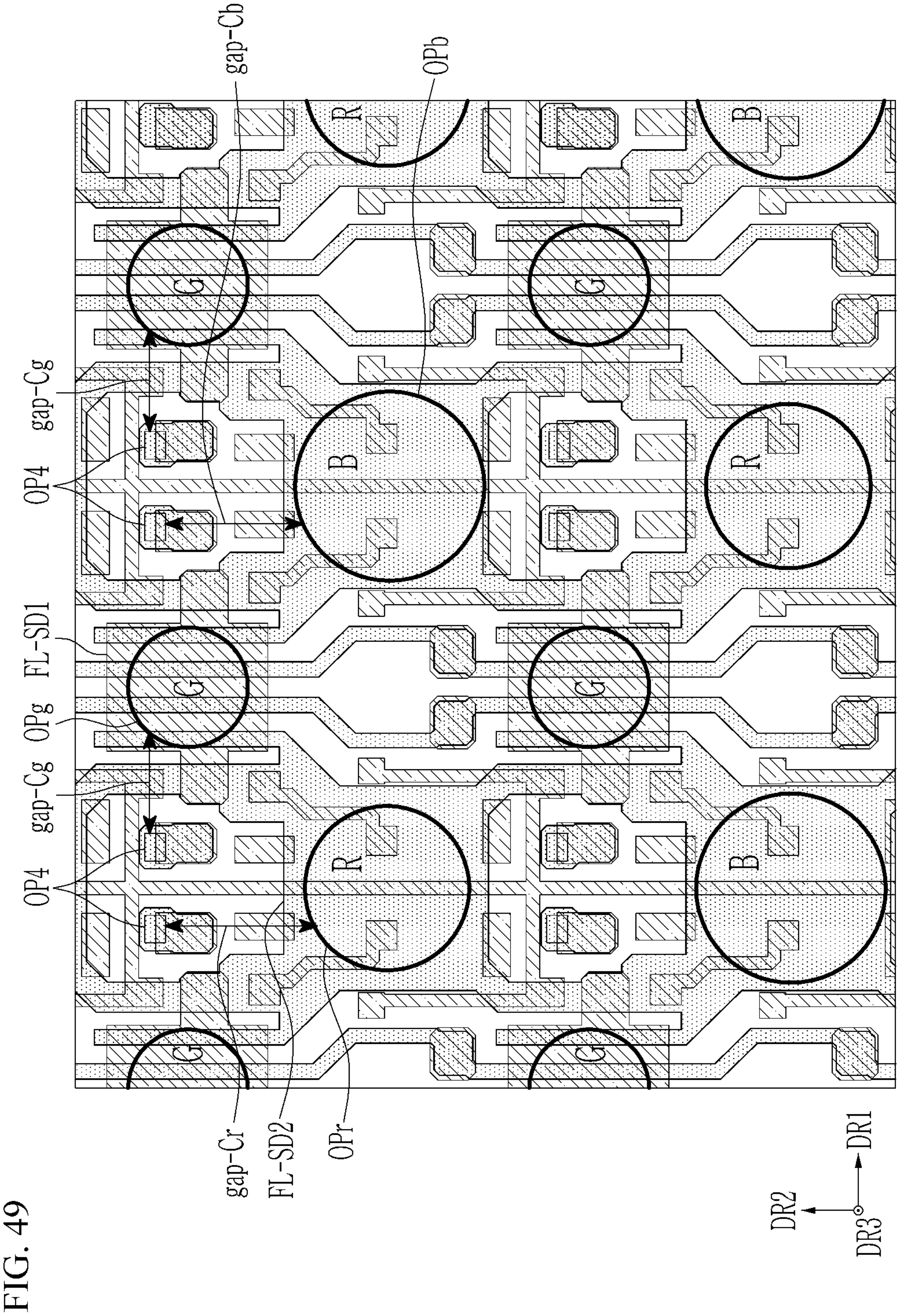
FIG. 49 is a top plan view of a part of a lower panel layer of the light emitting display device according to the other embodiment.

FIGS. 48 (A), 48 (B), and 48 (C) are respectively enlarged cross-sectional views of a part of a light emitting display device according to another embodiment, and FIG. 49 is a top plan view of a part of a lower panel layer of the light emitting display device according to the other embodiment.

Referring to FIGS. 48 (A), 48 (B), and 48 (C), an emission layer EML, a functional layer FL, and a cathode Cathode are omitted, but in FIGS. 48 (A), 48 (B), and 48 (C), a light blocking layer 220 and color filters 230R, 230G, and 230B are additionally illustrated to clearly show a relationship with the light blocking layer 220.

In FIGS. 48 (A), 48 (B), and 48 (C), unlike in FIG. 6, an anode connecting part ACM2 disposed in a second data conductive layer is additionally illustrated, and openings OP4 formed in a second organic layer 182 and a third organic layer 183 are also illustrated. Thus, a structure in which the anode connecting part ACM2 and the anode Anode are connected is schematically illustrated.

In FIGS. 48 (A), 48 (B), and 48 (C), a horizontal distance (hereinafter also called a gap or a gap with a contact portion) from the boundary of the black pixel defining layer 380 (or the boundary of the opening OP of the black pixel defining layer 380) to the adjacent boundary of the opening OP4 formed in the second organic layer 182 and the third organic layer 183 are shown as gap-Cr, gap-Cg, and gap-Cb, respectively. Here, the horizontal distance is a distance between adjacent edges of the opening OP of the black pixel defining layer 380 exposing an anode at the edge of the opening OP4 where the anode Anode is connected to the lower conductive layer (anode connecting part ACM2).

FIGS. 48 (A) and 48 (C), the gap-Cr and gap-Cb intervals between the boundaries of the openings OP4 at the boundary of the opening OP of the black pixel defining layer 380 in a red light emitting diode and a blue light emitting diode are illustrated to be relatively long. On the contrary, in FIG. 48 (B), the gap-Cg interval between the boundaries of the openings OP4 at the boundary of the opening OP of the black pixel defining layer 380 in a green light emitting diode is illustrated to be relatively short. The opening OP corresponding to the red light emitting diode LED may be formed to be smaller than the opening OP of another color, and may also be close to the openings OP4 formed in the second organic layer 182 and the third organic layer 183.

The gap-Cr, gap-Cg, and gap-Cb intervals shown in FIGS. 48 (A), 48 (B), and 48 (C) are shown on a top plan view, and an interval between openings OPr, OPg, and OPb of the black pixel defining layer 380 in a first direction DR1 or a second direction DR2 at an end of the opening OP are illustrated in FIG. 49.

A gap-Cr interval with a contact portion in the red light emitting diode (red anode) may be 20 μm or more and 30 μm or less, and may be 25 μm. A gap-Cb interval with a contact portion in the blue light emitting diode (blue anode) may be 20 μm or more and 30 μm or less, and may be 24 μm. The gap-Cb interval with the contact portion in the blue light emitting diode (blue anode) may be smaller than the gap-Cr interval to the contact portion in the red light emitting diode (red anode), and this may be because the size of the opening OPb for the blue anode among the opening OPs of the black pixel defining layer 380 is larger than the opening OPr for the red anode.

The gap-Cg interval with the contact portion in the green light emitting diode (green anode) may be 10 μm or more and 20 μm or less, and may be 14 μm. In green light emitting diode (green anode), the gap-Cg interval with the contact portion may be 5 μm or more and 15 μm or less, which is smaller than the gap-Cr and gap-Cb intervals with the contact portion of another color.

Thus, according to various embodiments of the inventive concepts, a ratio at which external light is reflected may be reduced by using a black pixel defining layer for a pixel defining layer that separates emission layers from each other instead of a polarizer. It is possible to increase the scratch strength and lower the incidence of dark spots due to a pressure on the display, such as by a finger, by forming a spacer with a step on top of the black pixel defining layer that separates the emission layers from each other.

Additionally, it is possible to improve the display quality by improving the flatness of the anode where the external light is reflected such that the reflected light does not spread asymmetrically, thereby reducing the color spread (color separation) caused by the reflected light.

A reflection adjusting layer may be disposed on the light blocking layer 220. The reflection adjusting layer may selectively absorb light of a wavelength of a partial band among light reflected inside the display device or light incident outside the display device. The reflection adjusting layer may fill the opening OP.

For example, the reflection adjusting layer absorbs a first wavelength region of 490 nm to 505 nm and a second wavelength region of 585 nm to 600 nm, and thus light transmittance in the first wavelength region and second wavelength region may be 40% or less. The reflection adjusting layer may absorb light of a wavelength outside the emission wavelength range of red, green, or blue emitted from the light emitting diode ED. As described, the reflection adjusting layer absorbs light of a wavelength that does not belong to a wavelength range of red, green, or blue emitted from the light emitting diode, thereby preventing or minimizing the reduction in luminance of the display device and simultaneously preventing or minimizing the deterioration of the luminous efficiency and improving visibility of the display device.

In the embodiment, the reflection adjusting layer may be provided as an organic material layer including a dye, a pigment, or combination thereof. The reflection adjusting layer may contain a tetraazaporphyrin (TAP)-based compound, a porphyrin-based compound, a metal porphyrin-based compound, an oxazine-based compound, and a squarylium-based compound, a triarylmethane compound, a polymethine compound, an anthraquinone compound, a phthalocyanine compound, an azo compound, a perylene compound, a xanthene-based compound, a diammonium-based compound, a dipyrromethene-based compound, a cyanine-based compound, and a combination thereof.

In the embodiment, the reflection adjusting layer may have transmittance of about 64% to 72%. The transmittance of the reflection adjusting layer may be adjusted according to the content of the pigment and/or dye included in the reflection adjusting layer.

According to embodiments, the reflection adjusting layer may not be disposed in the component area DA2. In addition, an embodiment including the reflection adjusting layer may further include a capping layer and a low reflection layer disposed between the cathode (Cathode) and the encapsulation layer 400.

The capping layer may serve to improve the luminous efficiency of the light emitting diode ED by the principle of constructive interference. The capping layer may include, for example, a material having a refractive index of 1.6 or more for light having a wavelength of 589 nm.

The capping layer may be an organic capping layer including an organic material, an inorganic capping layer including an inorganic material, or a composite capping layer including an organic material and an inorganic material. For example, the capping layer may contain a carbocyclic compound, a heterocyclic compound, an amine group-containing compound, a porphine derivative, a phthalocyanine derivative, a naphthalocyanine derivative, an alkali metal complex, alkaline earth metal complexes, or any combination thereof. The carbocyclic compounds, the heterocyclic compounds, and the amine group-containing compounds may be optionally substituted with substituents including O, N, S, Se, Si, F, Cl, Br, I, or any combination thereof.

A low reflection layer may be disposed on the capping layer. The low reflective layer may overlap a front surface of the substrate 110.

The low reflective layer may include an inorganic material having low reflectance, and in an embodiment, it may include a metal or metal oxide. When the low reflective layer contains a metal, it may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), and it may include zinc (Zn), germanium (Ge), silver (Ag), magnesium (Mg), gold (Au), copper (Cu), calcium (Ca), or a combination thereof. In addition, when the low reflective layer contains a metal oxide, it may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS, or a combination thereof.

In the embodiment, an absorption coefficient (k) of the inorganic material included in the low reflective layer may be 4.0 or less and 0.5 or more ($0.5 \leq k \leq 4.0$). In addition, the inorganic material included in the low reflective layer may have a refractive index (n) of 1 or more ($n \geq 1.0$).

The low reflective layer induces destructive interference between the light incident into the display device and the light reflected from the metal disposed under the low reflective layer, thereby reducing reflection of external light. Accordingly, the display quality and visibility of the display device can be improved by reducing the reflection of the external light of the display device through the low reflective layer.

According to embodiments, the capping layer may not be formed, and then the low reflective layer may be contact the cathode (Cathode) directly.

The encapsulation layer is disposed on the low reflective layer, other structures may be the same as FIGS. 25 and 44.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting display device comprising:
- a first pixel circuit portion that includes a first polycrystalline transistor including a polycrystalline semiconductor and a first oxide transistor including an oxide semiconductor;
- a first light emitting diode including a first anode connected with the first pixel circuit portion;
- a second pixel circuit portion that includes a second polycrystalline transistor including a polycrystalline semiconductor and a second oxide transistor including an oxide semiconductor;
- a second light emitting diode that includes a second anode connected with the second pixel circuit portion;
- an encapsulation layer that covers the first pixel circuit portion, the second pixel circuit portion, the first light emitting diode, and the second light emitting diode;
- a light blocking layer on the encapsulation layer, the light blocking layer including a first light blocking layer opening overlapping the first anode on a plane, and a second light blocking layer opening overlapping the second anode;
- a first color filter in the first light blocking layer opening; and
- a second color filter in the second light blocking layer opening, wherein,
  - the first pixel circuit portion further includes a first expansion portion, the first expansion portion overlaps the first anode, and is in a layer that is first down from the first anode,
  - the second pixel circuit portion further includes a second expansion portion, the second expansion portion overlaps the second anode, and is in a layer that is second down from the second anode,
  - the first expansion portion and the second expansion portion are configured to be applied with a driving voltage, and
  - the driving voltage is not applied to the first anode and the second anode.

2. The light emitting display device of claim 1, further comprising a pixel defining layer including a light blocking material, the pixel defining layer including a first opening and a second opening that respectively overlap at least a part of the first anode and at least a part of the second anode.

3. The light emitting display device of claim 2, wherein the first expansion portion overlaps an entirety of the first opening on a plane, and the second expansion portion overlaps an entirety of the second opening on a plane.

4. The light emitting display device of claim 2, further comprising an organic layer between the first anode, the second anode, and a first conductive layer.

5. The light emitting display device of claim 4, wherein the organic layer includes two organic layers.

6. The light emitting display device of claim 4, wherein
- the organic layer comprises a third opening for the first anode and a fourth opening for the second anode, and
- a horizontal distance between an edge of the third opening for the first anode and an edge of the first opening is larger than a horizontal distance between an edge of the fourth opening for the second anode and an edge of the second opening.

7. The light emitting display device of claim 2, further comprising:
- a first wiring portion in a second conductive layer, the first wiring portion corresponding to the first opening; and
- a second wiring portion in a first conductive layer, the second wiring portion corresponding to the second opening,
- wherein
  - the first wiring portion is formed directly beneath a middle portion of the first anode and not directly beneath a first edge and a second edge of the first anode, with respect to a cross-sectional view of the light emitting display device, and
  - the second wiring portion is formed directly beneath a first edge and a second edge of the second anode and not directly beneath a middle portion of the second anode, with respect to a cross-sectional view of the light emitting display device.

8. The light emitting display device of claim 7, wherein
- the first wiring portion overlapping the first opening is formed of a single wiring portion extended in one direction, and
- the second wiring portion overlapping the second opening is formed of four wiring portions extended in one direction.

9. The light emitting display device of claim 8, wherein
- an initialization voltage is applied to the single wiring portion forming the first wiring portion, and
- two of the four wiring portions forming the second wiring portion are data lines, and a remaining two of the four wiring portions are applied with the driving voltage.

10. The light emitting display device of claim 7, wherein
- the first wiring portion overlapping the first opening comprises a wiring portion extended in a first direction, and
- the second wiring portion overlapping the second opening comprises two wiring portions extended in a direction that is perpendicular to the first direction.

11. The light emitting display device of claim 10, wherein the wiring portion forming the first wiring portion is configured to receive an initialization voltage, and the two wiring portions forming the second wiring portion are data lines.

12. The light emitting display device of claim 11, wherein the second wiring portion further comprises two additional wiring portions that overlap at least a part of the second opening in addition to the two wiring portions.

13. The light emitting display device of claim 12, wherein the two additional wiring portions are additional signal wires that transmit a data voltage applied to a data line and are parallel with the data line.

14. The light emitting display device of claim 13, further comprising a first additional signal wire in the first conductive layer, electrically connected with an additional signal wire, and extended in a direction that is perpendicular to the additional signal wire.

15. The light emitting display device of claim 2, wherein the first light blocking layer opening and the second light blocking layer opening respectively overlap the first opening and the second opening formed in the pixel defining layer on a plane, the first light blocking layer opening is larger than the first opening, and the second light blocking layer opening is larger than the second opening.

16. The light emitting display device of claim 2, wherein an second element area is formed in the first pixel circuit portion or the second pixel circuit portion, a conductive layer or a semiconductor layer not being formed in the second element area.

17. The light emitting display device of claim 16, wherein additional openings are respectively formed at positions in the pixel defining layer, the light blocking layer, and the first color filter and the second color filter corresponding to the second element area.

18. A light emitting display device comprising:

a first semiconductor layer on a substrate;

a first gate conductive layer on the first semiconductor layer;

a second gate conductive layer on the first gate conductive layer;

a second semiconductor layer on the second gate conductive layer;

a third gate conductive layer on the second semiconductor layer;

a first data conductive layer on the third gate conductive layer;

a first organic layer covering the first data conductive layer;

a second data conductive layer on the first organic layer;

a second organic layer sequentially on the second data conductive layer;

an anode on the second organic layer;

a pixel defining layer including an opening overlapping the anode, the pixel defining layer including a light blocking material;

a cathode on the pixel defining layer;

an encapsulation layer on the cathode;

a light blocking layer on the encapsulation layer; and a color filter that is on the light blocking layer, wherein the first data conductive layer includes an expansion portion, the expansion portion overlaps the opening of the pixel defining layer on a plane, and a width of the expansion portion is wider than a width of the opening of the pixel defining layer, the expansion portion is configured to be applied with a driving voltage, and the driving voltage is not applied to the anode.

19. The light emitting display device of claim 18, wherein a wiring portion is in the second data conductive layer where the expansion portion is not formed, the wiring portion overlaps the opening of the pixel defining layer, and the wiring portion includes a data line transmitting a data voltage.

20. The light emitting display device of claim 18, further comprising a third organic layer between the second organic layer and the anode.

* * * * *